United States Patent
Yang et al.

(10) Patent No.: US 10,491,370 B2
(45) Date of Patent: Nov. 26, 2019

(54) DATA PROCESSING METHOD, DATA TRANSMIT END, AND DATA RECEIVE END

(71) Applicant: Huawei Technologies Co., Ltd., Shenzhen (CN)

(72) Inventors: Wenbin Yang, Beijing (CN); Tongtong Wang, Beijing (CN); Xinyuan Wang, Beijing (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 28 days.

(21) Appl. No.: 15/789,284

(22) Filed: Oct. 20, 2017

(65) Prior Publication Data

US 2018/0041332 A1 Feb. 8, 2018

Related U.S. Application Data

(63) Continuation of application No. PCT/CN2015/083693, filed on Jul. 9, 2015.

(30) Foreign Application Priority Data

Apr. 23, 2015 (WO) ................ PCT/CN2015/077319

(51) Int. Cl.
  *H04L 7/04* (2006.01)
  *H04J 3/06* (2006.01)
  (Continued)

(52) U.S. Cl.
  CPC ............ *H04L 7/048* (2013.01); *H04J 3/0658* (2013.01); *H04L 1/0041* (2013.01);
  (Continued)

(58) Field of Classification Search
  CPC ................ H04L 7/048; H04J 3/0658
  See application file for complete search history.

(56) References Cited

U.S. PATENT DOCUMENTS 9,088,403 B1 * 7/2015 Caggioni .............. H04J 3/0658
2014/0376566 A1 * 12/2014 Mehta ................... H04L 49/357
  370/419

(Continued)

FOREIGN PATENT DOCUMENTS

CN   101640582 A   2/2010
CN   103534971 A   1/2014

(Continued)

OTHER PUBLICATIONS

Gustlin, M., et al., "IEEE 802.3bs 400 Gb/s Ethernet Task Force," XP068080604, 400GbE PCS Options, Jul. 24, 2014, 18 pages.

(Continued)

*Primary Examiner* — Zhensheng Zhang
(74) *Attorney, Agent, or Firm* — Conley Rose, P.C.

(57) ABSTRACT

A data processing method, a data transmit end, and a data receive end are presented. The data processing method includes inserting multiple alignment markers (AMs) into a first data stream, where the first data stream is a data stream that is transcoded and scrambled after being encoded at a physical layer; adaptively allocating the first data stream that includes the AMs to multiple physical coding sublayer (PCS) lanes to obtain second data streams; performing forward error correction (FEC) encoding on the second data streams on the multiple PCS lanes to obtain third data streams; and delivering the third data streams to multiple physical medium attachment sublayer (PMA) lanes according to an input bit width of a Serdes to obtain multiple fourth data streams, each fourth data stream includes at least one complete and continuous AM, and the at least one AM is an AM in the multiple AMs.

15 Claims, 15 Drawing Sheets

(51) Int. Cl.
*H04L 1/00* (2006.01)
*H04L 12/24* (2006.01)
*H03M 13/15* (2006.01)

(52) U.S. Cl.
CPC ........ *H04L 1/0042* (2013.01); *H04L 41/0896* (2013.01); *H03M 13/152* (2013.01); *H03M 13/1515* (2013.01); *H04L 2001/0096* (2013.01)

(56) References Cited

U.S. PATENT DOCUMENTS

| | | |
|---|---|---|
| 2016/0070615 A1 | 3/2016 | Zhong |
| 2016/0182084 A1 | 6/2016 | Yang et al. |
| 2016/0191277 A1 | 6/2016 | Li et al. |
| 2016/0197743 A1 | 7/2016 | Su et al. |

FOREIGN PATENT DOCUMENTS

| | | |
|---|---|---|
| CN | 103875205 A | 6/2014 |
| CN | 104426629 A | 3/2015 |
| CN | 104426631 A | 3/2015 |
| CN | 104539389 A | 4/2015 |

OTHER PUBLICATIONS

Toyoda, H., et al., "100GbE PHY and MAC Layer Implementations," XP011305453, IEEE Communications Magazine, IEEE Service Center, vol. 48, No. 3, Mar. 1, 2010, 8 pages.
Foreign Communication From a Counterpart Application, European Application No. 15889622.5, Extended European Search Report dated Mar. 7, 2018, 11 pages.
Machine Translation and Abstract of Chinese Publication No. CN104539389, dated Apr. 22, 2015, 11 pages.
"Amendment 2: Physical Layer Specifications and Management Parameters for 100 Gb/s Operation Over Backplanes and Copper Cables," IEEE Computer Society, IEEE Std 802.3bj, Jun. 12, 2014, 368 pages.
"Amendment 3: Physical Layer Specifications and Management Parameters for 40 Gb/s and 100 Gb/s Operation over Fiber Optic Cables," IEEE Computer Society, IEEE Std 802.3bm, Feb. 16, 2015, 172 pages.
"Part 3: Carrier Sense Multiple Access with Collision Detection (CSMA/CD) Access Method and Physical Layer Specification," IEEE P802.3ba D3.2, Mar. 24, 2010, 461 pages.
Foreign Communication From a Counterpart Application, PCT Application No. PCT/CN2015/083693, English Translation of International Search Report dated Feb. 3, 2016, 2 pages.
Foreign Communication From a Counterpart Application, PCT Application No. PCT/CN2015/077319, International Search Report dated Jan. 25, 2016, 7 pages.
Foreign Communication From a Counterpart Application, PCT Application No. PCT/CN2015/077319, Written Opinion dated Jan. 25, 2016, 3 pages.
Machine Translation and Abstract of Chinese Publication No. CN101640582, dated Feb. 3, 2010, 18 pages.
Foreign Communication From a Counterpart Application, Chinese Application No. 201580000680.X, Chinese Office Action dated Feb. 28, 2019, 10 pages.
Wang, X., et al., "Investigation on Technical Feasibility of FEC Architecture with 1 X400Gbps or 4X100Gbps," XP068093070, IEEE Draft; WANGes X_3BS_ 01_ 0515, IEEE-SA, Piscataway, NJ USA, vol. 802.3, May 18, 2015, pp. 1-16.
Foreign Communication From a Counterpart Application, European Application No. 15889622.5, European Office Action dated Jul. 19, 2019, 7 pages.

* cited by examiner

DATA PROCESSING METHOD, DATA TRANSMIT END, AND DATA RECEIVE END

CROSS-REFERENCE TO RELATED APPLICATIONS

This application is a continuation of International Application No. PCT/CN2015/083693, filed on Jul. 9, 2015, which claims priority to International Application No. PCT/CN2015/077319, filed on Apr. 23, 2015, both of which are hereby incorporated by reference in their entireties.

TECHNICAL FIELD

Embodiments of the present disclosure relate to the communications field, and in particular, to a data processing method, a data transmit end, and a data receive end.

BACKGROUND

With development of the Internet, traffic of a telecommunications backbone network increases explosively at a speed of 50% to 80% each year, and there is an increasingly high requirement of bandwidth on an Ethernet interface in future.

Architectures proposed in current Ethernet standards are mainly architectures described in standards such as The Institute of Electrical and Electronics Engineers (IEEE) 802.3ba/bj/bm. Physical layers of all these architectures use an interface of 100 gigabit (G) bandwidth to perform forward error correction (FEC) encoding and decoding. In the prior art, an Ethernet interface architecture uses 100 G processing bandwidth, and main modules at a physical coding sublayer (PCS) have an encoding and decoding module, a scrambling module, a delivery module, an alignment marker insertion module, and the like. This solution is designed for 100 G bandwidth.

In an Ethernet architecture in the prior art, input data at the PCS layer that uses a 100 G transmission rate is parallel data in a 100 G Ethernet media independent interface (Century Gigabit Media Independent Interface (CGMII)) format at a reconciliation sublayer (RS). Data in multiple lanes is output, and then the data is delivered to a physical medium attachment sublayer (PMA). Main functions of a receive side and a transmit side at the PCS layer may be based on extension of a 100 G standard. A 100 G transmit end first performs 64b/66b encoding on data, and then scrambles and delivers the data. To resolve problems of alignment in lanes and disorder between lanes, the 100 G transmit end further needs to insert bit interleaved parity (BIP) codes as alignment markers (AM), and delivers the data to PMA lanes after inserting the AMs. A 100 G receive end first receives the data, performs block alignment and locking and AM locking and alignment, then performs remapping on lanes using the AMs, removes the AMs after completing remapping of the lanes, and finally completes 64b/66b decoding. That is, in the foregoing prior art, the 100 G receive end completes remapping of the lanes according to the AMs after performing AM alignment and locking; therefore, the AMs can be identified by the receive end only when it is ensured that AM patterns are complete.

An existing Ethernet architecture may transmit a complete AM when being applicable to 100 G processing bandwidth; however, a structure of the foregoing architecture is simple, only limited scenarios are supported, and the architecture cannot be flexibly adapted and cannot be extended to high bandwidth. If an Ethernet interface uses a higher rate (for example, 400 G), problems such as that transmission bandwidth of a serializer/deserializer (Serdes) is not matched and that AMs cannot be aligned are likely to occur. Particularly, after FEC is introduced to the Ethernet, original AMs may be disorganized; as a result, the receive end cannot correctly identify the AMs, and therefore cannot complete remapping of the lanes, and a problem that the receive end cannot correctly perform decoding occurs.

SUMMARY

Embodiments of the present disclosure provide a data processing method, a data transmit end, and a data receive end, which can transmit a data stream in a case in which it is ensured that an AM is not damaged, where the data receive end can correctly decode the AM.

According to a first aspect, an embodiment of the present disclosure provides a data processing method, including inserting multiple alignment markers AMs into a first data stream, where the first data stream is a data stream that is transcoded and scrambled after being encoded at a physical layer, and a transmission rate of the first data stream is greater than or equal to 100gigabits per second (GPS); adaptively allocating the first data stream that includes the AMs to multiple physical coding sublayer PCS lanes to obtain second data streams; performing FEC encoding on the second data streams on the multiple PCS lanes to obtain third data streams; and delivering the third data streams to multiple physical medium attachment sublayer PMA lanes according to an input bit width of a Serdes to obtain multiple fourth data streams, where the multiple fourth data streams are in a one-to-one correspondence with the multiple PMA lanes, each fourth data stream includes at least one complete and continuous AM, and the at least one AM is an AM in the multiple AMs.

With reference to the first aspect, in a first possible implementation manner of the first aspect, the adaptively allocating the first data stream that includes the AMs to multiple physical coding sublayer PCS lanes includes the first data stream includes an all data parallel processing block and an AM parallel processing block; adaptively allocating the all data parallel processing block to the multiple PCS lanes according to an all data parallel processing granularity, and adaptively allocating the AM parallel processing block to the multiple PCS lanes according to an AM parallel processing granularity.

With reference to the first aspect, in a second possible implementation manner of the first aspect, after the adaptively allocating the first data stream that includes the AMs to multiple PCS lanes, and before the performing FEC encoding on the second data streams on the multiple PCS lanes, the method further includes, if a processing bit width of an AM insertion circuit is different from a processing bit width of an FEC encoding circuit, performing bit width conversion on the first data stream that includes the AMs, where a bit width of the converted first data stream is equal to the processing bit width of the FEC encoding circuit.

With reference to the first aspect, in a third possible implementation manner of the first aspect, after the adaptively allocating the first data stream that includes the AMs to multiple PCS lanes, and before the performing FEC encoding on the second data streams on the multiple PCS lanes, the method further includes allocating two different clock cycles to two codeword segments that are processed in parallel in a same clock cycle to perform processing, and inserting idle data in the two different clock cycles, where the two different clock cycles each include one codeword segment of the two codeword segments that are originally concatenated in one clock cycle.

With reference to the third possible implementation manner of the first aspect, in a fourth possible implementation manner of the first aspect, the performing FEC encoding on the second data streams on the multiple PCS lanes to obtain third data streams includes performing FEC encoding on data, except the inserted idle data, in the second data streams; and after performing FEC encoding on the second data streams, deleting the inserted idle data from the encoded second data streams to obtain the third data streams.

With reference to the third or the fourth possible implementation manner of the first aspect, in a fifth possible implementation manner of the first aspect, the allocating two different clock cycles to two codeword segments that are processed in parallel in a same clock cycle to perform processing, and inserting idle data in the two different clock cycles includes inserting, between the two codeword segments that are processed in parallel in a same clock cycle, idle data that occupies one clock cycle, allocating the clock cycle in which the two codeword segments are originally concatenated to one codeword segment of the two codeword segments that are originally concatenated in one clock cycle and one part of the idle data in one clock cycle, and allocating a clock cycle next to the clock cycle in which the two codeword segments are originally concatenated to the other codeword segment of the two codeword segments that are originally concatenated in one clock cycle and the other part of the idle data in one clock cycle.

With reference to the third or the fourth possible implementation manner of the first aspect, in a sixth possible implementation manner of the first aspect, the allocating two different clock cycles to two codeword segments that are processed in parallel in a same clock cycle to perform processing, and inserting idle data in the two different clock cycles includes inserting idle data after the former codeword segment in the two codeword segments that are processed in parallel in a same clock cycle, so that the clock cycle in which the two codeword segments are originally concatenated is filled, performing backward data shifting on the latter codeword segment in the two codeword segments that are processed in parallel in a same clock cycle, and inserting idle data after the last codeword segment in a codeword in which the latter codeword segment is located, so that a clock cycle to which the last codeword segment in the codeword in which the latter codeword segment is located belongs is filled.

With reference to the first aspect, in a seventh possible implementation manner of the first aspect, the performing FEC encoding on the second data streams on the multiple PCS lanes to obtain third data streams includes acquiring two codeword segments that are in the second data streams and are processed in parallel in a same clock cycle, where the two codeword segments include a first codeword segment and a second codeword segment, and a data volume of the first codeword segment is greater than or equal to that of the second codeword segment; and performing FEC encoding on the first codeword segment using a first FEC encoding circuit, and performing FEC encoding on the second codeword segment using a second FEC encoding circuit, where the third data streams are generated after the first codeword segment and the second codeword segment are respectively processed by the first FEC encoding circuit and the second FEC encoding circuit, and the second FEC encoding circuit and the first FEC encoding circuit use completely different configurable logic encoding circuits, or the second FEC encoding circuit is an FEC encoding circuit obtained after a resource configuration operation is performed on a configurable logic encoding circuit, except a configurable logic encoding circuit that processes the first codeword segment, in the first FEC encoding circuit.

With reference to the first aspect, in an eighth possible implementation manner of the first aspect, after the performing FEC encoding on the second data streams on the multiple PCS lanes to obtain third data streams, and before the delivering the third data streams to multiple PMA lanes according to an input bit width of a Serdes, the method further includes, if a processing bit width of an AM insertion circuit is different from a processing bit width of an FEC encoding circuit, performing bit width conversion on the third data streams, where bit widths of the converted third data streams are equal to the processing bit width of the AM insertion circuit.

With reference to the first aspect, in a ninth possible implementation manner of the first aspect, the delivering the third data streams to multiple PMA lanes according to an input bit width of a Serdes includes determining a slice size according to a quantity of the PCS lanes and a data size of a single character borne on each PCS lane, and slicing the third data streams according to the slice size to obtain sliced third data streams, where each slice includes multiple third data blocks; and determining, according to bit widths of the third data streams, the input bit width of the Serdes, and the slice size, a quantity of slices that need to be delivered, extracting, from the sliced third data streams, third data blocks in slices corresponding to the quantity of slices, and then delivering the third data blocks to a same PMA lane in the multiple PMA lanes after overlaying third data blocks that are at a same location in the slices corresponding to the quantity of slices.

With reference to the ninth possible implementation manner of the first aspect, in a tenth possible implementation manner of the first aspect, the determining a slice size according to a quantity of the PCS lanes and a data size of a single character borne on each PCS lane, and slicing the third data streams according to the slice size includes the quantity of the PCS lanes is i, the data size of a single character borne on each PCS lane is m, a size of a third data block in each slice obtained after the third data streams are sliced is i×m, and the bit widths of the third data streams are i×m×Integer 1, where the Integer 1 is a preset positive integer; the determining, according to bit widths of the third data streams, the input bit width of the Serdes, and the slice size, a quantity of slices includes the input bit width of the Serdes is i×m×Integer 2, the slice size is i×m×Integer S, and therefore both the Integer 1 and the Integer 2 are integral multiples of the Integer S, and the quantity of slices is Integer 2/Integer S, where the Integer 2 is a preset positive integer; and the extracting, from the sliced third data streams, third data blocks in slices corresponding to the quantity of slices, and then delivering the third data blocks to a same PMA lane in the multiple PMA lanes after overlaying third data blocks that are at a same location in the slices corresponding to the quantity of slices includes extracting the $n^{th}$ third data block from each slice, and delivering Integer 2/Integer S extracted $n^{th}$ third data blocks in total to the $n^{th}$ PMA lane after overlaying the Integer 2/Integer S extracted $n^{th}$ third data blocks, where a value of n is any value from 0 to i−1.

According to a second aspect, an embodiment of the present disclosure further provides a data processing method, including receiving fourth data streams from multiple PMA lanes, and performing PMA demodulation on the fourth data streams to obtain third data streams that are obtained after PMA demodulation is performed; identifying complete and continuous alignment markers AMs from the third data streams, and performing alignment and remapping on the third data streams on physical coding sublayer PCS lanes according to the AMs to obtain aligned and remapped third data streams; performing FEC decoding on the aligned and remapped third data streams to obtain second data streams, where the second data streams include the AMs; combining the second data streams that are on the PCS lanes and are obtained by means of FEC decoding to obtain a first data stream that includes the AMs; and removing the AMs from the first data stream that includes the AMs to obtain an original first data stream used for encoding on a data encoder side.

With reference to the second aspect, in a first possible implementation manner of the second aspect, the performing PMA demodulation on the fourth data streams to obtain third data streams that are obtained after PMA demodulation is performed includes determining, according to bit widths of the fourth data streams, an input bit width of a Serdes, and a slice size, a quantity of slices that need to be combined, acquiring, from each PMA lane, third data blocks that are at a same location in slices corresponding to the quantity of slices, respectively delivering the third data blocks to the PCS lanes, and combining third data blocks on each PCS lane to obtain combined third data streams.

With reference to the first possible implementation manner of the second aspect, in a second possible implementation manner of the second aspect, the determining, according to bit widths of the fourth data streams, an input bit width of the Serdes, and a slice size, a quantity of slices that need to be combined, acquiring, from each PMA lane, third data blocks that are at a same location in slices corresponding to the quantity of slices, respectively delivering the third data blocks to the PCS lanes, and combining third data blocks on each PCS lane to obtain combined third data streams includes a quantity of the PCS lanes is i, a data size of a single character borne on each PCS lane is m, and bit widths of the third data streams are i×m×Integer 1, where the Integer 1 is a preset positive integer; the input bit width of the Serdes is i×m×Integer 2, the slice size is i×m×Integer S, and therefore both the Integer 1 and the Integer 2 are integral multiples of the Integer S, and the quantity of slices is Integer 1/Integer S, where the Integer 2 is a preset positive integer; and a size of a third data block that is in each slice and is acquired from each PMA lane is i×m; acquiring Integer 1/Integer S $n^{th}$ third data blocks in total from the $n^{th}$ PMA lane, respectively delivering the Integer 1/Integer S $n^{th}$ third data blocks to the PCS lanes, and combining the third data blocks on each PCS lane to obtain the third data streams whose bit widths are i×m×Integer 1.

With reference to the second aspect, in a third possible implementation manner of the second aspect, before the performing FEC decoding on the aligned and remapped third data streams, the method further includes, if a processing bit width of an AM removing circuit is different from a processing bit width of an FEC decoding circuit, performing bit width conversion on the aligned and remapped third data streams, where bit widths of the third data streams whose bit widths are converted are equal to the processing bit width of the FEC decoding circuit.

With reference to the second aspect, in a fourth possible implementation manner of the second aspect, before the performing FEC decoding on the aligned and remapped third data streams, the method further includes allocating two different clock cycles to two codeword segments that are processed in parallel in a same clock cycle to perform processing, and inserting idle data in the two different clock cycles, where the two different clock cycles each include one codeword segment of the two codeword segments that are originally concatenated in one clock cycle.

With reference to the fourth possible implementation manner of the second aspect, in a fifth possible implementation manner of the second aspect, the performing FEC decoding on the aligned and remapped third data streams to obtain second data streams includes performing FEC decoding on data, except the inserted idle data, in the aligned and remapped third data streams; and after performing FEC decoding on the third data streams, deleting the inserted idle data from the decoded third data streams to obtain the second data streams.

With reference to the fourth or the fifth possible implementation manner of the second aspect, in a sixth possible implementation manner of the second aspect, the allocating two different clock cycles to two codeword segments that are processed in parallel in a same clock cycle to perform processing, and inserting idle data in the two different clock cycles includes inserting, between the two codeword segments that are processed in parallel in a same clock cycle, idle data that occupies one clock cycle, allocating the clock cycle in which the two codeword segments are originally concatenated to one codeword segment of the two codeword segments that are originally concatenated in one clock cycle and one part of the idle data in one clock cycle, and allocating a clock cycle next to the clock cycle in which the two codeword segments are originally concatenated to the other codeword segment of the two codeword segments that are originally concatenated in one clock cycle and the other part of the idle data in one clock cycle.

With reference to the fourth or the fifth possible implementation manner of the second aspect, in a seventh possible implementation manner of the second aspect, the allocating two different clock cycles to two codeword segments that are processed in parallel in a same clock cycle to perform processing, and inserting idle data in the two different clock cycles includes inserting idle data after the former codeword segment in the two codeword segments that are processed in parallel in a same clock cycle, so that the clock cycle in which the two codeword segments are originally concatenated is filled, performing backward data shifting on the latter codeword segment in the two codeword segments that are processed in parallel in a same clock cycle, and inserting idle data after the last codeword segment in a codeword in which the latter codeword segment is located, so that a clock cycle to which the last codeword segment in the codeword in which the latter codeword segment is located belongs is filled.

With reference to the second aspect, in an eighth possible implementation manner of the second aspect, the performing FEC decoding on the aligned and remapped third data streams to obtain second data streams includes acquiring two codeword segments that are in the third data streams and are processed in parallel in a same clock cycle, where the two codeword segments include a first codeword segment and a second codeword segment, and a data volume of the first codeword segment is greater than or equal to that of the second codeword segment; and performing FEC decoding on the first codeword segment using a first FEC decoding circuit, and performing FEC decoding on the second codeword segment using a second FEC decoding circuit, where the second data streams are generated after the first codeword segment and the second codeword segment are respectively processed by the first FEC decoding circuit and the second FEC decoding circuit, and the second FEC decoding circuit and the first FEC decoding circuit use completely different configurable logic decoding circuits, or the second FEC decoding circuit is an FEC decoding circuit obtained after a resource configuration operation is performed on a configurable logic decoding circuit, except a configurable logic decoding circuit that processes the first codeword segment, in the first FEC decoding circuit.

With reference to the second aspect, in a ninth possible implementation manner of the second aspect, before the removing the AMs from the first data stream that includes the AMs, the method further includes, if a processing bit width of an AM removing circuit is different from a processing bit width of an FEC decoding circuit, performing bit width conversion on the first data stream that includes the AMs, where a bit width of the converted first data stream is equal to the bit width of the AM removing circuit.

With reference to the second aspect, in a tenth possible implementation manner of the second aspect, the combining the second data streams that are on the PCS lanes and are obtained by means of FEC decoding to obtain a first data stream that comprises the AMs includes extracting an all data parallel processing block according to an all data parallel processing granularity, extracting an AM parallel processing block according to an AM parallel processing granularity, and combining the all data parallel processing block and the AM parallel processing block to obtain the first data stream that includes the AMs.

According to a third aspect, an embodiment of the present disclosure further provides a data transmit end, including an AM insertion module configured to insert multiple AMs into a first data stream, where the first data stream is a data stream that is transcoded and scrambled after being encoded at a physical layer, and a transmission rate of the first data stream is greater than or equal to 100 GPS; an adaptation module configured to adaptively allocate the first data stream that includes the AMs to multiple PCS lanes to obtain second data streams; an FEC encoding module configured to perform FEC encoding on the second data streams on the multiple PCS lanes to obtain third data streams; and a data stream delivery module configured to deliver the third data streams to multiple PMA lanes according to an input bit width of a serializer/deserializer Serdes to obtain multiple fourth data streams, where the multiple fourth data streams are in a one-to-one correspondence with the multiple PMA lanes, each fourth data stream includes at least one complete and continuous AM, and the at least one AM is an AM in the multiple AMs.

With reference to the third aspect, in a first possible implementation manner of the third aspect, the adaptation module is configured to the first data stream includes an all data parallel processing block and an AM parallel processing block; adaptively allocate the all data parallel processing block to the multiple PCS lanes according to an all data parallel processing granularity, and adaptively allocate the AM parallel processing block to the multiple PCS lanes according to an AM parallel processing granularity.

With reference to the third aspect, in a second possible implementation manner of the third aspect, the data transmit end further includes a bit width transformation module configured to, after the adaptation module adaptively allocates the first data stream that includes the AMs to the multiple PCS lanes, and before the FEC encoding module performs FEC encoding on the second data streams on the multiple PCS lanes, if a processing bit width of an AM insertion circuit is different from a processing bit width of an FEC encoding circuit, perform bit width conversion on the first data stream that includes the AMs, where a bit width of the converted first data stream is equal to the processing bit width of the FEC encoding circuit.

With reference to the third aspect, in a third possible implementation manner of the third aspect, the data transmit end further includes a frequency increasing module configured to, after the adaptation module adaptively allocates the first data stream that includes the AMs to the multiple PCS lanes, and before the FEC encoding module performs FEC encoding on the second data streams on the multiple PCS lanes, allocate two different clock cycles to two codeword segments that are processed in parallel in a same clock cycle to perform processing, and insert idle data in the two different clock cycles, where the two different clock cycles each include one codeword segment of the two codeword segments that are originally concatenated in one clock cycle.

With reference to the third possible implementation manner of the third aspect, in a fourth possible implementation manner of the third aspect, the FEC encoding module is configured to perform FEC encoding on data, except the inserted idle data, in the second data streams; and after performing FEC encoding on the second data streams, delete the inserted idle data from the encoded second data streams to obtain the third data streams.

With reference to the third or the fourth possible implementation manner of the third aspect, in a fifth possible implementation manner of the third aspect, the frequency increasing module is configured to insert, between the two codeword segments that are processed in parallel in a same clock cycle, idle data that occupies one clock cycle, allocate the clock cycle in which the two codeword segments are originally concatenated to one codeword segment of the two codeword segments that are originally concatenated in one clock cycle and one part of the idle data in one clock cycle, and allocate a clock cycle next to the clock cycle in which the two codeword segments are originally concatenated to the other codeword segment of the two codeword segments that are originally concatenated in one clock cycle and the other part of the idle data in one clock cycle.

With reference to the third or the fourth possible implementation manner of the third aspect, in a sixth possible implementation manner of the third aspect, the frequency increasing module is configured to insert idle data after the former codeword segment in the two codeword segments that are processed in parallel in a same clock cycle, so that the clock cycle in which the two codeword segments are originally concatenated is filled, perform backward data shifting on the latter codeword segment in the two codeword segments that are processed in parallel in a same clock cycle, and insert idle data after the last codeword segment in a codeword in which the latter codeword segment is located, so that a clock cycle to which the last codeword segment in the codeword in which the latter codeword segment is located belongs is filled.

With reference to the third aspect, in a seventh possible implementation manner of the third aspect, the FEC encoding module is configured to acquire two codeword segments that are in the second data streams and are processed in parallel in a same clock cycle, where the two codeword segments include a first codeword segment and a second codeword segment, and a data volume of the first codeword segment is greater than or equal to that of the second codeword segment; and perform FEC encoding on the first codeword segment using a first FEC encoding circuit, and perform FEC encoding on the second codeword segment using a second FEC encoding circuit, where the third data streams are generated after the first codeword segment and the second codeword segment are respectively processed by the first FEC encoding circuit and the second FEC encoding circuit, and the second FEC encoding circuit and the first FEC encoding circuit use completely different configurable logic encoding circuits, or the second FEC encoding circuit is an FEC encoding circuit obtained after a resource configuration operation is performed on a configurable logic encoding circuit, except a configurable logic encoding circuit that processes the first codeword segment, in the first FEC encoding circuit.

With reference to the third aspect, in an eighth possible implementation manner of the third aspect, the data transmit end further includes a bit width conversion module configured to, after the FEC encoding module performs FEC encoding on the second data streams on the multiple PCS lanes to obtain the third data streams, and before the PMA delivery module delivers the third data streams to the multiple PMA lanes according to the input bit width of the Serdes, if a processing bit width of an AM insertion circuit is different from a processing bit width of an FEC encoding circuit, perform bit width conversion on the third data streams, where bit widths of the converted third data streams are equal to the processing bit width of the AM insertion circuit.

With reference to the third aspect, in a ninth possible implementation manner of the third aspect, the data stream delivery module is configured to determine a slice size according to a quantity of the PCS lanes and a data size of a single character borne on each PCS lane, and slice the third data streams according to the slice size to obtain sliced third data streams, where each slice includes multiple third data blocks; and determine, according to bit widths of the third data streams, the input bit width of the Serdes, and the slice size, a quantity of slices that need to be delivered, extract, from the sliced third data streams, third data blocks in slices corresponding to the quantity of slices, and then deliver the third data blocks to a same PMA lane in the multiple PMA lanes after overlaying third data blocks that are at a same location in the slices corresponding to the quantity of slices.

With reference to the ninth possible implementation manner of the third aspect, in a tenth possible implementation manner of the third aspect, the data stream delivery module is configured to the quantity of the PCS lanes is i, the data size of a single character borne on each PCS lane is m, a size of a third data block in each slice obtained after the third data streams are sliced is i×m, and the bit widths of the third data streams are i×m×Integer 1, where the Integer 1 is a preset positive integer; the input bit width of the Serdes is i×m× Integer 2, the slice size is i×m×Integer S, and therefore both the Integer 1 and the Integer 2 are integral multiples of the Integer S, and the quantity of slices is Integer 2/Integer S, where the Integer 2 is a preset positive integer; and extract the nth third data block from each slice, and deliver Integer 2/Integer S extracted nth third data blocks in total to the nth PMA lane after overlaying the Integer 2/Integer S extracted nth third data blocks, where a value of n is any value from 0 to i−1.

According to a fourth aspect, an embodiment of the present disclosure further provides a data receive end, including a PMA demodulation module configured to receive fourth data streams from multiple PMA lanes, and perform PMA demodulation on the fourth data streams to obtain third data streams that are obtained after PMA demodulation is performed; an AM alignment and remapping module configured to identify complete and continuous alignment markers AMs from the third data streams, and perform alignment and remapping on the third data streams on PCS lanes according to the AMs to obtain aligned and remapped third data streams; an FEC decoding module configured to perform FEC decoding on the aligned and remapped third data streams to obtain second data streams, where the second data streams include the AMs; an adaptation module configured to combine the second data streams that are on the PCS lanes and are obtained by means of FEC decoding to obtain a first data stream that includes the AMs; and an AM removing module configured to remove the AMs from the first data stream that includes the AMs to obtain an original first data stream used for encoding on a data encoder side.

With reference to the fourth aspect, in a first possible implementation manner of the fourth aspect, the PMA demodulation module is configured to determine, according to bit widths of the fourth data streams, an input bit width of a Serdes, and a slice size, a quantity of slices that need to be combined, acquire, from each PMA lane, third data blocks that are at a same location in slices corresponding to the quantity of slices, respectively deliver the third data blocks to the PCS lanes, and combine third data blocks on each PCS lane to obtain combined third data streams.

With reference to the fourth aspect, in a second possible implementation manner of the fourth aspect, the PMA demodulation module is configured to a quantity of the PCS lanes is i, a data size of a single character borne on each PCS lane is m, and bit widths of the third data streams are i×m×Integer 1, where the Integer 1 is a preset positive integer; the input bit width of the Serdes is i×m×Integer 2, the slice size is i×m×Integer S, and therefore both the Integer 1 and the Integer 2 are integral multiples of the Integer S, and the quantity of slices is Integer 1/Integer S, where the Integer 2 is a preset positive integer; a size of a third data block that is in each slice and is acquired from each PMA lane is i×m; and acquire Integer 1/Integer S $n^{th}$ third data blocks in total from the $n^{th}$ PMA lane, respectively deliver the Integer 1/Integer S $n^{th}$ third data blocks to the PCS lanes, and combine the third data blocks on each PCS lane to obtain the third data streams whose bit widths are i×m× Integer 1.

With reference to the fourth aspect, in a third possible implementation manner of the fourth aspect, the data receive end further includes a bit width conversion module configured to, before the FEC decoding module performs FEC decoding on the aligned and remapped third data streams, if a processing bit width of an AM removing circuit is different from a processing bit width of an FEC decoding circuit, perform bit width conversion on the aligned and remapped third data streams, where bit widths of the third data streams whose bit widths are converted are equal to the processing bit width of the FEC decoding circuit.

With reference to the fourth aspect, in a fourth possible implementation manner of the fourth aspect, the data receive end further includes a frequency increasing module configured to, before the FEC decoding module is configured to perform FEC decoding on the aligned and remapped third data streams, allocate two different clock cycles to two codeword segments that are processed in parallel in a same clock cycle to perform processing, and insert idle data in the two different clock cycles, where the two different clock cycles each include one codeword segment of the two codeword segments that are originally concatenated in one clock cycle.

With reference to the fourth possible implementation manner of the fourth aspect, in a fifth possible implementation manner of the fourth aspect, the FEC decoding module is configured to perform FEC decoding on data, except the inserted idle data, in the aligned and remapped third data streams; and after performing FEC decoding on the third data streams, delete the inserted idle data from the decoded third data streams to obtain the second data streams.

With reference to the fourth or the fifth possible implementation manner of the fourth aspect, in a sixth possible implementation manner of the fourth aspect, the frequency increasing module is configured to insert, between the two codeword segments that are processed in parallel in a same clock cycle, idle data that occupies one clock cycle, allocate the clock cycle in which the two codeword segments are originally concatenated to one codeword segment of the two codeword segments that are originally concatenated in one clock cycle and one part of the idle data in one clock cycle, and allocate a clock cycle next to the clock cycle in which the two codeword segments are originally concatenated to the other codeword segment of the two codeword segments that are originally concatenated in one clock cycle and the other part of the idle data in one clock cycle.

With reference to the fourth or the fifth possible implementation manner of the fourth aspect, in a seventh possible implementation manner of the fourth aspect, the frequency increasing module is configured to insert idle data after the former codeword segment in the two codeword segments that are processed in parallel in a same clock cycle, so that the clock cycle in which the two codeword segments are originally concatenated is filled, perform backward data shifting on the latter codeword segment in the two codeword segments that are processed in parallel in a same clock cycle, and insert idle data after the last codeword segment in a codeword in which the latter codeword segment is located, so that a clock cycle to which the last codeword segment in the codeword in which the latter codeword segment is located belongs is filled.

With reference to the fourth aspect, in an eighth possible implementation manner of the fourth aspect, the FEC decoding module is configured to acquire two codeword segments that are in the third data streams and are processed in parallel in a same clock cycle, where the two codeword segments include a first codeword segment and a second codeword segment, and a data volume of the first codeword segment is greater than or equal to that of the second codeword segment; and perform FEC decoding on the first codeword segment using a first FEC decoding circuit, and perform FEC decoding on the second codeword segment using a second FEC decoding circuit, where the second data streams are generated after the first codeword segment and the second codeword segment are respectively processed by the first FEC decoding circuit and the second FEC decoding circuit, and the second FEC decoding circuit and the first FEC decoding circuit use completely different configurable logic decoding circuits, or the second FEC decoding circuit is an FEC decoding circuit obtained after a resource configuration operation is performed on a configurable logic decoding circuit, except a configurable logic decoding circuit that processes the first codeword segment, in the first FEC decoding circuit.

With reference to the fourth aspect, in a ninth possible implementation manner of the fourth aspect, the data receive end further includes a bit width conversion module configured to, before the AM removing module removes the AMs from the first data stream that includes the AMs, if a processing bit width of an AM removing circuit is different from a processing bit width of an FEC decoding circuit, perform bit width conversion on the first data stream that includes the AMs, where a bit width of the converted first data stream is equal to the bit width of the AM removing circuit.

With reference to the fourth aspect, in a tenth possible implementation manner of the fourth aspect, the adaptation module is configured to extract an all data parallel processing block according to an all data parallel processing granularity, extract an AM parallel processing block according to an AM parallel processing granularity, and combine the all data parallel processing block and the AM parallel processing block to obtain the first data stream that includes the AMs.

It can be seen from the foregoing technical solutions that, the embodiments of the present disclosure have the following advantages.

In the embodiments of the present disclosure, alignment markers AMs are inserted into a first data stream, where the first data stream is a data stream that is transcoded and scrambled after being encoded at a physical layer, and a transmission rate of the first data stream is greater than or equal to 100 G; the first data stream that includes the AMs is adaptively allocated to multiple PCS lanes to obtain second data streams; FEC encoding is performed on the second data streams on the multiple PCS lanes to obtain third data streams; and the third data streams are delivered to multiple PMA lanes according to an input bit width of a Serdes, where a third data stream delivered to each PMA lane includes a complete and continuous AM. Because in the present disclosure, the third data streams are delivered to the multiple PMA lanes, and the AM on each PMA lane can remain continuous and complete, a data receive end can acquire complete and continuous AMs from the multiple PMA lanes, which may be applicable to a scenario in which a transmission rate of a data stream is quite high, and avoid a damage to the AMs.

DESCRIPTION OF EMBODIMENTS

Figure 1:
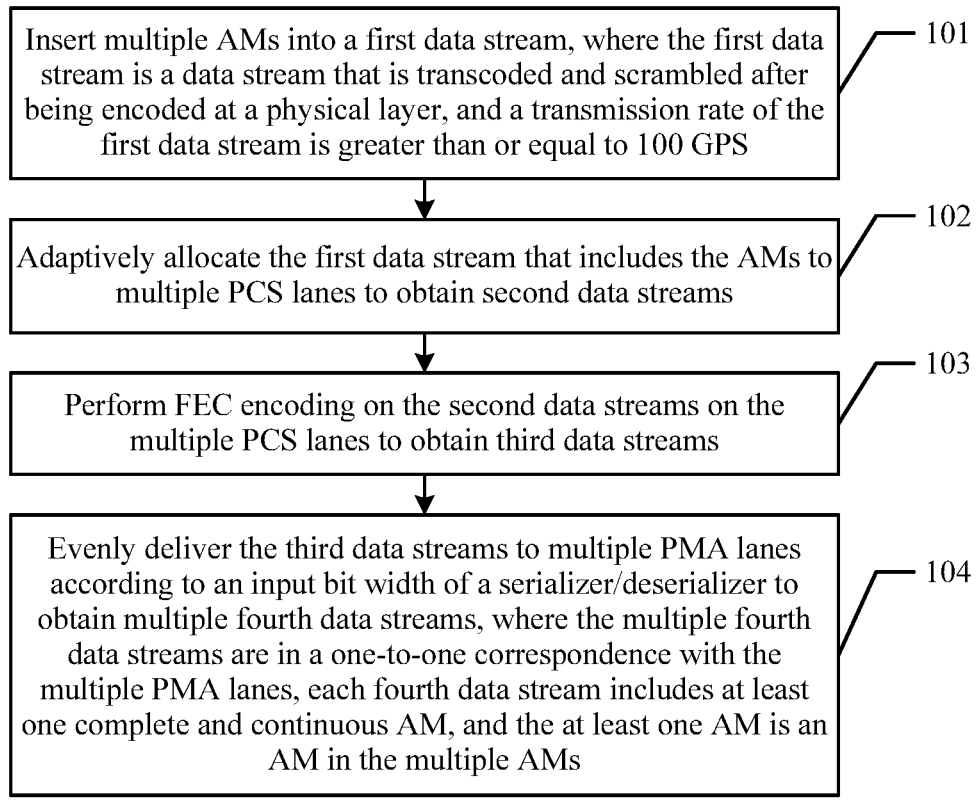
FIG. 1 is a schematic block diagram of a procedure of a data transmission method according to an embodiment of the present disclosure.

Embodiments of the present disclosure provide a data processing method, a data transmit end, and a data receive end, which can transmit a data stream in a case in which it is ensured that an AM is not damaged, where the data receive end can correctly decode the AM.

To make the disclosure objectives, features, and advantages of the present disclosure clearer and more comprehensible, the following clearly describes the technical solutions in the embodiments of the present disclosure with reference to the accompanying drawings in the embodiments of the present disclosure. The embodiments described in the following are merely a part rather than all of the embodiments of the present disclosure. All other embodiments obtained by persons skilled in the art based on the embodiments of the present disclosure shall fall within the protection scope of the present disclosure.

In the specification, claims, and accompanying drawings of the present disclosure, the terms "first", "second", and so on are intended to distinguish between similar objects but do not necessarily indicate a specific order or sequence. It should be understood that the terms used in such a way are interchangeable in proper circumstances, which is merely a discrimination manner that is used when objects having a same attribute are described in the embodiments of the present disclosure. In addition, the terms "include", "contain" and any other variants mean to cover the non-exclusive inclusion, so that a process, method, system, product, or device that includes a series of units is not necessarily limited to those units, but may include other units not expressly listed or inherent to such a process, method, system, product, or device.

Detailed descriptions are separately provided below.

An FEC encoding and decoding mechanism is introduced to the Ethernet. If a standard of bandwidth higher than 400 G is introduced to the Ethernet, an entire Ethernet architecture varies a lot from a previous generation. However, an existing Ethernet architecture can only be applicable to 100 G or lower bandwidth, and if a 400 G standard is used, an optimal effect cannot be achieved in the following aspects: flexible adaption of modules at various layers, reduction of resource occupation, shortening of an entire system delay, and improvement of entire system performance. In the present disclosure, the Ethernet architecture needs to be reset, and particularly, a PCS layer needs to be redesigned to make adaptation of an entire network more flexible. For example, limited by techniques and parameters such as a size of a codeword in an FEC algorithm, many problems arise when a current architecture is smoothly transited to 400 G For example, 1×400 G data obtained by FEC encoding needs to be delivered on 16 lanes. RS FEC may be selected for an FEC algorithm, and RS FEC (544, 514, 15, 10) may be selected as a specific code type. If the 1×400 G data obtained by FEC encoding uses the FEC algorithm, the following problem exists. For 400 G bandwidth, a bit width of data processed in each period needs to be an integral multiple of 16 lanes, and data delivered on each lane needs to be an integral multiple of an FEC symbol. For example, a size of a symbol in a currently possible RS FEC algorithm is 10 bits; therefore, a bit width of each period needs to be an integral multiple of 16×10. A possible bit width and a clock frequency have the following possibilities: the bit width is 160 bits, and the corresponding clock frequency is 2.5 gigahertz (GHz); the bit width is 320 bits, and the clock frequency is 1.25 GHz; the bit width is 480 bits, and the clock frequency is 833.33 megahertz (MHz); the bit width is 640 bits, and the clock frequency is 625 MHz; the bit width is 800 bits, and the clock frequency is 500 MHz; the bit width is 960 bits, and the clock frequency is 416.66 MHz; and so on.

As shown in FIG. 1, a data processing method provided in an embodiment of the present disclosure includes the following steps.

101. Insert multiple AM into a first data stream, where the first data stream is a data stream that is transcoded and scrambled after being encoded at a physical layer, and a transmission rate of the first data stream is greater than or equal to 100 GPS.

In this embodiment of the present disclosure, a data stream acquired by a data transmit end is in a data format of a MAC layer in the Ethernet, and the data format is converted to a corresponding CDGMII format after the data stream is transmitted to a 400 G Ethernet interface. A specific data format of the CDGMII interface is described as follows. A data bit width of the CDGMII interface is (20×(64+8)), and the format of the CDGMII interface is twenty pieces of 64 Bit data information plus a 8-bit control information indicator, where the 8-bit control information indicator indicates whether 8-byte data of 64 bits represents data or control information. Data in the foregoing CDGMII data format is transmitted to a 64b/66b encoding module to perform encoding. A specific 64b/66b encoding format is a universal encoding method in a current standard.

For example, the data stream is transcoded after 64b/66b encoding is performed on the data stream, and there are the following transcoding manners for a specific format of a transcoding module (Transcode): 256b/257b, 512b/513b, 256b/258b, 512b/514b, and the like. The present disclosure imposes no limitation on a specific transcoding manner.

The transcoded data stream further needs to be scrambled, and global or partial scrambling may be performed according to a specific granularity. Unified global scrambling, or scrambling corresponding to an FEC granularity, or scrambling using a lane at a PCS as a granularity may be used. In addition, an initial value of a scrambler may be dynamically configured to ensure performance of an entire system. The data stream that is transcoded and scrambled is defined as the first data stream described in the present disclosure, the first data stream includes multiple all data parallel processing blocks, and a transmission rate of the first data stream in the present disclosure is 100 GPS or higher.

After acquiring the first data stream, the data transmit end inserts the AMs into the first data stream. It should be noted that for a manner of inserting the AMs into the first data stream, reference may be made to the prior art. AM insertion is performed after the scrambling, and an AM insertion format is a transcoded format. Because a receive end needs to perform alignment and reordering operations according to the AMs, a scrambling operation is not performed on the AMs.

It should be noted that physical layer encoding may be 4b/5b encoding, 8b/10b encoding, 64b/66b encoding, or physical layer encoding of another type, which is executed by a physical layer circuit (PHY).

102. Adaptively allocate the first data stream that includes the AMs to multiple PCS lanes to obtain second data streams.

In this embodiment of the present disclosure, after the first data stream is output from an AM insertion circuit, the data transmit end adaptively allocates the first data stream that includes the AMs to the multiple PCS lanes to obtain the second data streams, where the second data streams include the foregoing AMs.

In this embodiment of the present disclosure, after the AMs are inserted into the first data stream, the first data stream needs to be adaptively allocated to the PCS lanes, that is, the first data stream into which the AMs are inserted needs to be delivered to the multiple PCS lanes. In an example in which a processing bit width of the AM insertion circuit is represented by P and there are i PCS lanes, where the PCS lanes are respectively a PCS lane 0, a PCS lane 1, . . . , and a PCS lane i−1. The first data stream whose data size is P needs to be delivered to the PCS lane 0, the PCS lane 1, . . . , and the PCS lane i−1. That P is 640 bits and i is 16 is used as an example; then, 640 bits of the first data stream need to be delivered to 16 PCS lanes, and 40 bits of the first data stream are delivered to each PCS lane.

In some embodiments of the present disclosure, step 102 of adaptively allocating the first data stream that includes the AMs to multiple physical coding sublayer PCS lanes includes the first data stream includes an all data parallel processing block and an AM parallel processing block; adaptively allocating the all data parallel processing block to the multiple PCS lanes according to an all data parallel processing granularity, and adaptively allocating the AM parallel processing block to the multiple PCS lanes according to an AM parallel processing granularity.

Before the AMs are inserted into the first data stream, a data block included in the first data stream may be all data. After the AMs are inserted, the first data stream is a data stream that is formed by commingling the all data and the AMs. When the first data stream that includes the AMs is adaptively allocated to the multiple PCS lanes, for a situation in which the data block of the all data and an AM block in the first data stream have different sizes, to evenly distribute the AMs to the PCS lanes in this embodiment of the present disclosure, the first data stream that includes the AMs may be adaptively allocated using two different granularities. For the all data in the first data stream, the all data parallel processing block may be adaptively allocated to the multiple PCS lanes according to the all data parallel processing granularity; for the AMs in the first data stream, the AM parallel processing block is adaptively allocated to the multiple PCS lanes according to the AM parallel processing granularity. Because the AMs are separately delivered, it can be ensured that the AMs are evenly distributed on the multiple PCS lanes. It can be understood that if the all data parallel processing granularity is equal to the AM parallel processing granularity, the first data stream that includes the AMs may be adaptively allocated to the multiple PCS lanes according to a same granularity.

Figure 2A:
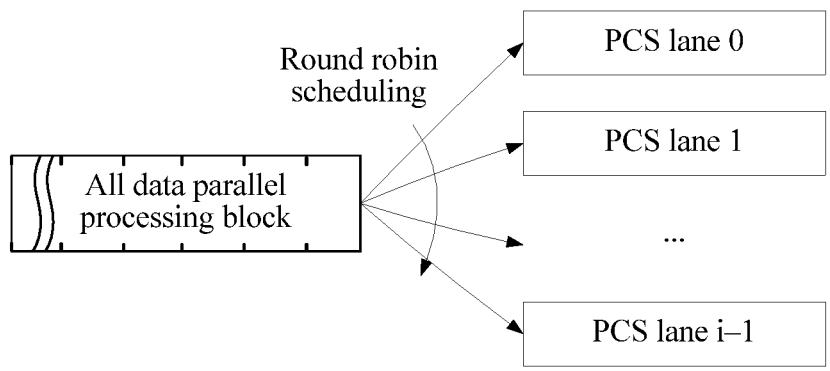
FIG. 2A is a schematic diagram of an implementation manner of adaptively allocating a first data stream to multiple PCS lanes according to an embodiment of the present disclosure.
Figure 2B:
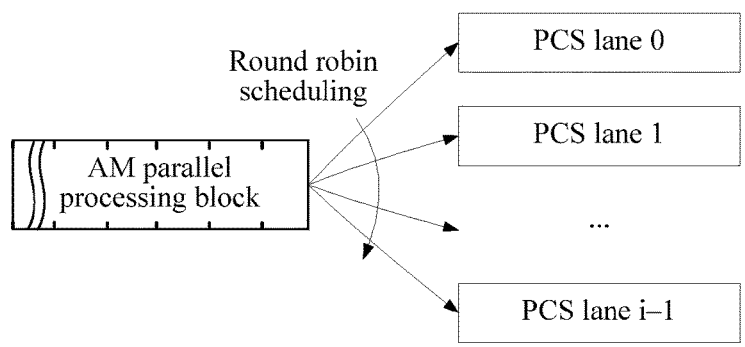
FIG. 2B is a schematic diagram of another implementation manner of adaptively allocating a first data stream to multiple PCS lanes according to an embodiment of the present disclosure.

As shown in FIG. 2A, FIG. 2A is a schematic diagram of an implementation manner of adaptively allocating a first data stream to multiple PCS lanes according to an embodiment of the present disclosure. As shown in FIG. 2B, FIG. 2B is a schematic diagram of another implementation manner of adaptively allocating a first data stream to multiple PCS lanes according to an embodiment of the present disclosure. Adaptively allocating the first data stream to the multiple PCS lanes may be implemented using an adaptation module (Adaptor) at the data transmit end. A function of the adaptation module is to evenly deliver the AMs to respective PCS lanes. The adaptation module performs processing according to a processing mode of a parallel processing block, where the parallel processing block may be classified into two types of parallel processing blocks according to content of the first data stream: an all data parallel processing block and an AM parallel processing block. In the present disclosure, two granularities are used to respectively perform delivery processing on the AMs and the all data, which is different from a delivery structure in which delivery can be performed only according to a unified granularity in the prior art. However, when the parallel processing blocks of the AMs and the all data are the same, the two granularities in the present disclosure may also refer to a same granularity. As shown in FIG. 2A, a method for processing the all data parallel processing block in the present disclosure needs to be performed in a polling delivery manner in which round robin scheduling is performed according to a symbol on the PCS lanes or an integral multiple of the symbol, and the all data parallel processing block is separately delivered to the PCS lane 0, the PCS lane 1, the PCS lane 2, . . . , and the PCS lane i−1. As shown in FIG. 2B, in a method for processing the AM parallel processing block in the first data stream, the AMs are directly delivered to the PCS lanes according to the AM parallel processing granularity. The delivery is also performed in the Round Robin polling delivery manner, and the AM parallel processing block is separately delivered to the PCS lane 0, the PCS lane 1, the PCS lane 2, . . . , and the PCS lane i−1. Sizes of the AMs on the lanes are used as delivery granularities to deliver the AMs to the lanes.

In some embodiments of the present disclosure, after step 102 of adaptively allocating the first data stream that includes the AMs to multiple physical coding sublayer PCS lanes, and before step 103 of performing FEC encoding on the second data streams on the multiple PCS lanes, the data transmission method provided in this embodiment of the present disclosure further includes the following step. If a processing bit width of an AM insertion circuit is different from a processing bit width of an FEC encoding circuit, performing bit width conversion on the first data stream that includes the AMs, where a bit width of the converted first data stream is equal to the processing bit width of the FEC encoding circuit.

After the AMs are inserted into the first data stream, the processing bit width output by the AM insertion circuit is represented by P, the processing bit width of the FEC encoding circuit is represented by F, and in a case in which P and F are not equal, bit width conversion needs to be further performed on a bit width of the first data stream. To adapt to a requirement of the FEC encoding circuit, the bit width of the first data stream may be converted from P to F. Bit width conversion can be implemented using a gearbox module or a slicing module disposed at the data transmit end.

For example, before the first data stream that includes the AMs is adaptively allocated to the multiple PCS lanes, in the present disclosure, whether to use the Gearbox and the Slice to perform matching is chosen according to a bit width matching condition of P and F. When P and F are not matched in the present disclosure, the Gearbox and the Slice need to be added to cooperate in converting data bit widths of the second data streams from P to F, so as to ensure that FEC internal processing is easy.

103. Perform FEC encoding on the second data streams on the multiple PCS lanes to obtain third data streams.

In this embodiment of the present disclosure, FEC encoding is performed on the second data streams delivered on the multiple PCS lanes. For a process of performing FEC encoding on the second data streams, reference may be made to the prior art. The third data streams are obtained after FEC encoding, where the third data streams include the foregoing AMs.

In this embodiment of the present disclosure, after the second data streams are matched to the FEC encoding circuit, to undergo processing, for selection of an FEC algorithm in the present disclosure, Reed Solomon (RS) FEC or Bose-Chaudhuri-Hoequenghem (BCH) FEC may be selected. In addition, the following FEC algorithms may also be selected to complete FEC encoding: KR4-RS (528, 514, 7, 10), KP4-RS (544, 514, 15, 10), RS (560, 514, 23, 10), RS (576, 514, 31, 10), BCH (2858, 2570, 24), BCH (9193, 8192, 71), and the like. The architecture in the present disclosure imposes no limitation on the foregoing FEC algorithm.

Figure 3:
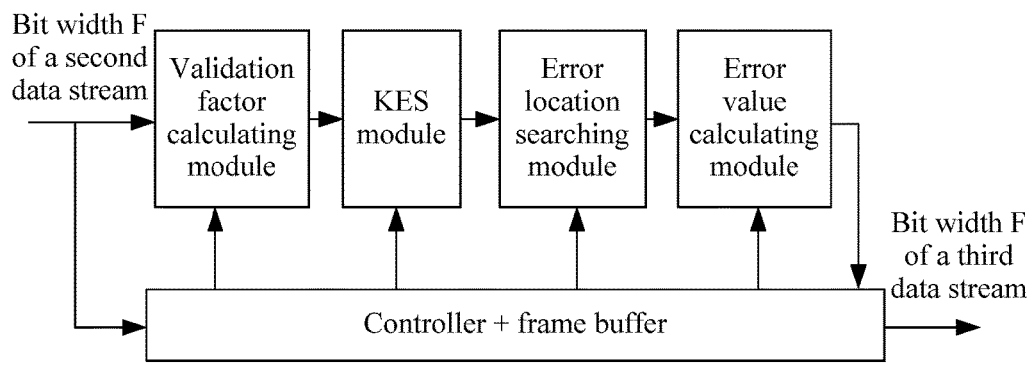
FIG. 3 is a schematic diagram of function modules for performing FEC encoding on second data streams according to an embodiment of the present disclosure.

In the present disclosure, an FEC encoding and decoding module may use RS FEC or BCH FEC, where different FEC algorithms are selected for use mainly according to different link error characteristics. RS FEC is used as an example in the following to describe a specific function included in specific RS FEC. Referring to FIG. 3, FIG. 3 shows a schematic diagram of function modules for performing FEC encoding on second data streams according to an embodiment of the present disclosure, where an RS FEC decoding implementation structure is used as an example. RS FEC is preferentially selected for a current 400 G transmission rate, and therefore an RS FEC encoding implementation structure is used as an example in the present disclosure.

A parallel RS FEC implementation structure is used in the present disclosure, and includes main decoding modules in FIG. 3: a validation factor calculating module (that is, a well-known Syndrome), a KES module, an error location searching module (that is, well-known Chien), and an error value calculating module (that is, well-known Forney).

KES is an error coefficient iterative solving module, and currently, a BM algorithm is more commonly used. Chien is the error location searching module. Forney is the error value calculating module. Other secondary modules such as Newton identities and Error Marking are not listed. An FEC input/output parallel processing bit width (Datawidth) is represented by F. Parameters of FEC are selected as follows. For a size c of an FEC encoding block and an FEC parallelism degree F., c/F may be an integer and have no remainder, that is, processing of one FEC encoding block can be completed in an integral multiple of a period; or c/F may have a remainder, that is, processing is completed in a nonintegral quantity of periods. For the size c of the FEC encoding block and a parallelism degree S of the Serdes, c/S may be an integer and have no remainder, or may have a remainder. All the foregoing implementation scenarios can be handled using the data transmission method provided in the present disclosure.

In some embodiments of the present disclosure, after step 102 of adaptively allocating the first data stream that includes the AMs to multiple physical coding sublayer PCS lanes, and before step 103 of performing FEC encoding on the second data streams on the multiple PCS lanes, the data transmission method provided in this embodiment of the present disclosure may further include the following step.

Step A1: Allocate two different clock cycles to two codeword segments that are processed in parallel in a same clock cycle to perform processing, and insert idle data in the two different clock cycles, where the two different clock cycles each include one codeword segment of the two codeword segments that are originally concatenated in one clock cycle.

That is, in this embodiment of the present disclosure, if the processing bit width of the FEC encoding circuit is not an integral multiple of a bit width of a PCS lane, a case in which two different codeword segments are concatenated in a same clock cycle exists. It can be understood that one codeword may have multiple segments, and one segment in a codeword occupies one clock cycle. For a case in which one segment in a codeword does not fully occupy a clock cycle, the segment and a segment in another codeword need to fully occupy the clock cycle jointly. The respective segments in the two different codewords are concatenated in the same clock cycle; therefore, a problem of concatenation of codeword segments exists. For example, one clock cycle may refer to one period, a concatenated period is generated for segments in two different codewords, and a quantity of periods occupied by each codeword is no longer an integral quantity of periods. For an FEC encoding circuit, data of the two codewords needs to be processed in a same period when quantities of periods occupied by the two codewords are nonintegral quantities of periods. Because two parts of data of the different codeword segments in one period belong to different codewords, and the segments in the two different codewords need to be processed in parallel, logic processing resources of two different parts need to be used in the FEC encoding circuit; otherwise, processing congestion is caused.

For a relatively complex FEC algorithm, data bandwidth and a frequency that can be supported by a current technique and a next-generation technique and that relatively save resources may be a bit width of 640 bits and a clock frequency of 625 MHz. However, a size of a codeword of RS FEC (544, 514, 15, 10) is 5440 bits, 5440/640=8.5 periods, and because of a problem of a nonintegral quantity of periods, a problem is generated during FEC processing. For a nonintegral quantity of periods, redundant logic resources are added in an entire FEC decoding algorithm to adapt to a case in which two continuous codewords need to be processed in one period. For example, for an FEC encoding circuit of which a size of a codeword is 5440 bits, it is basically determined, according to the current technique, that a bit width of the Serdes is 640 bits. If this bit width is also used for decoding, 5440/640=8.5, in this case, a problem of half-period concatenation exists, and logic resources need to be separately added for data in the concatenated period at a cost of adding an extremely large quantity of logic resources. Logic resources need to be increased by about 50%. Another module is similar and is not described in detail.

To enable the bit width of FEC to be processed in an integral quantity of periods, a problem of a mismatch between bit widths of modules inside the PCS may arise. For this problem, the present disclosure provides a solution of allocating two different clock cycles to two codeword segments that are processed in parallel in a same clock cycle to perform processing and inserting idle data in the two different clock cycles. That is, two different clock cycles are allocated to two codeword segments in a concatenated clock cycle to perform processing. Therefore, idle data may be filled in a blank part in a clock cycle. After the idle data is filled in the concatenated clock cycle, because two clock cycles are required to bear the two codeword segments, a frequency needs to be increased, that is, a rate for processing a codeword needs to be accelerated, that is, a frequency increasing manner is used.

In a scenario implemented using step A1 in the present disclosure, step 103 of performing FEC encoding on the second data streams on the multiple PCS lanes to obtain third data streams includes the following steps.

B1. Perform FEC encoding on data, except the inserted idle data, in the second data streams.

B2. After performing FEC encoding on the second data streams, delete the inserted idle data from the encoded second data streams to obtain the third data streams.

It should be noted that in the implementation scenario of using step A1, the idle data is inserted into the second data streams, but there is no need to perform FEC encoding on the idle data, that is, in step B1, FEC encoding is performed only on the data, except the idle data, in the second data streams. After FEC encoding is performed on the second data streams, because the idle data is inserted into the second data streams before encoding, the inserted idle data needs to be deleted. In this case, the third data streams are obtained. A manner of deleting the idle data may also be described as bubble extrusion logic.

Further, in some embodiments of the present disclosure, step A1 of allocating two different clock cycles to two codeword segments that are processed in parallel in a same clock cycle to perform processing, and inserting idle data in the two different clock cycles may include the following step.

Step A11: Insert, between the two codeword segments that are processed in parallel in a same clock cycle, idle data that occupies one clock cycle, allocate the clock cycle in which the two codeword segments are originally concatenated to one codeword segment of the two codeword segments that are originally concatenated in one clock cycle and one part of the idle data in one clock cycle, and allocate a clock cycle next to the clock cycle in which the two codeword segments are originally concatenated to the other codeword segment of the two codeword segments that are originally concatenated in one clock cycle and the other part of the idle data in one clock cycle.

Further, in some embodiments of the present disclosure, step A1 of allocating two different clock cycles to two codeword segments that are processed in parallel in a same clock cycle to perform processing, and inserting idle data in the two different clock cycles may include the following step.

Step A12: Insert idle data after the former codeword segment in the two codeword segments that are processed in parallel in a same clock cycle, so that the clock cycle in which the two codeword segments are originally concatenated is filled, perform backward data shifting on the latter codeword segment in the two codeword segments that are processed in parallel in a same clock cycle, and insert idle data after the last codeword segment in a codeword in which the latter codeword segment is located, so that a clock cycle to which the last codeword segment in the codeword in which the latter codeword segment is located belongs is filled.

Figure 4A:
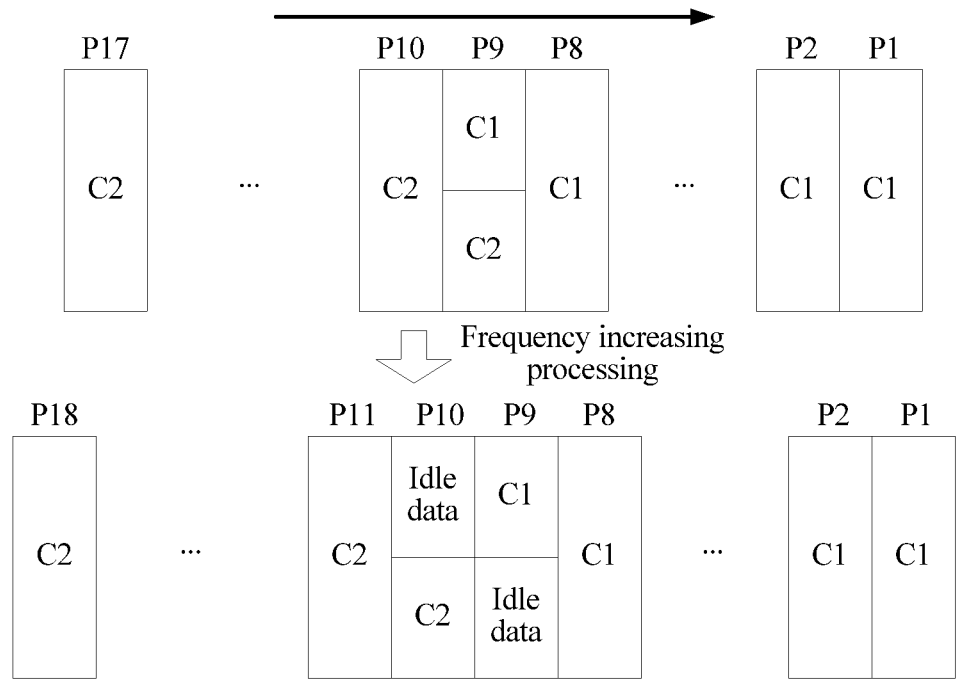
FIG. 4A is a schematic diagram of a manner of processing concatenation of two codeword segments according to an embodiment of the present disclosure.
Figure 4B:
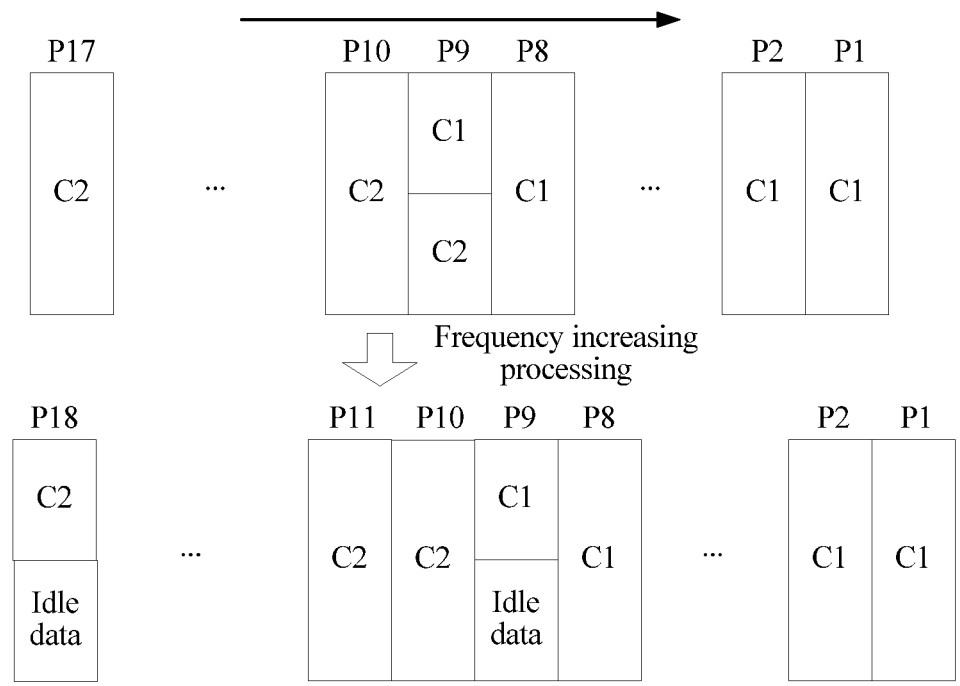
FIG. 4B is a schematic diagram of another manner of processing concatenation of two codeword segments according to an embodiment of the present disclosure.

In step A11 and step A12, the idle data that occupies an entire clock cycle is inserted between the two codeword segments that are processed in parallel in a same clock cycle. The idle data that occupies an entire clock cycle is divided into two parts, one part of the idle data is concatenated with one codeword segment, and the other part thereof is concatenated with the other codeword segment. Referring to FIG. 4A, FIG. 4A is a schematic diagram of a manner of processing concatenation of two codeword segments according to an embodiment of the present disclosure. Referring to FIG. 4B, FIG. 4B is a schematic diagram of another manner of processing concatenation of two codeword segments according to an embodiment of the present disclosure. In an FEC algorithm of RS FEC (544, 514, 15, 10), a bit width of output to 16 lanes is 640 bits, and because 544*10/640=8.5, which is a nonintegral quantity of periods, and a problem that different codeword segments need to be processed in a same clock cycle exists. In the present disclosure, a solution of FEC processing for such a nonintegral multiple is as follows. A decoding bit width of 640 bits is used as an example; two periods are forcibly allocated to two parts of data using a frequency increasing method, and a specific allocation manner of periods is shown in FIG. 4A and FIG. 4B. In FIG. 4A, processing of codewords C1 and C2 is used as an example. A segment of the codeword C1 and a segment of the codeword C2 are in a clock cycle P9, and the segment of the codeword C1 and the segment of the codeword C2 form the concatenated clock cycle P9. In FIG. 4A, idle data is filled into P9, and C1 and the idle data fully fill P9; P10 is filled with idle data as well as C2; the two codewords need 17 clock cycles in total before frequency increasing, and 18 clock cycles are required after frequency increasing processing. However, the codewords C1 and C2 separately use a clock cycle, original processing logic of the FEC encoding circuit can be directly used for execution without causing congestion, and there is no need to copy a separate logic processing resource. Different from FIG. 4A, in FIG. 4B, after the idle data is filled into P9, segments of the codeword C2 successively shift backward. Because the last segment of C2 cannot fully occupy a clock cycle P18, idle data is filled into the clock cycle P18, so that the codewords C1 and C2 separately use a clock cycle, and the original processing logic of the FEC encoding circuit can be directly used for execution without causing congestion, and there is no need to copy a separate logic processing resource. An advantage of the frequency increasing manner in FIG. 4A is, after FEC encoding processing is completed, the idle data is directly removed according to the bubble extrusion logic without selection by a selector (that is, a multiplexer (MUX)). In this way, a problem that data of two codewords exists in data parallel processing in each clock cycle may be resolved, and there is no need to copy extra logic.

In an example, a clock cycle is a period. In FIG. 4A, a frequency needs to be increased in a case in which two codewords exist in a same period is handled in the FEC encoding circuit. Idle data of an entire period is inserted into each concatenated period to forcibly allocate two periods to an end part of C1 and a start part of C2. As shown in FIG. 4A, the period P9 is allocated to the end part of C1, and the period P10 is allocated to the start part of C2. In the manner of inserting the idle data of the entire period, logic of extruding a bubble of the idle data after FEC encoding is relatively easy, it is only required to directly delete the idle data. FIG. 4B shows a second frequency increasing manner in the present disclosure in which different periods are allocated to a data concatenated period to perform processing. In processing in this manner, idle data is inserted only at the end part of C1, and there is the codeword C2 at a start of a next period, without extra idle data that exists in the first manner; however, MUX logic needs to be added to perform a data shifting operation. Compared with the first manner, in this manner, less idle data is inserted; therefore, a frequency that needs to be increased during processing by the FEC encoding circuit is less than that in the first manner, but a MUX data shifting operation needs to be added. Then, bubble extrusion logic is still required after FEC encoding processing is completed, and the bubble extrusion logic needs the data shifting operation. The bubble extrusion logic corresponding to the two frequency increasing manners are inverse processes of frequency increasing processing.

The foregoing solution of the present disclosure makes an entire data rate enlarged; therefore, bubble extrusion logic needs to be added subsequently. For the decoding bit width of 640 bits, two periods are forcibly allocated to the two parts of data in the concatenated period using a frequency increasing method. In this way, a problem of a nonintegral period can be handled without adding a resource. In this embodiment, there is an approximately 6% frequency increase from 625 MHz to 661 MHz. However, in this case, the entire data rate is enlarged, and relatively small bubble extrusion logic needs to be added subsequently. The filled idle data is extruded, and a data format that matches a rate of an output bit width is formed.

In this embodiment of the present disclosure, FEC encoding is performed on the second data streams. The FEC encoding circuit uses an end to end error correction encoding and decoding form. The architecture in the present disclosure supports an encoding form of one or more FECs. A processing bit width of the entire FEC encoding circuit is represented by F. If there are multiple sub-FECs (Integer_f sub-FECs), a processing bit width of each sub-FEC encoding circuit is defined as f; if there is only one FEC, a bit width of the FEC encoding circuit is F. It should be noted that in the foregoing embodiment of the present disclosure, the foregoing frequency increasing method is not merely limited to the example of this nonintegral multiple but applicable to cases of all nonintegral multiples, and is not only applicable to a structure of one FEC encoding circuit but also applicable to a case of multiple FEC encoding circuits. The frequency increasing method is also applicable to an FEC decoding structure, for example, the foregoing method is also applicable in a case in which data processing bandwidth f of a sub-FEC and a codeword are not in a multiple relationship.

In some embodiments of the present disclosure, step 103 of performing FEC encoding on the second data streams on the multiple PCS lanes to obtain third data streams includes the following steps. Acquiring two codeword segments that are in the second data streams and are processed in parallel in a same clock cycle, where the two codeword segments include a first codeword segment and a second codeword segment, and a data volume of the first codeword segment is greater than or equal to that of the second codeword segment; and performing FEC encoding on the first codeword segment using a first FEC encoding circuit, and performing FEC encoding on the second codeword segment using a second FEC encoding circuit, where the third data streams are generated after the first codeword segment and the second codeword segment are respectively processed by the first FEC encoding circuit and the second FEC encoding circuit, and the second FEC encoding circuit and the first FEC encoding circuit use completely different configurable logic encoding circuits, or the second FEC encoding circuit is an FEC encoding circuit obtained after a resource configuration operation is performed on a configurable logic encoding circuit, except a configurable logic encoding circuit that processes the first codeword segment, in the first FEC encoding circuit.

In this embodiment of the present disclosure, in a case in which only one codeword segment in the second data streams exists in one clock cycle, FEC encoding may be performed using the first FEC encoding circuit. However, if a processing bit width of the first FEC encoding circuit cannot be divisible by a bit width of an entire codeword, a case in which two different codeword segments are concatenated in a same clock cycle exists. It can be understood that one codeword may have multiple segments, and one segment in a codeword may occupy one clock cycle. For a case in which one segment in a codeword does not fully occupy a clock cycle, the segment and a codeword segment in another codeword need to fully occupy the clock cycle jointly. The respective codeword segments in the two different codewords are concatenated in the same clock cycle; therefore, a problem of concatenation of codeword segments exists. In the two codeword segments that are processed in parallel in a same clock cycle, the first codeword segment is one codeword segment, in the two codeword segments that are processed in parallel in a same clock cycle, having a larger data volume or an equal data volume, and the second codeword segment is the other codeword segment, in the two codeword segments that are processed in parallel in a same clock cycle, having a smaller data volume or an equal data volume.

Figure 4C:
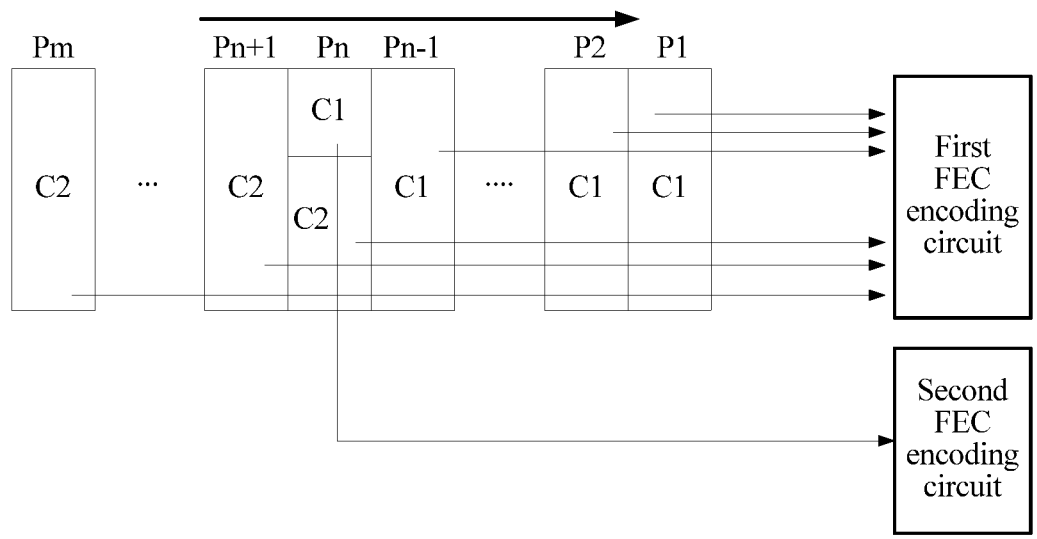
FIG. 4C is a schematic diagram of another manner of processing concatenation of two codeword segments according to an embodiment of the present disclosure.
Figure 4D:
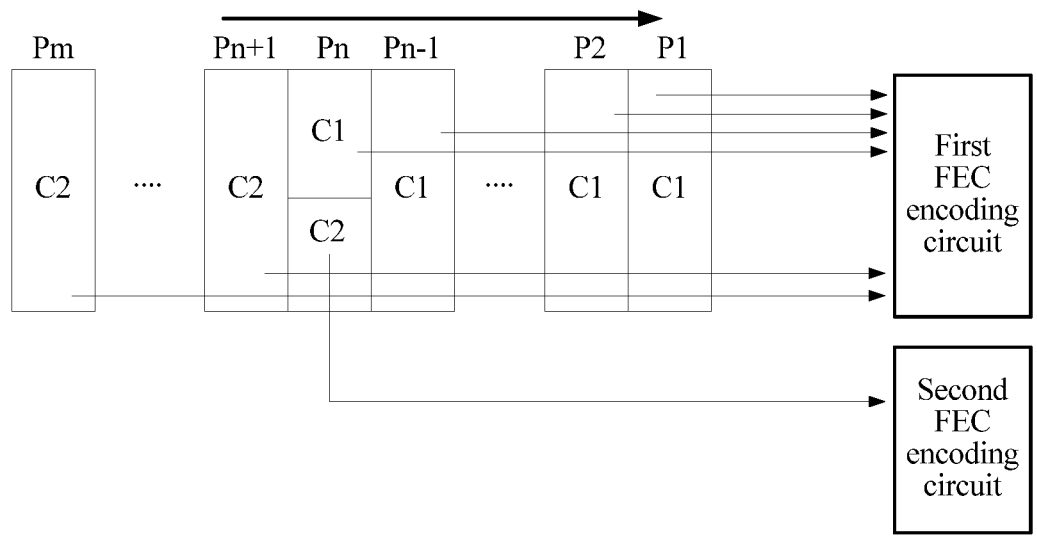
FIG. 4D is a schematic diagram of another manner of processing concatenation of two codeword segments according to an embodiment of the present disclosure.

As shown in FIG. 4C and FIG. 4D, FIG. 4C and FIG. 4D are schematic diagrams of another manner of processing concatenation of two codeword segments according to an embodiment of the present disclosure. When only one codeword segment exists in a same clock cycle, the codeword segment is from a same codeword, and FEC encoding is performed on the codeword segment using the first FEC encoding circuit; while when two codeword segments exist in a same clock cycle, that is, when two codeword segments C1 and C2 are concatenated, the two codeword segments that exist in the same clock cycle belong to different codewords. For example, the first codeword segment C1 belongs to a first codeword codeword 1, which is the former codeword, and the second codeword segment C2 belongs to a second codeword codeword 2, which is the latter codeword. For example, in FIG. 4C, in the clock cycle in which the codewords are concatenated, if C1<C2, a data volume of C1 is less than a data volume of C2. A concatenated period of one clock cycle is used as an example. The codeword segment C2 in the concatenated period is put in the first FEC encoding circuit to undergo FEC encoding, and the codeword segment C1 in the concatenated period is put in the second FEC encoding circuit to undergo FEC encoding. In FIG. 4D, if C1≥C2 in the concatenated period, C1 in the concatenated period is put in the first FEC encoding circuit to undergo FEC encoding, and C2 in the concatenated period is put in the second FEC encoding circuit to undergo FEC encoding. In FIG. 4C and FIG. 4D, the second FEC encoding circuit is only configured to process a codeword segment, in two codeword segments that exist in a same clock cycle, having a smaller data volume or an equal data volume; the first FEC encoding circuit is configured to process a codeword segment, in the two codeword segments that exist in a same clock cycle, having a larger data volume or an equal data volume, and the first FEC encoding circuit is further configured to process a unique codeword segment that exists in one clock cycle.

An implementation manner of the first FEC encoding circuit and the second FEC encoding circuit is as follows. The second FEC encoding circuit is an FEC encoding circuit independent of the first FEC encoding circuit, or the second FEC encoding circuit is an FEC encoding circuit obtained after a resource configuration operation is performed on a configurable logic encoding circuit, except a configurable logic encoding circuit that performs FEC encoding on a codeword segment that has a larger data volume or an equal data volume, in the first FEC encoding circuit. That is, the second FEC encoding circuit may be obtained after a resource configuration operation is performed on a part of configurable logic encoding circuits in the first FEC encoding circuit, or the second FEC encoding circuit may be independent of the first FEC encoding circuit and obtained by directly adding a logic resource. The resource configuration operation in this embodiment of the present disclosure may include operations such as parameter configuration, register setting, and data gating. In addition, another operation may be added to the resource configuration operation according to a specific application scenario to implement resource configuration for a configurable logic encoding circuit.

Figure 4E:
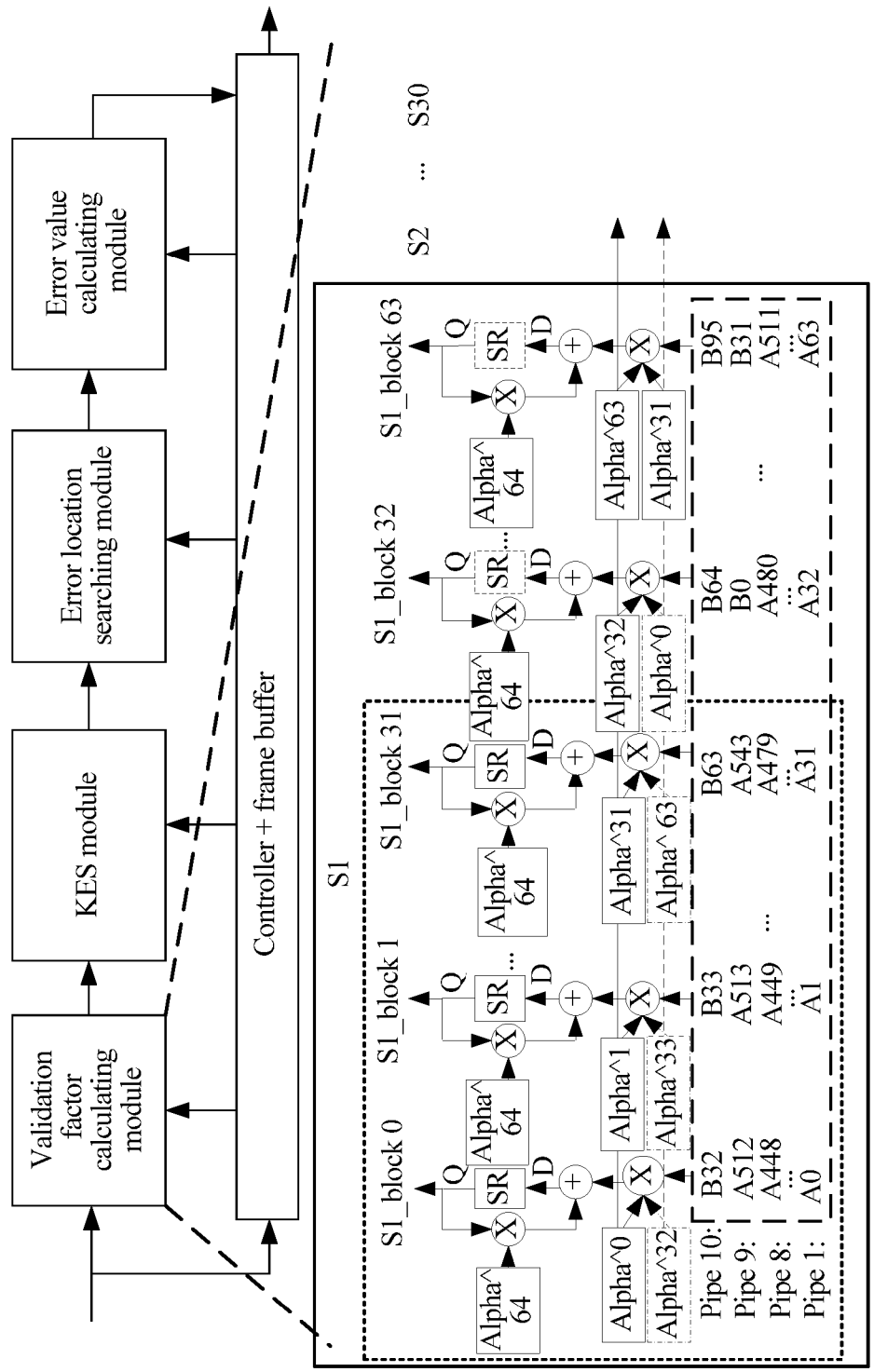
FIG. 4E is a schematic diagram of an implementation manner of a first FEC encoding circuit and a second FEC encoding circuit according to an embodiment of the present disclosure.

The following describes the implementation manner of the first FEC encoding circuit and the second FEC encoding circuit in this embodiment of the present disclosure using examples. As shown in FIG. 4E, FIG. 4E is a schematic diagram of an implementation manner of a first FEC encoding circuit and a second FEC encoding circuit according to an embodiment of the present disclosure. The second FEC encoding circuit in FIG. 4E is obtained after operations of parameter configuration, register setting, and data gating are performed on an idle configurable logic encoding circuit in the first FEC encoding circuit. In an example, the first FEC encoding circuit and the second FEC encoding circuit are implemented based on the validation factor calculating module shown in FIG. 3, and the first FEC encoding circuit has FEC encoding calculation units S1, S2, . . . , and S30. The FEC encoding calculation unit S1 in FIG. 4E is used as an example; S1 has an S1_block 0, an S1_block 1, . . . , and an S1_block 63. The S1_block 0 is used as an example. A result obtained by multiplying data output from a clock cycle 1 to a clock cycle 10 by Alpha^32 or Alpha^0 is added to a result obtained by multiplying data output in a previous clock cycle by Alpha^64 to obtain data D, and the data D is stored in a register (which is represented by SR in the figure) to obtain data Q. Two codewords are transmitted in the clock cycle 1, the clock cycle 2, . . . , and the clock cycle 10, and are respectively a codeword 1 and a codeword 2. The codeword 1 includes data A0, A1, A2, . . . , and A543, and the codeword 2 includes data B0, B1, B2, . . . , and B543.

The clock cycle 9 includes two codeword segments, where A512 to A543 are a codeword segment in the codeword 1, B0 to B31 are a codeword segment in the codeword 2, and the two codeword segments are concatenated in the clock cycle 9. Before the clock cycle 9, all codeword segments transmitted from the clock cycle 0 to the clock cycle 8 belong to the codeword 1. All the S1_block 0, the S1_block 1, . . . , and the S1_block 63 are involved in FEC encoding computation, that is, Alpha^0 to Alpha^63 are selected to perform FEC encoding computation. As indicated by a black solid line in FIG. 4E, when an odd-number codeword (for example, the codeword 1 or a codeword 3) occurs, this line of register parameters is configured. Two concatenated codeword segments exist in the clock cycle 9, and Alpha^32 to Alpha^63 and Alpha^0 to Alpha^31 are selected to perform FEC encoding computation. As indicated by a black dashed line in FIG. 4E, the S1_block 0, the S1_block 1, . . . , and the S1_block 31 are used by the first FEC encoding circuit to perform FEC encoding on the codeword segment from A512 to A543. For the clock cycle 9, the S1_block 32, the S1_block 33, . . . , and the S1_block 63 in the first FEC encoding circuit are idle configurable logic encoding circuits. The second FEC encoding circuit may be obtained after the operations of parameter configuration, register setting, and data gating are performed on the S1_block 32, the S1_block 33, . . . , and the S1_block 63. Then, FEC encoding may be performed on the codeword segment from B0 to B31 using the second FEC encoding circuit. In the clock cycle 10, all codeword segments starting from B32 of the codeword 2 belong to the codeword 2, and FEC encoding may be performed on these codeword segments using the first FEC encoding circuit formed by the S1_block 0, the S1_block 1, . . . , and the S1_block 63. It can be learned from this example that the second FEC encoding circuit may be obtained from an idle configurable logic encoding circuit that exists when the first FEC encoding circuit processes a concatenated codeword segment.

Figure 4F:
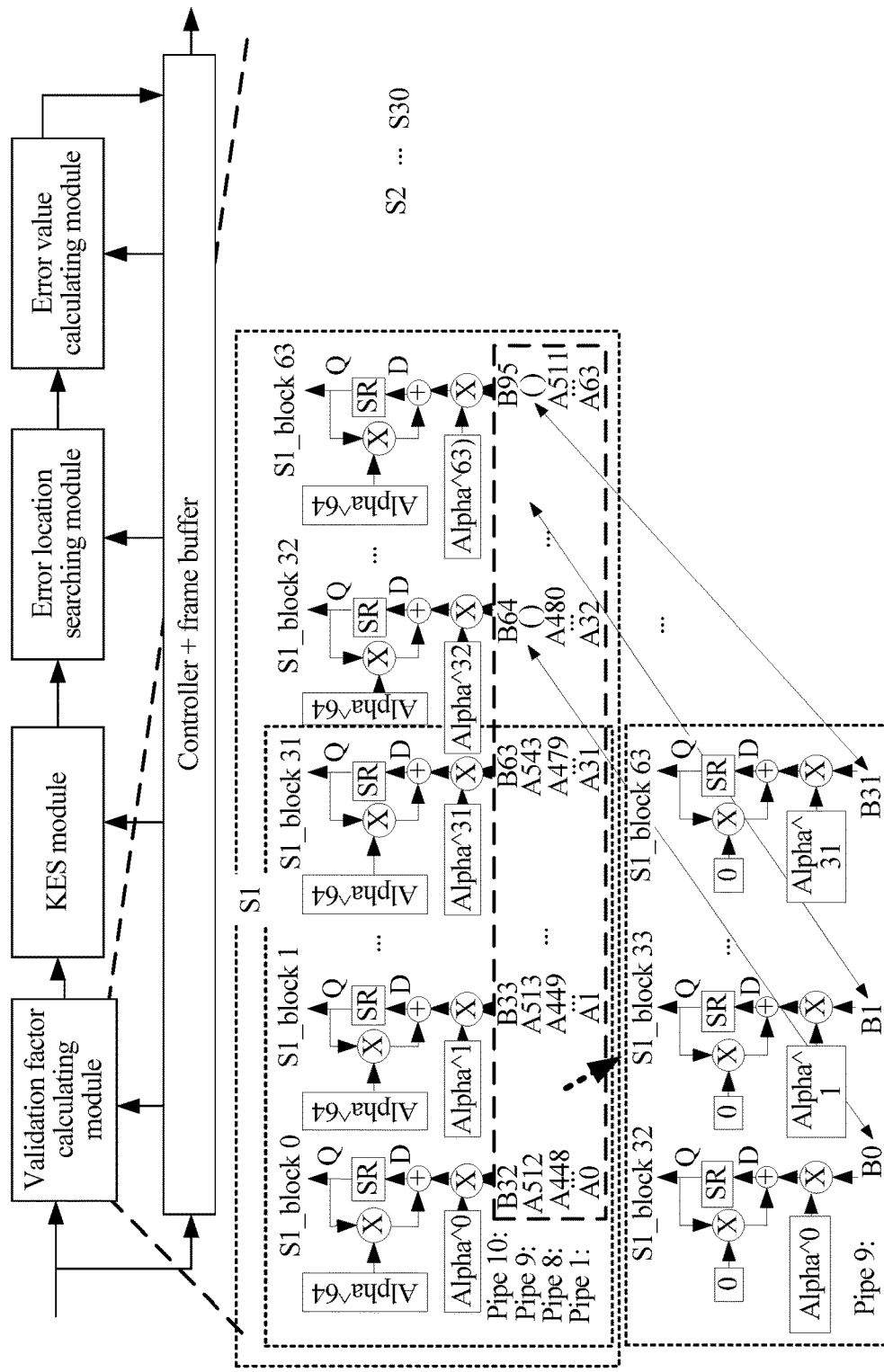
FIG. 4F is a schematic diagram of another implementation manner of a first FEC encoding circuit and a second FEC encoding circuit according to an embodiment of the present disclosure.

As shown in FIG. 4F, FIG. 4F is a schematic diagram of another implementation manner of a first FEC encoding circuit and a second FEC encoding circuit according to an embodiment of the present disclosure. The second FEC encoding circuit in FIG. 4F is independent of the first FEC encoding circuit and obtained by directly adding a logic resource. In an example, the first FEC encoding circuit and the second FEC encoding circuit are implemented based on the validation factor calculating module shown in FIG. 3, and the first FEC encoding circuit has FEC encoding calculation units S1, S2, . . . , and S30. The FEC encoding calculation unit S1 in FIG. 4F is used as an example; S1 has an S1_block 0, an S1_block 1, . . . , and an S1_block 63. The S1_block 0 is used as an example. A result obtained by multiplying data output from a clock cycle 1 to a clock cycle 10 by Alpha^0 is added to a result obtained by multiplying data output in a previous clock cycle by Alpha^64 to obtain data D, and the data D is stored in a register (which is represented by SR in the figure) to obtain data Q. Two codewords are transmitted in the clock cycle 1, the clock cycle 2, . . . , and the clock cycle 10, and are respectively a codeword 1 and a codeword 2. The codeword 1 includes data A0, A1, A2, . . . , and A543, and the codeword 2 includes data B0, B1, B2, . . . , and B543. There are two codeword segments in the clock cycle 9, where A512 to A543 are a codeword segment in the codeword 1, B0 to B31 are a codeword segment in the codeword 2, and the two codeword segments are concatenated in the clock cycle 9. Before the clock cycle 9, all codeword segments transmitted from the clock cycle 0 to the clock cycle 8 belong to the codeword 1.

All the S1_block 0, the S1_block 1, ..., and the S1_block 63 are involved in FEC encoding computation, that is, Alpha^0 to Alpha^63 are selected to perform FEC encoding computation. When an odd-number codeword (for example, the codeword 1 or a codeword 3) occurs, this line of register parameters is configured. Two concatenated codeword segments exist in the clock cycle 9, and Alpha^0 to Alpha^31 are selected to perform FEC encoding computation. The S1_block 0, the S1_block 1, ..., and the S1_block 31 are used by the first FEC encoding circuit to perform FEC encoding on the codeword segment from A512 to A543. The second FEC encoding circuit is independently configured outside the first FEC encoding circuit, and the independently configured second FEC encoding circuit includes the S1_block 32, the S1_block 33, ..., and the S1_block 63. Then, FEC encoding may be performed on the codeword segment from B0 to B31 using the second FEC encoding circuit. In the clock cycle 10, all codeword segments starting from B32 of the codeword 2 belong to the codeword 2, and FEC encoding may be performed on these codeword segments using the first FEC encoding circuit formed by the S1_block 0, the S1_block 1, ..., and the S1_block 63. It can be learned from this example that the second FEC encoding circuit may be independent of the first FEC encoding circuit and obtained by directly adding a logic resource.

It should be noted that in this embodiment of the present disclosure, for the two codeword segments that are processed in parallel in a same clock cycle, when data volumes of the two codeword segments are equal, configurable logic encoding circuits of the second FEC encoding circuit need to reach a maximum value. In this case, the second FEC encoding circuit may be 50% of configurable logic encoding circuits of the first FEC encoding circuit. As a difference between the data volumes of the two codeword segments that are processed in parallel in a same clock cycle increases, the configurable logic encoding circuits required by the second FEC encoding circuit decrease. For example, the configurable logic encoding circuits required by the second FEC encoding circuit may be determined according to a codeword ratio of the two codeword segments in a nonintegral period, and the configurable logic encoding circuits of the second FEC encoding circuit are a value of configurable logic encoding circuits that can process a smaller codeword segment in the nonintegral concatenated period.

It can be learned from the foregoing descriptions that the second FEC encoding circuit may be implemented in a manner of independently adding a logic circuit, or may be obtained from circuits of the first FEC encoding circuit by changing a parameter. The second FEC encoding circuit handles a nonintegral period during FEC encoding. A problem that exists in the nonintegral period and that two codeword segments need to be processed in one period may be handled by adding a configurable logic encoding circuit in the nonintegral period. In this embodiment of the present disclosure, it is equivalent to adding a second FEC encoding circuit outside the first FEC encoding circuit as the configurable logic encoding circuit. This embodiment of the present disclosure further supports another method for configuring a parameter in the first FEC encoding circuit to directly configure, in a concatenated period, an idle configurable logic encoding circuit in the first FEC encoding circuit as the second FEC encoding circuit to handle the problem of the nonintegral period.

If the manner of independently adding the second FEC encoding circuit is used, a maximum of half resources of configurable logic encoding circuits required by the first FEC encoding circuit may be added in this embodiment of the present disclosure. The following describes, using an example, a problem of processing two codeword segments in one period when there are a nonintegral quantity of periods. For an FEC of which a size of a codeword is 5440 bits, it is basically determined, according to a technique of a current application-specific integrated circuit (ASIC,), that a bit width of a Serdes is 640 bits. If this bit width is also used for FEC encoding, 5440/640=8.5, a problem of half-period concatenation exists, and the second FEC encoding circuit needs to be added for data in the concatenated period. An encoding bit width of 640 bits is used as a reference; a configurable logic encoding circuit of the second FEC encoding circuit that needs to be added is half of the configurable logic encoding circuits of the first FEC encoding circuit. For another example, if an FEC algorithm of RS FEC (544, 514, 15, 10) is implemented using a field programmable gate array (FPGA,) processing technique, a bit width of the Serdes is 1280 bits. If the first FEC encoding circuit uses this bit width, 5440/1280=4.25, and in this way, a problem of nonintegral period concatenation also arises. If the second FEC encoding circuit is obtained using a method, in the present disclosure, of independently adding a configurable logic encoding circuit, an encoding bit width of 1280 bits is used as a reference, and a configurable logic encoding circuit of the second FEC encoding circuit that needs to be added is a quarter of the configurable logic encoding circuits of the first FEC encoding circuit.

If the second FEC encoding circuit is obtained from the configurable logic encoding circuits of the first FEC encoding circuit, and if there are two codeword segments in one clock cycle, the register needs to be set in different periods. A specific setting rule is, when codeword segments in two continuous periods are from different codewords, a setting operation needs to be performed on the register. A second FEC encoding circuit may be obtained in a nonintegral period by means of operations of parameter configuration, register setting, and data gating. A main logic part of the second FEC encoding circuit is still from the configurable logic encoding circuits of the first FEC encoding circuit; therefore, there is also no need to add an extra configurable logic encoding circuit. If the second FEC encoding circuit is obtained by configuring a parameter in the first FEC encoding circuit, a resource volume that needs to be increased does not exceed 10% of the configurable logic encoding circuits required by the first FEC encoding circuit.

It should be noted that in the foregoing examples of the present disclosure, concatenation of codeword segments C1 and C2 in one clock cycle is used as an example in both FIG. 4C and FIG. 4D. When the two codeword segments are concatenated in one clock cycle, the second FEC encoding circuit may be independently configured from the idle configurable logic encoding circuit in the first FEC encoding circuit according to a ratio of a data volume of C1 to a data volume of C2, or the second FEC encoding circuit may be independently added outside the first FEC encoding circuit according to a ratio of a data volume of C1 to a data volume of C2, which is not limited in the present disclosure. However, when two codewords C2 and C3 are concatenated in another clock cycle, specific implementation of the second FEC encoding circuit may still be determined according to a ratio of a data volume of C2 to a data volume of C3. In addition, when two codewords C3 and C4 are concatenated in another clock cycle, specific implementation of the second FEC encoding circuit may still be determined according to a ratio of a data volume of C3 to a data volume of C4. It should be noted that for obtaining the second FEC encoding circuit in a manner of adding a configurable logic encoding circuit, the configurable logic encoding circuit that needs to be added needs to be a largest value in three codeword segments that have a smallest data volume in three concatenated periods (C1:C2, C2:C3, and C3:C4), so as to determine the second FEC encoding circuit.

Figure 4G:
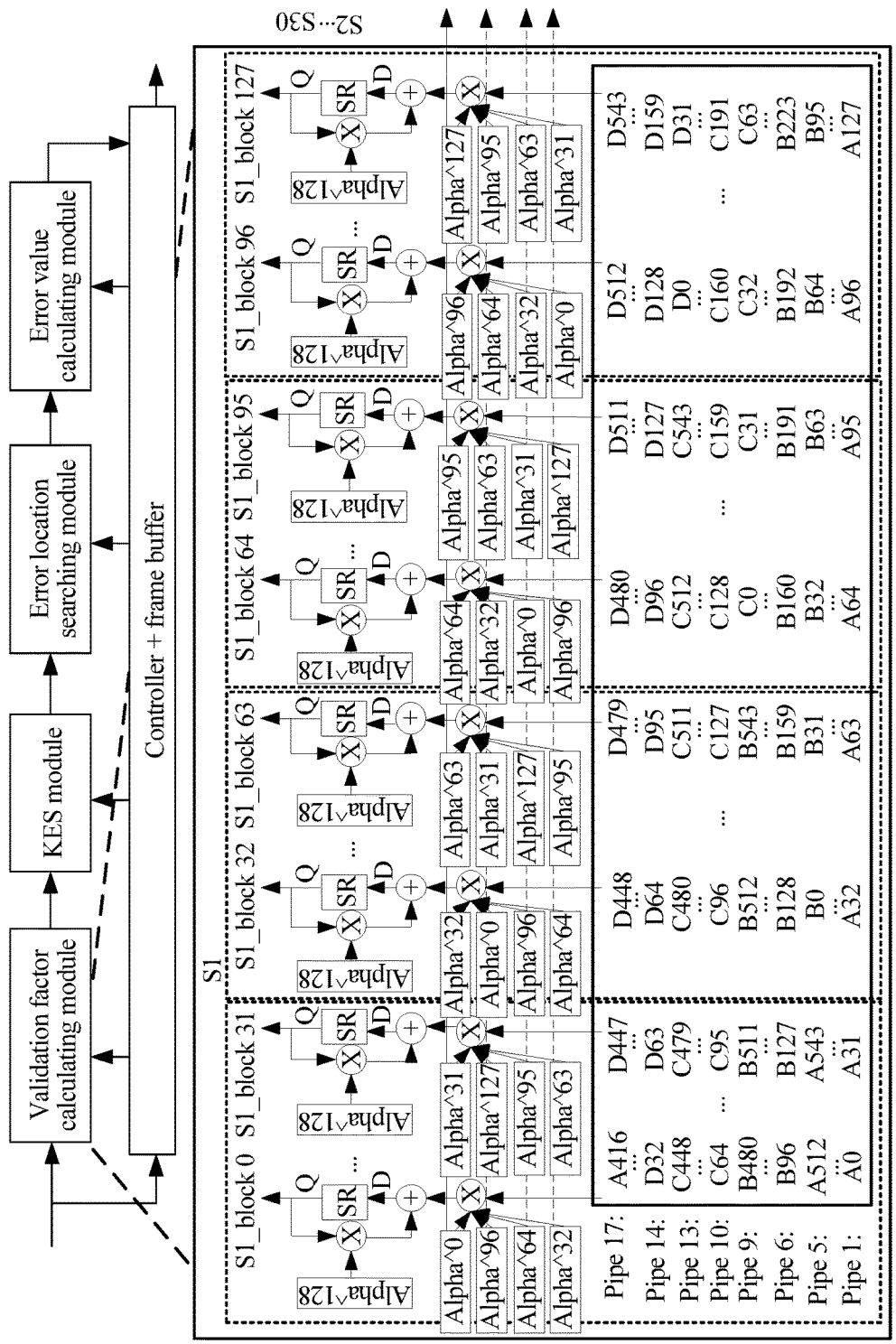
FIG. 4G is a schematic diagram of another implementation manner of a first FEC encoding circuit and a second FEC encoding circuit according to an embodiment of the present disclosure.

As shown in FIG. 4G, FIG. 4G is a schematic diagram of another implementation manner of a first FEC encoding circuit and a second FEC encoding circuit according to an embodiment of the present disclosure. The second FEC encoding circuit in FIG. 4G is obtained after operations of parameter configuration, register setting, and data gating are performed on an idle configurable logic encoding circuit in the first FEC encoding circuit. In an example, the first FEC encoding circuit and the second FEC encoding circuit are implemented based on the validation factor calculating module shown in FIG. 3, and the first FEC encoding circuit has FEC encoding calculation units S1, S2, . . . , and S30. The FEC encoding calculation unit S1 in FIG. 4G is used as an example; S1 has an S1_block 0, an S1_block 1, . . . , and an S1_block 127. The S1_block 0 is used as an example. A result obtained by multiplying data output from a clock cycle 1 to a clock cycle 17 by Alpha^32 or Alpha^64 or Alpha^96 or Alpha^0 is added to a result obtained by multiplying data output in a previous clock cycle by Alpha^128 to obtain data D, and the data D is stored in a register (which is represented by SR in the figure) to obtain data Q. Four codewords are transmitted in the clock cycle 1, the clock cycle 2, . . . , and the clock cycle 17, and are respectively a codeword 1, a codeword 2, a codeword 3, and a codeword 4. The codeword 1 includes data A0, A1, A2, . . . , and A543, the codeword 2 includes data B0, B1, B2, . . . , and B543, the codeword 3 includes data C0, C1, C2, . . . , and C543, and the codeword 4 includes data D0, D1, D2, . . . , and D543. There are two codeword segments in each of the clock cycles 5, 9, and 13. Processing in the clock cycle 5 is used as an example, where A512 to A543 are a codeword segment in the codeword 1, B0 to B95 are a codeword segment in the codeword 2, and the two codeword segments are concatenated in the clock cycle 5. Before the clock cycle 5, all codeword segments transmitted from the clock cycle 0 to the clock cycle 4 belong to the codeword 1. All the S1_block 0, the S1_block 1, . . . , and the S1_block 127 are involved in FEC encoding computation, that is, Alpha^0 to Alpha^63 are selected to perform FEC encoding computation. As indicated by a black solid line in FIG. 4G, when an odd-number codeword (for example, the codeword 1 or a codeword 3) occurs, this line of register parameters is configured. Two concatenated codeword segments exist in the clock cycle 5, and Alpha^96 to Alpha^127, Alpha^0 to Alpha^31, Alpha^32 to Alpha^63, and Alpha^64 to Alpha^95 are selected to perform FEC encoding computation. As indicated by a black dashed line in FIG. 4G, the S1_block 32, the S1_block 33, . . . , and the S1_block 127 are used by the first FEC encoding circuit to perform FEC encoding on the codeword segment from B0 to B95. The S1_block 0, the S1_block 1, . . . , and the S1_block 32 in the first FEC encoding circuit are idle configurable logic encoding circuits. The second FEC encoding circuit may be obtained after the operations of parameter configuration, register setting, and data gating are performed on the S1_block 0, the S1_block 1, . . . , and the S1_block 32. Then, FEC encoding may be performed on the codeword segment from A512 to A543 using the second FEC encoding circuit. In the clock cycle 6, all codeword segments starting from B32 of the codeword 2 belong to the codeword 2, and FEC encoding may be performed on these codeword segments using the first FEC encoding circuit formed by the S1_block 0, the S1_block 1, . . . , and the S1_block 127. It can be learned from this example that the second FEC encoding circuit may be obtained from an idle configurable logic encoding circuit that exists when the first FEC encoding circuit processes a concatenated codeword segment.

Figure 4H:
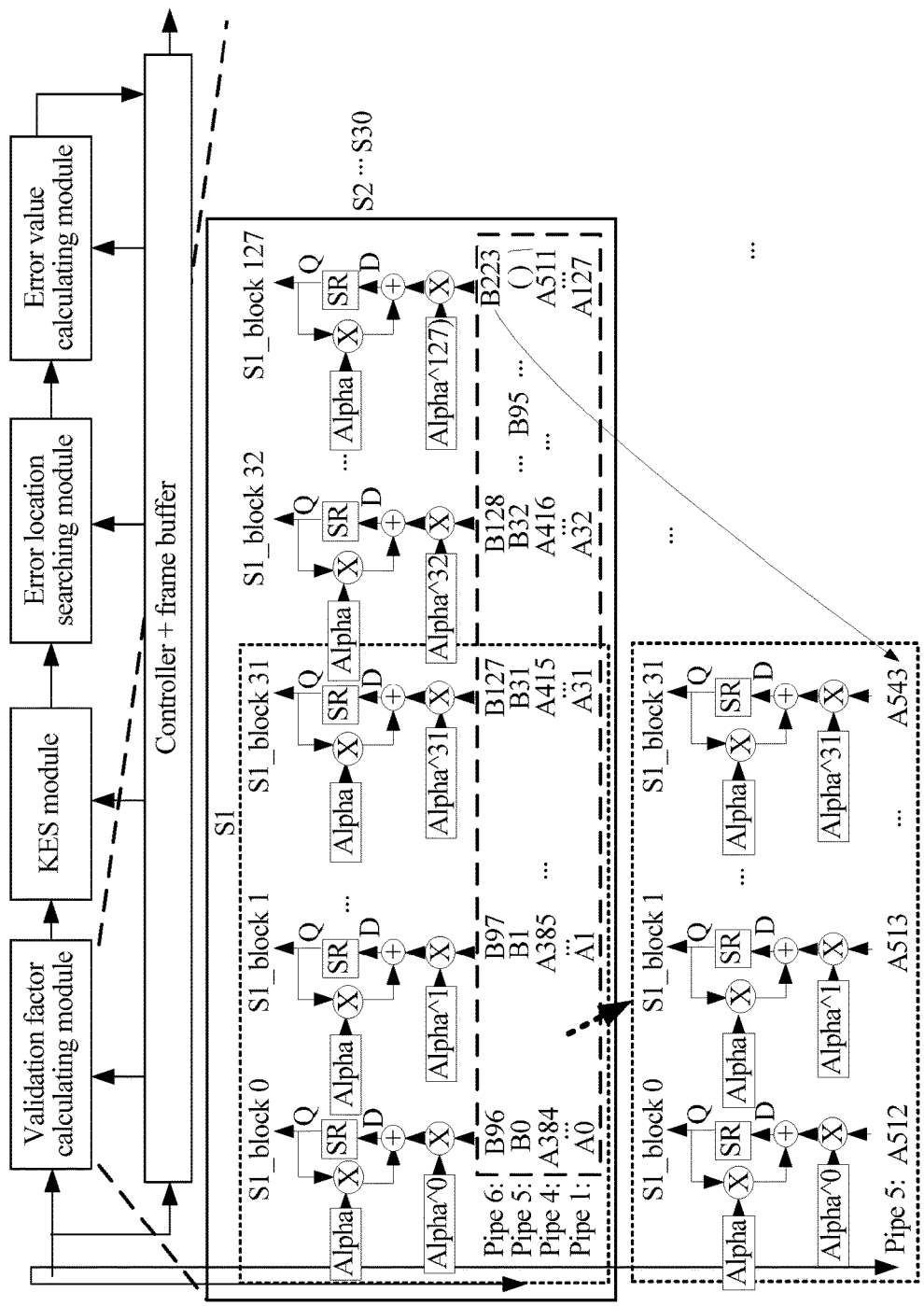
FIG. 4H is a schematic diagram of another implementation manner of a first FEC encoding circuit and a second FEC encoding circuit according to an embodiment of the present disclosure.

As shown in FIG. 4H, FIG. 4H is a schematic diagram of another implementation manner of a first FEC encoding circuit and a second FEC encoding circuit according to an embodiment of the present disclosure. The second FEC encoding circuit in FIG. 4H is independent of the first FEC encoding circuit and obtained by directly adding a logic resource. In an example, the first FEC encoding circuit and the second FEC encoding circuit are implemented based on the validation factor calculating module shown in FIG. 3, and the first FEC encoding circuit has FEC encoding calculation units S1, S2, . . . , and S30. The FEC encoding calculation unit S1 in FIG. 4H is used as an example; S1 has an S1_block 0, an S1_block 1, . . . , and an S1_block 127. The S1_block 0 is used as an example. A result obtained by multiplying data output from a clock cycle 1 to a clock cycle 6 by Alpha^0 is added to a result obtained by multiplying data output in a previous clock cycle by Alpha^a to obtain data D, and the data D is stored in a register (which is represented by SR in the figure) to obtain data Q. Two codewords are transmitted in the clock cycle 1, the clock cycle 2, . . . , and the clock cycle 6, and are respectively a codeword 1 and a codeword 2. The codeword 1 includes data A0, A1, A2, . . . , and A543, and the codeword 2 includes data B0, B1, B2, . . . , and B543. The clock cycle 5 includes two codeword segments, where A512 to A543 are a codeword segment in the codeword 1, B0 to B95 are a codeword segment in the codeword 2, and the two codeword segments are concatenated in the clock cycle 5. Before the clock cycle 5, all codeword segments transmitted from the clock cycle 0 to the clock cycle 4 belong to the codeword 1. All the S1_block 0, the S1_block 1, . . . , and the S1_block 127 are involved in FEC encoding computation, that is, Alpha^0 to Alpha^127 are selected to perform FEC encoding computation. When an odd-number codeword (for example, the codeword 1 or a codeword 3) occurs, this line of register parameters is configured. Two concatenated codeword segments exist in the clock cycle 5, and Alpha^0 to Alpha^31 are selected to perform FEC encoding computation. The S1_block 0, the S1_block 1, . . . , and the S1_block 95 are used by the first FEC encoding circuit to perform FEC encoding on the codeword segment from B0 to B95. The second FEC encoding circuit is independently configured outside the first FEC encoding circuit, and the independently configured second FEC encoding circuit includes the S1_block 0, the S1_block 1, . . . , and the S1_block 31. Then, FEC encoding may be performed on the codeword segment from A512 to A543 using the second FEC encoding circuit. In the clock cycle 6, all codeword segments starting from B32 of the codeword 2 belong to the codeword 2, and FEC encoding may be performed on these codeword segments using the first FEC encoding circuit formed by the S1_block 0, the S1_block 1, . . . , and the S1_block 127. It can be learned from this example that the second FEC encoding circuit may be independent of the first FEC encoding circuit and obtained by directly adding a logic resource.

In some embodiments of the present disclosure, after step 103 of performing FEC encoding on the second data streams on the multiple PCS lanes to obtain third data streams, and before step 104 of delivering the third data streams to multiple physical medium attachment sublayer PMA lanes according to an input bit width of a serializer/deserializer Serdes, the data transmission method provided in this embodiment of the present disclosure further includes the following step. If a processing bit width of an AM insertion circuit is different from a processing bit width of an FEC encoding circuit, performing bit width conversion on the third data streams, where bit widths of the converted third data streams are equal to the processing bit width of the AM insertion circuit.

After the third data streams are obtained after FEC encoding is performed on the second data streams, the processing bit width output by the AM insertion circuit is represented by P, the processing bit width of the FEC encoding circuit is represented by F, and in a case in which P and F are not equal, bit width conversion needs to be further performed on bit widths of the third data streams. To adapt to a requirement of the FEC encoding circuit, the bit widths of the third data streams are converted from P to F. After FEC encoding is completed, the bit widths of the third data streams need to be further converted to the original bit width P. Bit width conversion can be implemented using a gearbox module or a slicing module disposed at the data transmit end. For example, before the first data stream that includes the AMs is adaptively allocated to the multiple PCS lanes, in the present disclosure, whether to use the Gearbox and the Slice to perform matching is chosen according to a bit width matching condition of P and F. When P and F are not matched in the present disclosure, the Gearbox and the Slice need to be added to cooperate in converting data bit widths of the third data streams from P to F, so as to ensure integrity of the AMs.

104. Deliver the third data streams to multiple PMA lanes according to an input bit width of a Serdes to obtain multiple fourth data streams, where the multiple fourth data streams are in a one-to-one correspondence with the multiple PMA lanes, each fourth data stream includes at least one complete and continuous AM, and the at least one AM is an AM in the multiple AMs.

In this embodiment of the present disclosure, after the third data streams are obtained by means of FEC encoding, because the third data streams include the AMs, the data transmit end needs to deliver the third data streams to the multiple PMA lanes to obtain the multiple fourth data streams, where the multiple fourth data streams are in a one-to-one correspondence with the multiple PMA lanes, each fourth data stream includes at least one complete and continuous AM, and the at least one AM is an AM in the multiple AMs. Slicing on the third data streams is required, where slicing may damage integrity of the AMs; as a result, a data decoder side cannot correctly detect the AMs. Therefore, in this embodiment of the present disclosure, a manner of delivering the third data streams according to the input bit width of the Serdes is used, and a third data stream delivered to each PMA lane includes a complete and continuous AM. If the third data stream on each PMA lane includes a complete and continuous AM, a data receive end may perform AM locking and detection, and perform remapping on lanes according to the AMs after the AMs are found.

The at least one AM is included in data delivered by a delivery circuit in one clock cycle to a PMA lane used to receive the at least one AM. The PMA lane used to receive the at least one AM is a PMA lane in the multiple PMA lanes. The delivery circuit is configured to deliver the third data streams to the multiple PMA lanes. In one clock cycle, the delivery circuit can deliver data to one PMA lane in the multiple PMA lanes. For example, the delivery circuit may deliver the third data streams to the multiple PMA lanes in a round robin scheduling manner. For example, the third data streams may include multiple blocks that execute FEC encoding, where the blocks that execute FEC encoding may be data blocks of 5280 bits.

It should be noted that an AM is a data block. A quantity of bits included in the AM is equal to a positive integral multiple of a quantity of bits included in a data block in the first data stream. For example, the AM is a data block of 64 bits or a data block of 128 bits. In addition, multiple AMs are inserted into the first data stream, and the multiple AMs are in a one-to-one correspondence with the multiple physical coding sublayer PCS lanes.

It should be noted that in this embodiment of the present disclosure, an FEC codec is introduced to the Ethernet architecture. The third data streams are obtained after FEC encoding, and the third data streams are delivered according to the input bit width of the Serdes. Processing bandwidth used to transmit data to the multiple PMA lanes may be determined according to the input bit width of the Serdes. The data receive end may receive, using the PMA lanes, the third data streams transmitted by the data transmit end. Because the third data streams are delivered to the multiple PMA lanes in the present disclosure, an AM included in the third data stream delivered to each PMA lane is continuous and complete, so that the AMs are not damaged.

It should be noted that the delivering the third data streams to multiple PMA lanes according to an input bit width of a Serdes to obtain multiple fourth data streams may be evenly delivering the third data streams to the multiple PMA lanes according to the input bit width of the Serdes to obtain the multiple fourth data streams, where the evenly delivery of the third data streams may be that quantities of data received by different PMA lanes in the multiple PMA lanes in a same time period are equal.

In some embodiments of the present disclosure, step 104 of delivering the third data streams to multiple physical medium attachment sublayer PMA lanes according to an input bit width of a Serdes may include the following steps.

D1. Determine a slice size according to a quantity of the PCS lanes and a data size of a single character borne on each PCS lane, and slice the third data streams according to the slice size to obtain sliced third data streams, where each slice includes multiple third data blocks.

D2. Determine, according to bit widths of the third data streams, the input bit width of the Serdes, and the slice size, a quantity of slices that need to be delivered, extract, from the sliced third data streams, third data blocks in slices corresponding to the quantity of slices, and then deliver the third data blocks to a same PMA lane in the multiple PMA lanes after overlaying third data blocks that are at a same location in the slices corresponding to the quantity of slices.

The quantity of the PCS lanes, that is, a quantity of PCS lanes on which the third data streams are borne is acquired, and then the data size of a single character borne on each PCS lane is acquired. To ensure that the AMs are continuous and complete, the slice size used for slicing the third data streams is determined according to the quantity of the PCS lanes and the data size of a single character borne on each PCS lane. For example, the slice size may be determined by multiplying the quantity of the PCS lanes by the data size of a single character borne on each PCS lane. The slice size is a slice interval used for slicing the third data streams, that is, a quantity of data blocks that need to be sliced as a slice each time. After the slice size is determined, the third data streams may be sliced according to the slice size. After the third data streams are sliced, data included in each slice is defined as a third data block. Optionally, the slice size may be an integral multiple of a result obtained by multiplying the quantity of the PCS lanes by the data size of a single character borne on each PCS lane. In this way, an AM in a slice obtained by means of slicing is continuous and complete.

After the third data streams are sliced, the quantity of slices that need to be delivered is determined according to the bit widths of the third data streams, the input bit width of the Serdes, and the slice size. That is, a quantity of slices that need to be delivered to each PMA lane is determined according to a relationship between the bit widths of the third data streams, the input bit width of the Serdes, and the slice size. After the quantity of slices is obtained by means of calculation, the third data blocks in the slices corresponding to the quantity of slices are extracted from the sliced third data streams, and then the third data blocks are delivered to the same PMA lane in the multiple PMA lanes after the third data blocks that are at the same location in the slices corresponding to the quantity of slices are overlaid. For example, the quantity of slices is 3, three slices are then acquired, third data blocks that are at a same location are extracted from the slices, and the third data blocks are delivered to a PMA lane. Third data blocks that are at different locations in the slices are delivered to different PMA lanes. In this way, it can be ensured that third data blocks that are at a same location in the slices are only on one PMA lane; therefore, a third data stream on each PMA lane still includes a complete and continuous AM, and the data receive end may receive the complete and continuous AMs.

Further, in some embodiments of the present disclosure, step D1 of determining a slice size according to a quantity of the PCS lanes and a data size of a single character borne on each PCS lane, and slicing the third data streams according to the slice size includes the quantity of the PCS lanes is i, the data size of a single character borne on each PCS lane is m, a size of a third data block in each slice obtained after the third data streams are sliced is i×m, and the bit widths of the third data streams are i×m×Integer 1, where the Integer 1 is a preset positive integer; step D2 of determining, according to bit widths of the third data streams, the input bit width of the Serdes, and the slice size, a quantity of slices includes the input bit width of the Serdes is i×m×Integer 2, the slice size is i×m×Integer S, and therefore both the Integer 1 and the Integer 2 are integral multiples of the Integer S, and the quantity of slices is Integer 2/Integer S, where the Integer 2 is a preset positive integer; and step D2 of extracting, from the sliced third data streams, third data blocks in slices corresponding to the quantity of slices, and then delivering the third data blocks to a same PMA lane in the multiple PMA lanes after overlaying third data blocks that are at a same location in the slices corresponding to the quantity of slices includes extracting the $n^{th}$ third data block from each slice, and delivering Integer 2/Integer S extracted $n^{th}$ third data blocks in total to the $n^{th}$ PMA lane after overlaying the Integer 2/Integer S extracted $n^{th}$ third data blocks, where a value of n is any value from 0 to i–1.

In this embodiment of the present disclosure, the third data streams obtained after FEC encoding processing is performed need to be transmitted to the Serdes. If F and S are not matched, an existing simple Gearbox technology cannot be used, because integrity and continuity of an AM pattern may be damaged.

Figure 5:
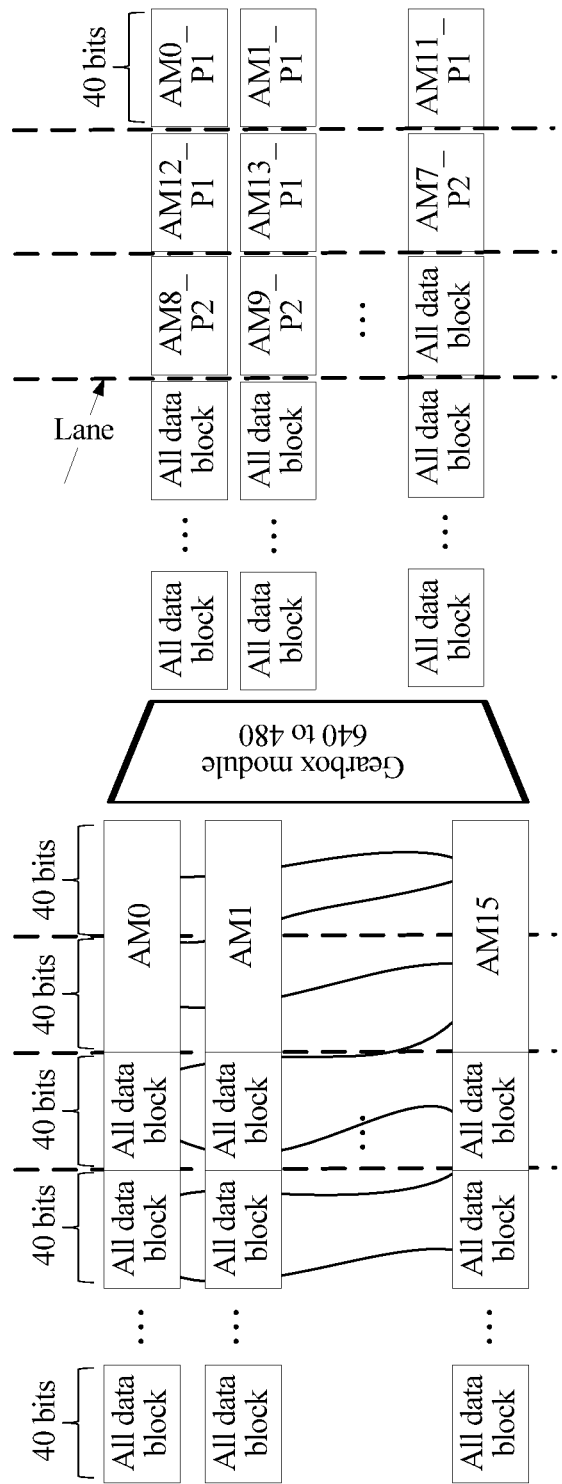
FIG. 5 is a schematic diagram of bit width variation of a common Gearbox in the prior art.

A case of a common Gearbox cannot adapt to integrity and continuity of an AM pattern in a process of matching of various bit widths. As shown in FIG. 5, FIG. 5 is a schematic diagram of bit width variation of a common Gearbox in the prior art. For example, for a bit width that may be selected in a current technique and a quantity of AMs and a size of an AM that are defined in a current standard, a problem that integrity and continuity of an AM pattern are damaged occurs when the Gearbox performs conversion. It is assumed that the third data streams obtained after FEC encoding is performed have 16 AMs in total, which are respectively an AM 0, an AM 1, . . . , and an AM 15, and in addition to the 16 AMs, all the rest is all data blocks. If a common gearbox module is used, after a bit width is converted from 640 bits to 480 bits, each data block is still 40 bits, and then 12 lanes exist after gearing. The original AMs are sliced into an AM 0_P1, . . . , an AM 11_P1, an AM 12_P1, an AM 13_P1, . . . , an AM 7_P2, an AM 8_P2, an AM 9_P2, . . . , and an all data block, which may be located in a third pipe. Then, a problem that the AMs are discontinuous occurs, the AMs are damaged, and the data receive end cannot normally receive the AMs.

It can be seen from FIG. 5 that a problem that an AM pattern is damaged occurs when the Gearbox performs bit width conversion on information that carries the AM pattern, and it cannot be ensured that an AM pattern is evenly distributed on each lane. However, the slicing technology in the present disclosure can well ensure matching of bit widths and ensure that an AM pattern distributed on each lane is continuous and complete. For example, the slicing technology in the present disclosure ensures distribution of an AM on each lane, and a slicing and redelivery technology in the present disclosure is similar to bit width conversion, but is different from an existing Gearbox technology. The prior art cannot ensure that AMs are evenly distributed on FEC output lanes. The slicing and redelivery technology in the present disclosure can effectively ensure correctness of the AMs.

The foregoing prior art is that the common Gearbox resolves a mismatch between bit widths. However, because of a nonintegral multiple, the AMs cannot be evenly distributed in new bandwidth, and an alignment function of the AMs cannot be implemented, which affects an alignment and locking module and a reordering module at the receive end, that is, a peer end cannot recover data.

Figure 6:
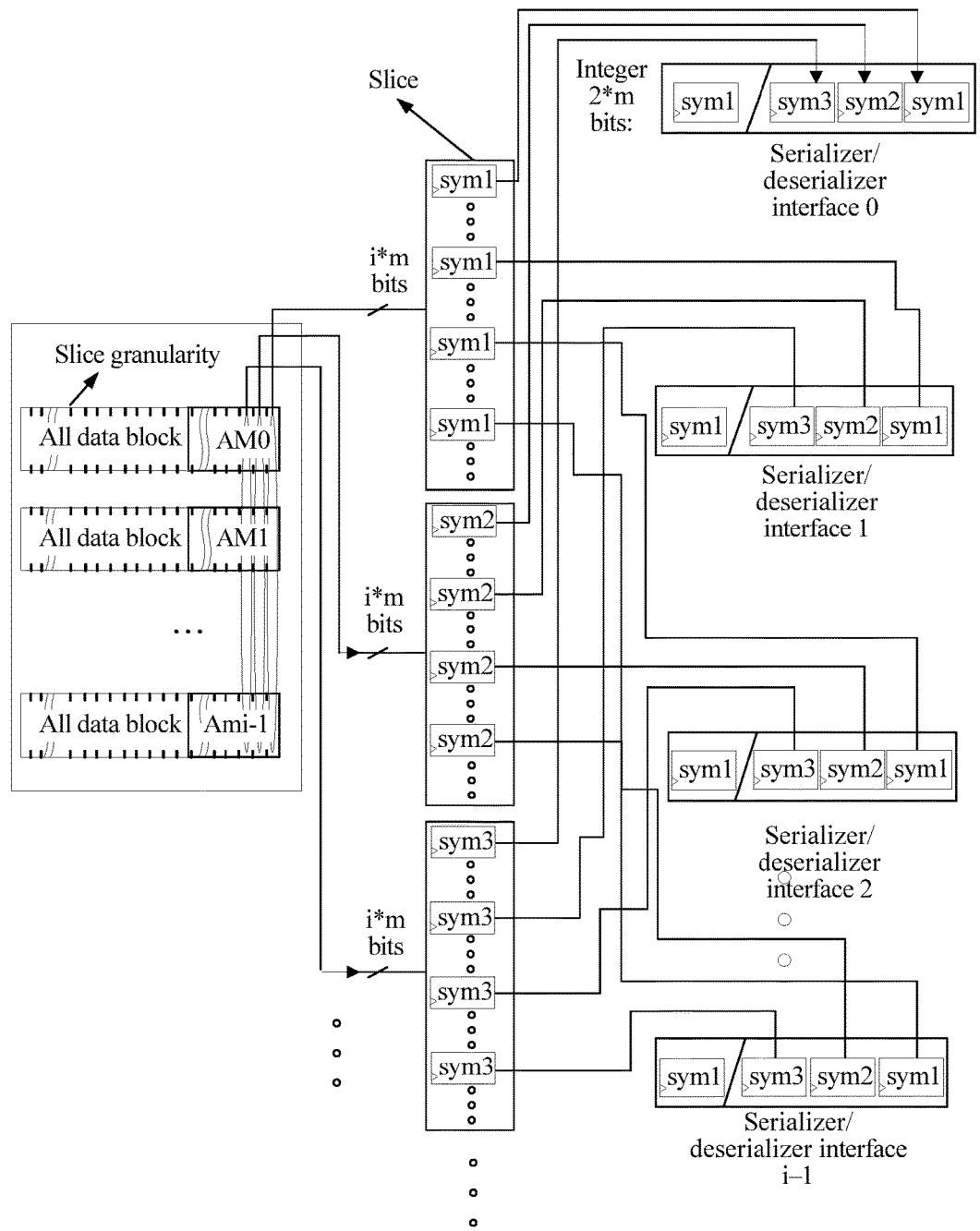
FIG. 6 is a schematic diagram of an implementation manner of delivering third data streams to multiple PMA lanes according to an embodiment of the present disclosure.

Referring to FIG. 6, FIG. 6 shows a schematic diagram of an implementation manner of delivering third data streams to multiple PMA lanes according to an embodiment of the present disclosure. According to the slicing technology in the present disclosure, the third data streams obtained after FEC encoding is performed and of which a total data bit width is F are first converted by the Gearbox to a format on a left side of the figure, that is, the third data streams are divided into a data format corresponding to i lanes. Bit widths of the third data streams are i*m*Integer 1. The data is sliced using the slicing technology in the present disclosure into data slices whose sizes are i×m×Integer S, and then the data slices are overlaid. Only three slices are shown in FIG. 6, and data in all the slices are respectively represented by sym 1, sym 2, and sym 3. There are m pieces of sym 1 in total in the first slice; likewise, there are m pieces of sym 2 in total in the second slice, and there are m pieces of sym 3 in total in the third slice. In conversion shown in FIG. 6, the slices are overlaid, and a bit width of output to the Serdes is S=i*m*Integer2. A pattern, on each lane, of the bit width of the Serdes that is mapped by overlaying the foregoing slices is a complete and continuous AM pattern. Both Integer 1 and Integer 2 are integral multiples of Integer S, and a quantity of slices is Integer 2/Integer S, where Integer 2 is a preset positive integer. The $n^{th}$ third data block is extracted from each slice, Integer 2/Integer S extracted $n^{th}$ third data blocks in total are overlaid and then delivered to the $n^{th}$ PMA lane, where a value of n is any value from 0 to i−1. In FIG. 6, the first sym 1, the first sym 2, and the first sym 3 are respectively extracted from the first slice, the second slice, and the third slice and delivered to an interface 0 of the Serdes; the second sym 1, the second sym 2, and the second sym 3 are respectively extracted from the first slice, the second slice, and the third slice and delivered to an interface 1 of the Serdes; . . . ; and the i−1$^{th}$ sym 1, the i−1$^{th}$ sym 2, and the i−1$^{th}$ sym 3 are respectively extracted from the first slice, the second slice, and the third slice and delivered to an interface i−1 of the Serdes.

Figure 7:
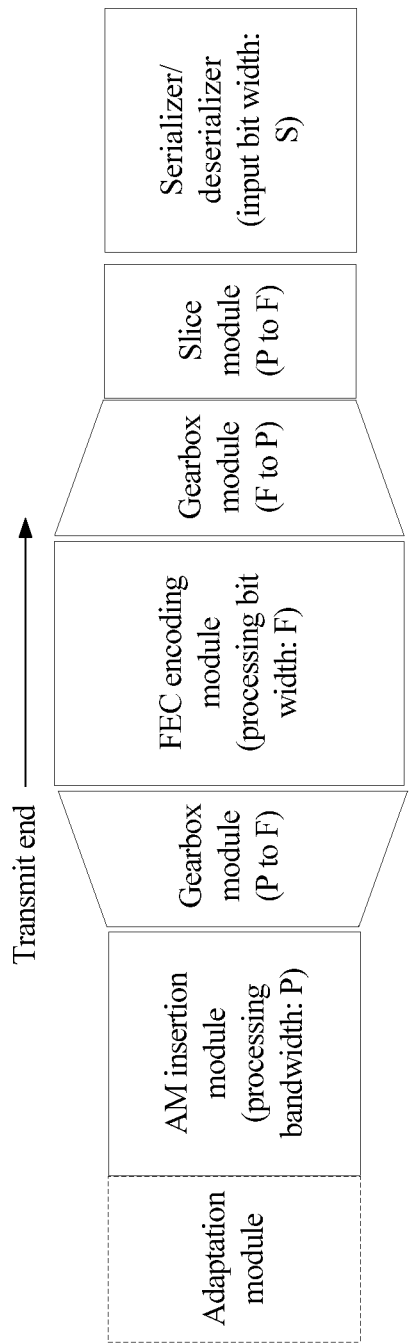
FIG. 7 is a schematic diagram of a manner of handling a mismatch between bit widths of modules at a PCS according to an embodiment of the present disclosure.

In this embodiment of the present disclosure, Adaptor+Gearbox+Slice are used for the bit width F (F is not equal to S) output by FEC encoding, an integral-period data processing format is used for FEC encoding processing (however, in the present disclosure, an FEC block is not forcibly required to use the integral-period data processing format, that is, the Gearbox and the Slice cooperate to match bandwidth, but FEC is not required to be processing of an integral period or a nonintegral period), and then the Gearbox is used to convert a bit width of the data to perform transmission in an output lane of the Serdes. Referring to FIG. 7, FIG. 7 shows a schematic diagram of a manner of handling a mismatch between bit widths of modules at a PCS according to an embodiment of the present disclosure.

The Gearbox+Slice in the present disclosure are mainly used to resolve a problem of a mismatch between bit widths. In addition, to ensure easy implementation, in a case in which the Gearbox+Slice exist, a bit width of an integral period should be selected as a bit width of an FEC (which is not forcibly required), so that the FEC does not need to perform frequency increasing and a bubble extrusion operation. In this implementation manner, a decoding bit width of 680 bits that can be divisible by an FEC codeword is used, and output decoded data is converted to an output data bit width of 640 bits (16 lanes, and 40 bits on each lane) using the Gearbox. In this way, the integral-period data processing format is used for processing by an FEC module (having codewords of 5440 bits in total), and there is no need to copy a resource of an internal processing module of the FEC. Then, the output bit width F of the FEC is converted to P using the Gearbox, and then the Slice module matches, by slicing, the data bit width to the output lane (the bit width of the Serdes S=640=i*d*m=16*4*10 or 5=480=i*d*m=16*3*10) to perform transmission. In this way, the problem of a mismatch between bit widths is resolved, there is no need to add an extra copy logic resource to FEC encoding logic, and a problem that a common Gearbox cannot ensure integrity and continuity of an AM pattern is resolved.

The Slice technology and the Gearbox can flexibly cooperate, and are not merely limited to the foregoing hierarchical relationship. Slice processing may also be performed before FEC, and is selected and adapted according to a specific architecture simplification requirement and particularly a bit width condition. In addition, for the Slice, the Gearbox, and frequency increasing, these innovative technologies are implemented by means of cooperation, have no forcible dependency, and may flexibly cooperate to simplify a design structure. The Slice+Gearbox are mainly used to match bit widths of various modules. Frequency increasing plus bubble extrusion logic is an effective solution used in a case of a nonintegral period caused by a bit width of the FEC.

It can be learned from the descriptions of the foregoing embodiment of the present disclosure that alignment markers AMs are inserted into a first data stream, where the first data stream is a data stream that is transcoded and scrambled after 64b/66b encoding is performed, and a transmission rate of the first data stream is greater than or equal to 100 G; the first data stream that includes the AMs is adaptively allocated to multiple physical coding sublayer PCS lanes to obtain second data streams; FEC encoding is performed on the second data streams on the multiple PCS lanes to obtain third data streams; and the third data streams are delivered to multiple physical medium attachment sublayer PMA lanes according to an input bit width of a Serdes, where a third data stream delivered to each PMA lane includes a complete and continuous AM. Because in the present disclosure, the third data streams are delivered to the multiple PMA lanes, and the AM on each PMA lane can remain continuous and complete, a data receive end can acquire complete and continuous AMs from the multiple PMA lanes, which may be applicable to a scenario in which a transmission rate of a data stream is extremely high, and avoid damage to the AMs.

Figure 8:
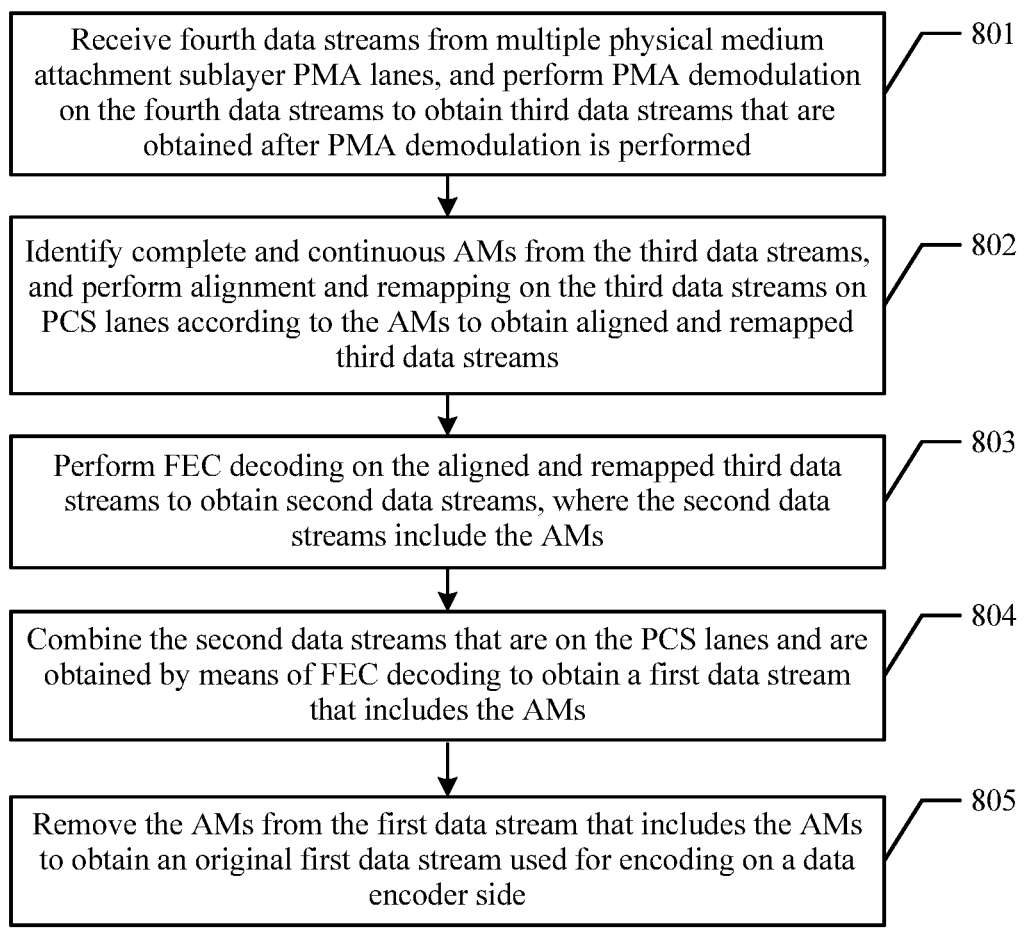
FIG. 8 is a schematic block diagram of a procedure of another data transmission method according to an embodiment of the present disclosure.

Referring to FIG. 8, FIG. 8 shows a data transmission method from a perspective of a data receive end provided in an embodiment of the present disclosure. The method may include the following steps.

801. Receive fourth data streams from multiple physical medium attachment sublayer PMA lanes, and perform PMA demodulation on the fourth data streams to obtain third data streams that are obtained after PMA demodulation is performed, where the multiple fourth data streams are in a one-to-one correspondence with the multiple PMA lanes, each fourth data stream includes at least one complete and continuous AM, and the at least one AM is an AM in multiple AMs.

In this embodiment of the present disclosure, after a data transmit end transmits the fourth data streams using the multiple PMA lanes, the data receive end may receive the fourth data streams from the multiple PMA lanes.

In some embodiments of the present disclosure, step 801 of performing PMA demodulation on the fourth data streams to obtain third data streams that are obtained after PMA demodulation is performed includes the following steps.

E1. Determine, according to bit widths of the fourth data streams, an input bit width of a serializer/deserializer Serdes, and a slice size, a quantity of slices that need to be combined, acquire, from each PMA lane, third data blocks that are at a same location in slices corresponding to the quantity of slices, respectively deliver the third data blocks to the PCS lanes, and combine third data blocks on each PCS lane to obtain combined third data streams.

Further, step E1 of determining, according to bit widths of the fourth data streams, an input bit width of a Serdes, and a slice size, a quantity of slices that need to be combined, acquiring, from each PMA lane, third data blocks that are at a same location in slices corresponding to the quantity of slices, respectively delivering the third data blocks to the PCS lanes, and combining third data blocks on each PCS lane to obtain combined third data streams includes a quantity of the PCS lanes is i, a data size of a single character borne on each PCS lane is m, and bit widths of the third data streams are i×m×Integer 1, where the Integer 1 is a preset positive integer; the input bit width of the Serdes is i×m× Integer 2, the slice size is i×m×Integer S, and therefore both the Integer 1 and the Integer 2 are integral multiples of the Integer S, and the quantity of slices is Integer 1/Integer S, where the Integer 2 is a preset positive integer; and a size of a third data block that is in each slice and is acquired from each PMA lane is i×m; acquiring Integer 1/Integer S n$^{th}$ third data blocks in total from the n$^{th}$ PMA lane, respectively delivering the Integer 1/Integer S n$^{th}$ third data blocks to the PCS lanes, and combining the third data blocks on each PCS lane to obtain the third data streams whose bit widths are i×m×Integer 1.

It should be noted that in this embodiment, herein is a process in which the data receive end receives the third data streams from the multiple PMA lanes, and this process is an inverse process of step 104, in the foregoing embodiment, in which the data transmit end delivers the third data streams to the multiple PMA lanes. For detailed descriptions, reference may be made to the descriptions of FIG. 5 in the foregoing embodiment.

802. Identify complete and continuous AMs from the third data streams, and perform alignment and remapping on the third data streams on physical coding sublayer PCS lanes according to the AMs to obtain aligned and remapped third data streams.

In this embodiment of the present disclosure, after obtaining the third data streams that are obtained after PMA demodulation is performed, the data receive end needs to perform alignment and remapping on the third data streams on the PCS lanes. It can be learned from the data transmission method executed by the data transmit end in the foregoing embodiment that the third data streams transmitted by the data transmit end on the multiple PMA lanes carry the complete and continuous AMs; therefore, the data receive end may identify the complete and continuous AMs from the third data streams. For performing alignment and remapping on the lanes using the AMs, reference may be made to the prior art, and details are not described herein again.

In some embodiments of the present disclosure, before step 803 of performing FEC decoding on the aligned and remapped third data streams, the data transmission method provided in the present disclosure further includes the following step, if a processing bit width of an AM removing circuit is different from a processing bit width of an FEC decoding circuit, performing bit width conversion on the aligned and remapped third data streams, where bit widths of the third data streams whose bit widths are converted are equal to the processing bit width of the FEC decoding circuit.

The processing bit width output by the AM removing circuit is represented by P, and the processing bit width of the FEC decoding circuit is represented by F. In a case in which P and F are not equal, bit width conversion needs to be further performed on the bit widths of the third data streams. To avoid damaging continuity and integrity of an AM pattern, the bit widths of the third data streams transmitted by the data transmit end have been converted to P, and to be able to adapt to a requirement of the FEC decoding circuit, the data receive end needs to convert the bit widths of the third data streams from P to F. After FEC decoding is completed, the bit widths of the third data streams need to be further converted to the original bit width P. Bit width conversion can be implemented using a gearbox module or a slicing module disposed at the data receive end. For example, in the present disclosure, whether to use the Gearbox and the Slice to perform matching is chosen according to a bit width matching condition of P and F. When P and F are not matched in the present disclosure, the Gearbox and the Slice need to be added to cooperate in converting data bit widths of the third data streams from P to F, so as to ensure integrity of the AMs.

803. Perform FEC decoding on the aligned and remapped third data streams to obtain second data streams, where the second data streams include the AMs.

In this embodiment of the present disclosure, FEC decoding performed on the third data streams is an inverse process of performing FEC encoding on the second data streams in the foregoing embodiment, and a specific implementation manner is reverse to that of FEC encoding.

In some embodiments of the present disclosure, before step 803 of performing FEC decoding on the aligned and remapped third data streams, the data transmission method provided in the present disclosure further includes the following step. Allocating two different clock cycles to two codeword segments that are processed in parallel in a same clock cycle to perform processing, and inserting idle data in the two different clock cycles, where the two different clock cycles each include one codeword segment of the two codeword segments that are originally concatenated in one clock cycle.

That is, in this embodiment of the present disclosure, if the processing bit width of the FEC decoding circuit is not an integral multiple of a bit width of a PCS lane, a case in which two different codeword segments are concatenated in a same clock cycle exists. It can be understood that one codeword may have multiple segments, and one segment in a codeword occupies one clock cycle. For a case in which one segment in a codeword does not fully occupy a clock cycle, the segment and a segment in another codeword need to fully occupy the clock cycle jointly. The respective segments in the two different codewords are concatenated in the same clock cycle; therefore, a problem of concatenation of codeword segments exists. For example, one clock cycle may refer to one period, a concatenated period is generated for segments in two different codewords, and a quantity of periods occupied by each codeword is no longer an integral quantity of periods. For an FEC decoding circuit, data of the two codewords needs to be processed in a same period when quantities of periods occupied by the two codewords are nonintegral quantities of periods. Because two parts of data of the different codeword segments in one period belong to different codewords, and the segments in the two different codewords need to be processed in parallel, logic processing resources of two different parts need to be used in the FEC decoding circuit; otherwise, processing congestion is caused.

For a relatively complex FEC algorithm, data bandwidth and a frequency that can be supported by a current technique and a next-generation technique and that relatively save resources may be a bit width of 640 bits and a clock frequency of 625 MHz. However, a size of a codeword of RS FEC (544, 514, 15, 10) is 5440 bits, 5440/640=8.5 periods, and because of a problem of a nonintegral quantity of periods, a problem is generated during FEC processing: for a nonintegral quantity of periods, redundant logic resources are added in an entire FEC decoding algorithm to adapt to a case in which two continuous codewords need to be processed in one period. For example, for an FEC decoding circuit of which a size of a codeword is 5440 bits, it is basically determined, according to the current technique, that a bit width of the Serdes is 640 bits. If this bit width is also used for decoding, 5440/640=8.5, in this case, a problem of half-period concatenation exists, and logic resources need to be separately added for data in the concatenated period at a cost of adding an extremely large quantity of logic resources. Logic resources need to be increased by about 50%. Another module is similar and is not described in detail.

In an implementation scenario in which a frequency increasing manner is used to perform decoding in a concatenated clock cycle in the present disclosure, step 803 of performing FEC decoding on the aligned and remapped third data streams to obtain second data streams includes performing FEC decoding on data, except the inserted idle data, in the aligned and remapped third data streams; and after performing FEC decoding on the third data streams, deleting the inserted idle data from the decoded third data streams to obtain the second data streams.

It should be noted that the idle data is inserted into the third data streams, but there is no need to perform FEC decoding on the idle data, that is, FEC decoding is performed only on the data, except the idle data, in the third data streams. After FEC decoding is performed on the third data streams, because the idle data is inserted into the third data streams before decoding, the inserted idle data needs to be deleted. In this case, the second data streams are obtained. A manner of deleting the idle data may also be described as bubble extrusion logic.

Further, in some embodiments of the present disclosure, the allocating two different clock cycles to two codeword segments that are processed in parallel in a same clock cycle to perform processing, and inserting idle data in the two different clock cycles includes inserting, between the two codeword segments that are processed in parallel in a same clock cycle, idle data that occupies one clock cycle, allocating the clock cycle in which the two codeword segments are originally concatenated to one codeword segment of the two codeword segments that are originally concatenated in one clock cycle and one part of the idle data in one clock cycle, and allocating a clock cycle next to the clock cycle in which the two codeword segments are originally concatenated to the other codeword segment of the two codeword segments that are originally concatenated in one clock cycle and the other part of the idle data in one clock cycle.

In some other embodiments of the present disclosure, the allocating two different clock cycles to two codeword segments that are processed in parallel in a same clock cycle to perform processing, and inserting idle data in the two different clock cycles includes inserting idle data after the former codeword segment in the two codeword segments that are processed in parallel in a same clock cycle, so that the clock cycle in which the two codeword segments are originally concatenated is filled, performing backward data shifting on the latter codeword segment in the two codeword segments that are processed in parallel in a same clock cycle, and inserting idle data after the last codeword segment in a codeword in which the latter codeword segment is located, so that a clock cycle to which the last codeword segment in the codeword in which the latter codeword segment is located belongs is filled.

It should be noted that an implementation process of the foregoing frequency increasing manner is similar to that of the frequency increasing manner described in FIG. 4A and FIG. 4B, and reference may be made to the descriptions in the foregoing embodiment.

In some embodiments of the present disclosure, step 803 of performing FEC decoding on the aligned and remapped third data streams to obtain second data streams includes the following steps. Acquiring two codeword segments that are in the third data streams and are processed in parallel in a same clock cycle, where the two codeword segments include a first codeword segment and a second codeword segment, and a data volume of the first codeword segment is greater than or equal to that of the second codeword segment; and performing FEC decoding on the first codeword segment using a first FEC decoding circuit, and performing FEC decoding on the second codeword segment using a second FEC decoding circuit, where the second data streams are generated after the first codeword segment and the second codeword segment are respectively processed by the first FEC decoding circuit and the second FEC decoding circuit, and the second FEC decoding circuit and the first FEC decoding circuit use completely different configurable logic decoding circuits, or the second FEC decoding circuit is an FEC decoding circuit obtained after a resource configuration operation is performed on a configurable logic decoding circuit, except a configurable logic decoding circuit that processes the first codeword segment, in the first FEC decoding circuit.

In this embodiment of the present disclosure, in a case in which only one codeword segment in the third data streams exists in one clock cycle, FEC decoding may be performed using the first FEC decoding circuit. However, if a processing bit width of the first FEC decoding circuit cannot be divisible by a bit width of an entire codeword, a case in which two different codeword segments are concatenated in a same clock cycle exists. It can be understood that one codeword may have multiple segments, and one segment in a codeword may occupy one clock cycle. For a case in which one segment in a codeword does not fully occupy a clock cycle, the segment and a codeword segment in another codeword need to fully occupy the clock cycle jointly. The respective segments in the two different codewords are concatenated in the same clock cycle; therefore, a problem of concatenation of codeword segments exists. In the two codeword segments that are processed in parallel in a same clock cycle, the first codeword segment is one codeword segment, in the two codeword segments that are processed in parallel in a same clock cycle, having a larger data volume or an equal data volume, and the second codeword segment is the other codeword segment, in the two codeword segments that are processed in parallel in a same clock cycle, having a smaller data volume or an equal data volume.

As shown in FIG. 4C and FIG. 4D, FIG. 4C and FIG. 4D are schematic diagrams of another manner of processing concatenation of two codeword segments according to an embodiment of the present disclosure. When only one codeword segment exists in a same clock cycle, the codeword segment is from a same codeword, and decoding is performed on the codeword segment using the first FEC decoding circuit; while when two codeword segments exist in a same clock cycle, that is, when two codeword segments C1 and C2 are concatenated, the two codeword segments that exist in the same clock cycle belong to different codewords. For example, the first codeword segment C1 belongs to a first codeword 1, which is the former codeword, and the second codeword segment C2 belongs to a second codeword 2, which is the latter codeword. For example, in FIG. 4C, in the clock cycle in which the codewords are concatenated, if C1<C2, a data volume of C1 is less than a data volume of C2. A concatenated period of one clock cycle is used as an example. C2 in the concatenated period is put in the first FEC decoding circuit to undergo FEC decoding, and C1 in the concatenated period is put in the second FEC decoding circuit to undergo FEC decoding. In FIG. 4D, if C1≥C2 in the concatenated period, C1 in the concatenated period is put in the first FEC decoding circuit to undergo FEC decoding, and C2 in the concatenated period is put in the second FEC decoding circuit to undergo FEC decoding. In FIG. 4C and FIG. 4D, the second FEC decoding circuit is only configured to process a codeword segment, in two codeword segments that exist in a same clock cycle, having a smaller data volume or an equal data volume; the first FEC decoding circuit is configured to process a codeword segment, in the two codeword segments that exist in a same clock cycle, having a larger data volume or an equal data volume, and the first FEC decoding circuit is further configured to process a unique codeword segment that exists in one clock cycle.

An implementation manner of the first FEC decoding circuit and the second FEC decoding circuit is as follows. The second FEC decoding circuit is an FEC decoding circuit independent of the first FEC decoding circuit, or the second FEC decoding circuit is an FEC decoding circuit obtained after operations of parameter configuration, register setting, and data gating are performed on a configurable logic decoding circuit, except a configurable logic decoding circuit that performs FEC decoding on a codeword segment that has a larger data volume or an equal data volume, in the first FEC decoding circuit. That is, the second FEC decoding circuit may be obtained after a resource configuration operation is performed on a part of configurable logic decoding circuits in the first FEC decoding circuit, or the second FEC decoding circuit may be independent of the first FEC decoding circuit and obtained by directly adding a logic resource. The resource configuration operation in this embodiment of the present disclosure may include operations such as parameter configuration, register setting, and data gating. In addition, another operation may be added to the resource configuration operation according to a specific application scenario to implement resource configuration for a configurable logic decoding circuit.

It should be noted that in this embodiment of the present disclosure, for the two codeword segments that are processed in parallel in a same clock cycle, when data volumes of the two codeword segments are equal, configurable logic decoding circuits of the second FEC decoding circuit need to reach a maximum value. In this case, the second FEC decoding circuit may be 50% of configurable logic decoding circuits of the first FEC decoding circuit. As a difference between the data volumes of the two codeword segments that are processed in parallel in a same clock cycle increases, the configurable logic decoding circuits required by the second FEC decoding circuit decrease. For example, the configurable logic decoding circuits required by the second FEC decoding circuit are determined according to a codeword ratio of the two codeword segments in a nonintegral period, and the configurable logic decoding circuits of the second FEC decoding circuit are a value of configurable logic decoding circuits that can process a smaller codeword segment in the nonintegral concatenated period.

It can be learned from the foregoing descriptions that the second FEC decoding circuit may be implemented by independently adding a logic circuit, or may be obtained from circuits of the first FEC decoding circuit by changing a parameter. The second FEC decoding circuit handles a nonintegral period during FEC decoding. A problem that exists in the nonintegral period and that two codeword segments need to be processed in one period may be handled by adding processing logic in the nonintegral period. In this embodiment of the present disclosure, it is equivalent to adding a second FEC decoding circuit outside the first FEC decoding circuit as the configurable logic decoding circuit. This embodiment of the present disclosure further supports another method for configuring a parameter in the first FEC decoding circuit to directly configure, in a concatenated period, an idle configurable logic decoding circuit in the first FEC decoding circuit as the second FEC decoding circuit to handle the problem of the nonintegral period.

If the manner of independently adding the second FEC decoding circuit is used, a maximum of half of original processing logic may be added in the present disclosure. The following describes, using an example, a problem of processing two codeword segments in one period when there are a nonintegral quantity of periods. For an FEC of which a size of a codeword is 5440 bits, it is basically determined, according to a technique of a current ASIC, that a bit width of a Serdes is 640 bits. If this bit width is also used for FEC decoding, 5440/640=8.5, a problem of half-period concatenation exists, and the second FEC decoding circuit needs to be added for data in the concatenated period. A decoding bit width of 640 bits is used as a reference; a configurable logic decoding circuit of the second FEC decoding circuit that needs to be added is half of the configurable logic decoding circuits of the first FEC decoding circuit. For another example, if an FEC algorithm of RS FEC (544, 514, 15, 10) is implemented using an FPGA processing technique, a bit width of the Serdes is 1280 bits. If the first FEC decoding circuit uses this bit width, 5440/1280=4.25, and in this way, a problem of nonintegral period concatenation also arises. If the second FEC decoding circuit is obtained using a method, in the present disclosure, of independently adding a configurable logic decoding circuit, a decoding bit width of 1280 bits is used as a reference, and a configurable logic decoding circuit that is required by the second FEC decoding circuit and needs to be added is a quarter of the first FEC decoding circuit.

If the second FEC decoding circuit is obtained from the configurable logic decoding circuits of the first FEC decoding circuit, and if there are two codeword segments in one clock cycle, the register needs to be set in different periods. A specific setting rule is, when codeword segments in two continuous periods are from different codewords, a setting operation needs to be performed on the register. A second FEC decoding circuit may be obtained in a nonintegral period by means of operations of parameter configuration, register setting, and data gating. A main logic part of the second FEC decoding circuit is still from the configurable logic decoding circuits of the first FEC decoding circuit; therefore, there is also no need to add an extra configurable logic decoding circuit. If the second FEC decoding circuit is obtained by configuring a parameter in the first FEC decoding circuit, a resource volume that needs to be increased does not exceed 10% of the configurable logic decoding circuits required by the first FEC decoding circuit.

It should be noted that in the foregoing examples of the present disclosure, concatenation of codeword segments C1 and C2 in one clock cycle is used as an example in both FIG. 4C and FIG. 4D. When the two codeword segments are concatenated in one clock cycle, the second FEC decoding circuit may be independently configured from the idle configurable logic decoding circuit in the first FEC decoding circuit according to a ratio of a data volume of C1 to a data volume of C2, or the second FEC decoding circuit may be independently added outside the first FEC decoding circuit according to a ratio of a data volume of C1 to a data volume of C2, which is not limited in the present disclosure. However, when two codewords C2 and C3 are concatenated in another clock cycle, specific implementation of the second FEC decoding circuit may still be determined according to a ratio of a data volume of C2 to a data volume of C3. In addition, when two codewords C3 and C4 are concatenated in another clock cycle, specific implementation of the second FEC decoding circuit may still be determined according to a ratio of a data volume of C3 to a data volume of C4. It should be noted that for obtaining the second FEC decoding circuit in a manner of adding a configurable logic decoding circuit, the configurable logic decoding circuit that needs to be added needs to be a largest value in three codeword segments that have a smallest data volume in three concatenated periods (C1:C2, C2:C3, and C3:C4), so as to determine the second FEC decoding circuit.

It should be noted that FIG. 4E, FIG. 4F, FIG. 4G, and FIG. 4H in the foregoing embodiment describe the first FEC decoding circuit and the second FEC decoding circuit using examples. An implementation manner of the first FEC decoding circuit and the second FEC decoding circuit in this embodiment is similar to the legend of the foregoing FEC decoding circuits. A difference is that a configurable logic decoding circuit implements FEC decoding, which is different from that the foregoing configurable logic decoding circuit implements FEC decoding.

804. Combine the second data streams that are on the PCS lanes and are obtained by means of FEC decoding to obtain a first data stream that includes the AMs.

In this embodiment of the present disclosure, the data receive end performs FEC decoding on the third data streams on the PCS lanes to obtain the second data streams, combines the second data streams on the PCS lanes to obtain the first data stream that includes the AMs. A process in which the data receive end combines the second data streams on the PCS lanes and step 102 of adaptively allocating the first data stream to multiple PCS lanes to obtain second data streams in the foregoing embodiment are two inverse processes.

In some embodiments of the present disclosure, step 804 of combining the second data streams that are on the PCS lanes and obtained after decoding to obtain a first data stream that includes the AMs may include the following step. Extracting an all data parallel processing block according to an all data parallel processing granularity, extracting an AM parallel processing block according to an AM parallel processing granularity, and combining the all data parallel processing block and the AM parallel processing block to obtain the first data stream that includes the AMs.

Before the AMs are inserted into the first data stream, a data block included in the first data stream may be all data. After the AMs are inserted, the first data stream is a data stream that is formed by commingling the all data and the AMs. When the first data stream that includes the AMs is adaptively allocated to the multiple PCS lanes, for a situation in which the data block of the all data and an AM block in the first data stream have different sizes, to evenly distribute the AMs to the PCS lanes in this embodiment of the present disclosure, the first data stream that includes the AMs may be adaptively allocated using two different granularities. For the all data in the first data stream, the all data parallel processing block may be adaptively allocated to the multiple PCS lanes according to the all data parallel processing granularity; for the AMs in the first data stream, the AM parallel processing block is adaptively allocated to the multiple PCS lanes according to the AM parallel processing granularity. Because the AMs are separately delivered, it can be ensured that the AMs are evenly distributed on the multiple PCS lanes. It can be understood that if the all data parallel processing granularity is equal to the AM parallel processing granularity, the first data stream that includes the AMs may be adaptively allocated to the multiple PCS lanes according to a same granularity. The data receive end should use, when combining the second data streams, a manner inverse to the manner used by the data transmit end, and combine the second data streams according to the all data parallel processing granularity and the AM parallel processing granularity, so as to obtain the first data stream that includes the AMs.

805. Remove the AMs from the first data stream that includes the AMs to obtain an original first data stream used for encoding on a data encoder side.

After alignment and remapping of the lanes are completed using the AMs, an alignment function of the AMs is completed. The data receive end needs to remove the AMs inserted by the data encoder side into the first data stream, so as to restore the original first data stream used for encoding on the data encoder side. The original first data stream is a data stream that is obtained by transcoding and scrambling after the data transmit end performs 64b/66b encoding. A transmission rate of the first data stream is greater than or equal to 100 G, for example, the first data stream uses a transmission rate of 400 G or higher.

It should be noted that in some embodiments of the present disclosure, before step 805 of removing the AMs from the first data stream that includes the AMs, the data transmission method provided in the present disclosure may further include the following step. If a processing bit width of an AM removing circuit is different from a processing bit width of an FEC decoding circuit, performing bit width conversion on the first data stream that includes the AMs, where a bit width of the converted first data stream is equal to the bit width of the AM removing circuit.

The processing bit width output by the AM removing circuit is represented by P, and the processing bit width of the FEC decoding circuit is represented by F. In a case in which P and F are not equal, bit width conversion needs to be further performed on a bit width of the first data stream. To adapt to a requirement of the FEC decoding circuit, because the bit width of the first data stream on which FEC decoding processing is performed is F, the bit width needs to be converted from F to P, so that the AM removing circuit can remove the AMs included in the first data stream. Bit width conversion can be implemented using a gearbox module or a slicing module disposed at the data transmit end.

It can be learned from the descriptions of the foregoing embodiment of the present disclosure that fourth data streams are received from multiple physical medium attachment sublayer PMA lanes, and PMA demodulation is performed on the fourth data streams to obtain third data streams that are obtained after PMA demodulation is performed; complete and continuous AMs are identified from the third data streams, and alignment and remapping are performed on the third data streams on PCS lanes according to the AMs to obtain aligned and remapped third data streams; FEC decoding is performed on the aligned and remapped third data streams to obtain second data streams, where the second data streams include the AMs; the second data streams that are on the PCS lanes and are obtained by means of FEC decoding are combined to obtain a first data stream that includes the AMs; and the AMs are removed from the first data stream that includes the AMs to obtain an original first data stream used for encoding on a data encoder side. Because in the present disclosure, the third data streams are delivered to the multiple PMA lanes, and an AM on each PMA lane can remain continuous and complete, a data receive end can acquire complete and continuous AMs from the multiple PMA lanes, which may be applicable to a scenario in which a transmission rate of a data stream is quite high, and avoid a damage to the AMs.

For better understanding and implementation of the foregoing solutions in the embodiments of the present disclosure, specific descriptions are provided below using corresponding application scenarios as an example.

Figure 9:
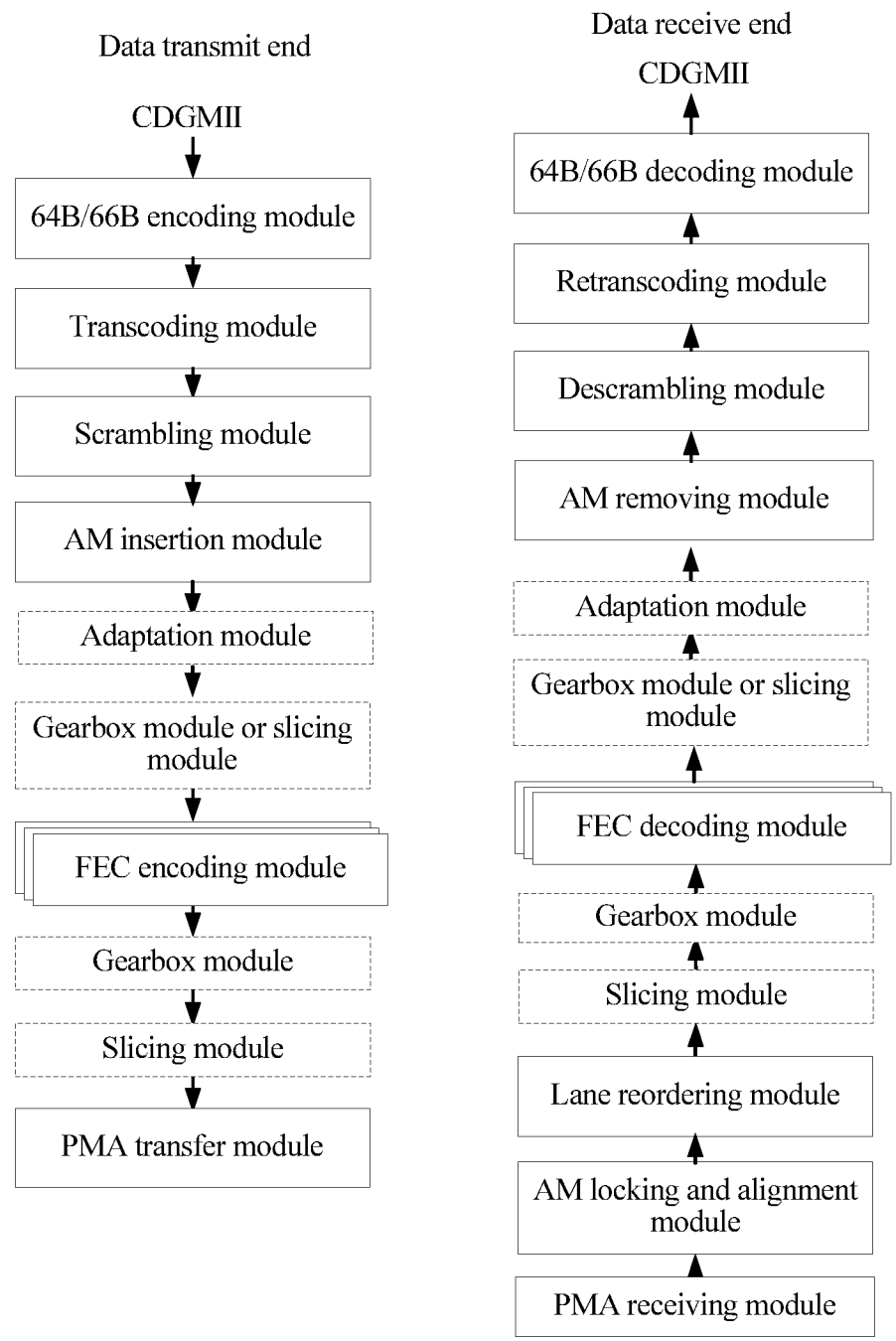
FIG. 9 is a schematic architecture diagram of a data transmit end and a data receive end according to an embodiment of the present disclosure.

Referring to FIG. 9, FIG. 9 is a schematic architecture diagram of a data transmit end and a data receive end according to an embodiment of the present disclosure. FIG. 9 is a schematic diagram of an overall architecture of the entire data transmit end and the entire data receive end. The overall architecture mainly describes a PHY layer (which is mainly a PCS layer and a PMA layer) of the Ethernet. The left side is a diagram of main modules of the data transmit end, and the right side is a diagram of main modules of the data receive end.

Data of a data transmit end in the architecture in the present disclosure is in a data format of a MAC layer in the Ethernet, and the data format is converted to a corresponding CDGMII format after the data is transmitted to a CDGMII interface. A specific data format of the CDGMII interface is described as follows. A data bit width of the CDGMII interface is (20*(64+8)), and the format of the CDGMII interface is twenty pieces of 64 Bit data information plus a 8-bit control information indicator, where the 8-bit control information indicator indicates whether 8-byte data of 64 bits represents data or control information. Data in the foregoing CDGMII data format is transmitted to a 64b/66b encoding module to perform encoding.

A specific 64b/66b encoding format is a universal encoding method in a current standard.

The data is transcoded after being encoded by the 64b/66b encoding module, and there are the following transcoding manners for a specific format of a transcoding module: 256b/257b, 512b/513b, 256b/258b, 512b/514b, and the like. The present disclosure imposes no limitation on a specific transcoding manner.

The transcoded data is scrambled by a scrambling module, and global or partial scrambling may be performed according to a specific granularity. Unified global scrambling, or scrambling corresponding to an FEC granularity, or scrambling using a lane as a granularity may be used. In addition, an initial value of a scrambler may be dynamically configured to ensure performance of an entire system.

AM insertion is performed by an AM insertion module after the scrambling, and an AM insertion format is a transcoded format. Because the data receive end needs to perform alignment and reordering operations according to the AMs, a scrambling operation is not performed on the AMs.

After the alignment markers AMs are inserted, an FEC encoding module performs FEC encoding. The FEC encoding module uses an end to end error correction encoding and decoding form. The architecture in the present disclosure supports an encoding form of one or more FECs. A processing bit width of the entire FEC in the foregoing figure is represented by F. If there are multiple sub-FECs (Integer_f sub-FECs), a processing bit width of each sub-FEC is defined as f; if there is only one FEC, a bit width of the FEC is F. In the solution of the present disclosure, the FEC may choose frequency increasing and bubble extrusion logic according to a bit width matching condition to perform a bit width matching operation according to simplified logic.

For the encoded data, a Gearbox module and a Slice module may be chosen according to the bit width matching condition to convert the data to an output bit width of a Serdes and ensure that an AM pattern on each FEC lane is complete and continuous, and finally, a PMA transfer module at the data transmit end transmits the data.

In the present disclosure, operations performed by the data receive end are inverse to the operations performed by the data transmit end. First, a PMA receiving module performs PMA layer demodulation on received data, and then the demodulated data is transmitted to the PCS layer. An AM locking and alignment module first performs operations of AM lock and Deskew, identifies all lanes, and performs an alignment operation. A lane reordering module performs a lane Reorder operation on the aligned data, an FEC decoding module performs decoding, an AM removing module performs AM removing, a descrambling module performs descrambling, a retranscoding module performs retranscoding, and a 64b/66b decoding module performs decoding. Main modules such as a CDGMII interface format conversion module restore the data format of the MAC layer in the Ethernet. Likewise, according to a bit width matching condition, the Slice and the Gearbox are inserted for adaptation of the modules at various layers.

FIG. 9 shows a design of an overall PCS (PMA) architecture, which is a current implementation architecture in the present disclosure. A main focus of the present disclosure is a design of a PCS layer. The receive end, that is, three modules in FIG. 9: the AM removing module, the FEC decoding module, and the PMA receiving module, is used as an example. Processing bit width of the AM removing module is represented by P, a processing bit width of the FEC decoding circuit is represented by F, a total processing bit width of the Serdes is represented by S, a quantity of output lanes of the FEC is represented by i, a quantity of symbols transmitted in parallel on each lane is represented by d, a size of a symbol is represented by m, and a size of an FEC codeword is represented by n. The data transmit end is used as an example. An executed data transmission process may be that shown in FIG. 7. Similarly, a data transmission process at the data receive end may be inverse to the process in FIG. 7. For details, refer to the descriptions in the foregoing embodiment. In this embodiment of the present disclosure, Adaptor+Gearbox+Slice are used for the bit width F (F is not equal to S) output by FEC encoding, an integral-period data processing format is used for FEC encoding processing (however, in the present disclosure, an FEC block is not forcibly required to use the integral-period data processing format, that is, the Gearbox and the Slice cooperate to match bandwidth, but FEC is not required to be processing of an integral period or a nonintegral period), and then the Gearbox is used to convert a bit width of the data to perform transmission in an output lane of the Serdes. Referring to FIG. 7, FIG. 7 shows a schematic diagram of a manner of handling a mismatch between bit widths of modules at a PCS according to an embodiment of the present disclosure.

Bit widths of the various modules at the PCS are used as an example for description, and the following describes in detail how to ensure continuity and integrity of an AM pattern when the bit widths are inconsistent.

Embodiment 1 of the present disclosure includes the following,

That RS FEC (544, 514, 30, 10) is selected as an FEC algorithm is used as an example. If the following parameters, P=640, F=680, and S=480, are selected as processing bit widths of an entire PCS, whole bit width processing in the present disclosure is shown in FIG. 7.

First, an Adaptor needs to deliver data, particularly an AM pattern, to 16 lanes using two delivery granularities. As shown in FIG. 2A and FIG. 2B, a granularity of 64 bits is used for delivery in a method for processing an all data frame in the present disclosure, and the data needs to be delivered according to a data encoding granularity or a data transcoding granularity (which is 64 bits in this embodiment) in a Round Robin polling delivery manner.

For an AM part in the data stream, the Adaptor directly delivers the AM part according to a granularity of an AM, and the delivery is also performed in the Round Robin polling delivery manner. The AM needs to be delivered to each lane according to a size, which is a granularity 120 bits, of the AM on each lane.

In some embodiments of the present disclosure, delivering a first data stream that includes AMs to multiple physical coding sublayer PCS lanes is used as an example and includes the first data stream includes an all data parallel processing block and an AM parallel processing block; adaptively allocating the all data parallel processing block to the multiple PCS lanes according to an all data parallel processing granularity, and adaptively allocating the AM parallel processing block to the multiple PCS lanes according to an AM parallel processing granularity.

Before the AMs are inserted into the first data stream, a data block included in the first data stream may be all data. After the AMs are inserted, the first data stream is a data stream that is formed by commingling the all data and the AMs. When the first data stream that includes the AMs is adaptively allocated to the multiple PCS lanes, for a situation in which the data block of the all data and an AM block in the first data stream have different sizes, to evenly distribute the AMs to the PCS lanes in this embodiment of the present disclosure, the first data stream that includes the AMs may be adaptively allocated using two different granularities. For the all data in the first data stream, the all data parallel processing block may be adaptively allocated to the multiple PCS lanes according to the all data parallel processing granularity; for the AMs in the first data stream, the AM parallel processing block is adaptively allocated to the multiple PCS lanes according to the AM parallel processing granularity. Because the AMs are separately delivered, it can be ensured that the AMs are evenly distributed on the multiple PCS lanes. It can be understood that if the all data parallel processing granularity is equal to the AM parallel processing granularity, the first data stream that includes the AMs may be adaptively allocated to the multiple PCS lanes according to a same granularity.

As shown in FIG. 2A, FIG. 2A is a schematic diagram of an implementation manner of adaptively allocating a first data stream to multiple PCS lanes according to an embodiment of the present disclosure. As shown in FIG. 2B, FIG. 2B is a schematic diagram of another implementation manner of adaptively allocating a first data stream to multiple PCS lanes according to an embodiment of the present disclosure. Adaptively allocating the first data stream to the multiple PCS lanes may be implemented using an adaptation module at the data transmit end. A function of the adaptation module is to evenly deliver the AMs to respective PCS lanes. The adaptation module performs processing according to a processing mode of a parallel processing block, where the parallel processing block may be classified into two types of parallel processing blocks according to content of the first data stream: an all data parallel processing block and an AM parallel processing block. In the present disclosure, two granularities are used to respectively perform delivery processing on the AMs and the all data, which is different from a delivery structure in which delivery can be performed only according to a unified granularity in the prior art. However, when the parallel processing blocks of the AMs and the all data are the same, the two granularities in the present disclosure may also refer to a same granularity. As shown in FIG. 2A, a method for processing the all data parallel processing block in the present disclosure needs to be performed in a polling delivery manner in which round robin scheduling is performed according to a symbol on the PCS lanes or an integral multiple of the symbol, and the all data parallel processing block is separately delivered to the PCS lane 0, the PCS lane 1, the PCS lane 2, . . . , and the PCS lane i−1. As shown in FIG. 2B, in a method for processing the AM parallel processing block in the first data stream, the AMs are directly delivered to the PCS lanes according to the AM parallel processing granularity. The delivery is also performed in the Round Robin polling delivery manner, and the AM parallel processing block is separately delivered to the PCS lane 0, the PCS lane 1, the PCS lane 2, . . . , and the PCS lane i−1. Sizes of the AMs on the lanes are used as delivery granularities to deliver the AMs to the lanes.

After the delivery by the Adaptor, in the present disclosure, whether to use a Gearbox to perform matching is chosen according to a bit width matching condition. When P and F are not matched in the present disclosure, the Gearbox needs to be added to convert a data bit width from P to F, so as to ensure that FEC internal processing is easy.

Figure 10:
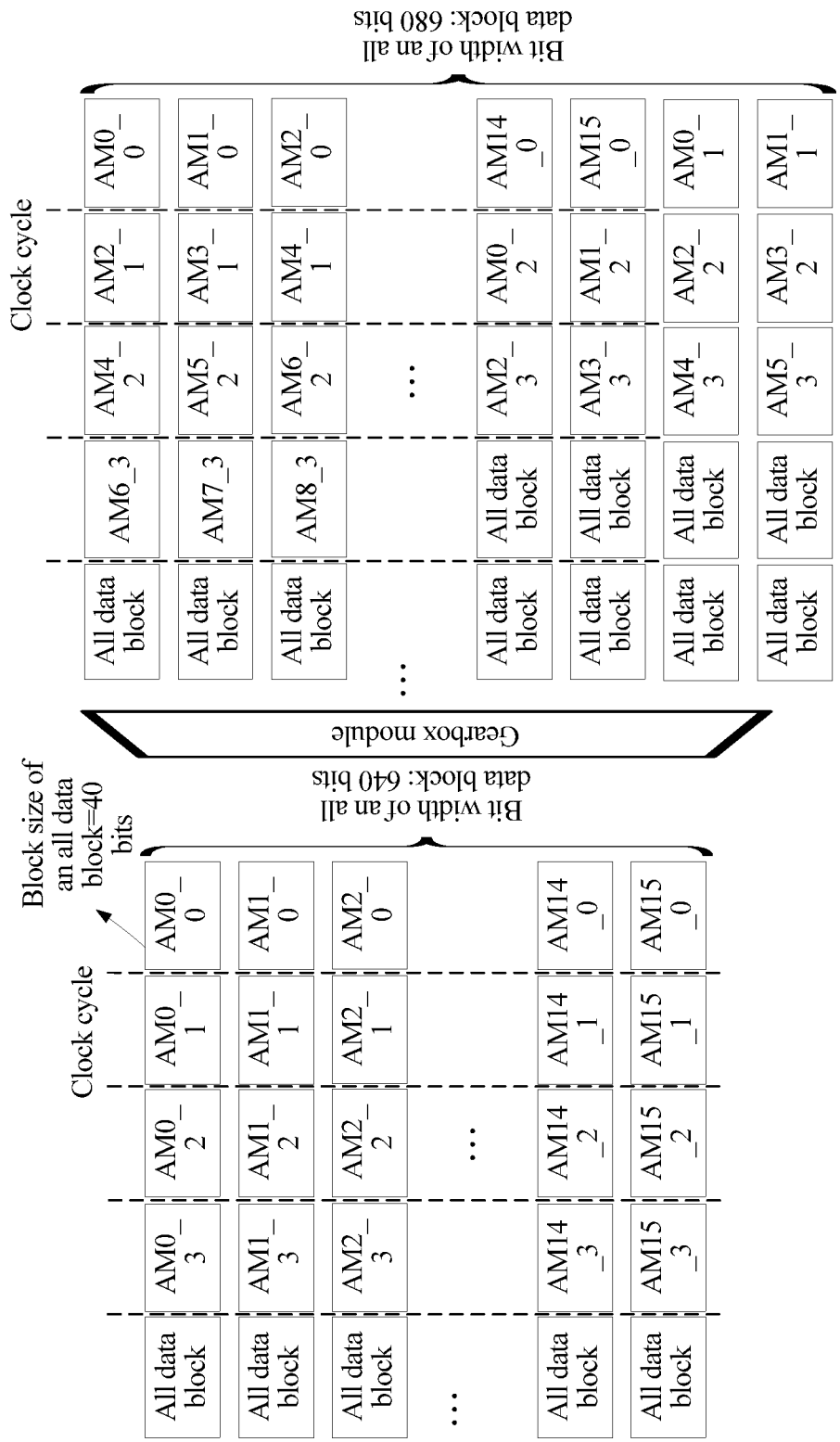
FIG. 10 is a schematic diagram of conversion performed by a gearbox module from 640 bits to 680 bits according to an embodiment of the present disclosure.

Then, the Gearbox needs to convert the data from 640 bits to 680 bits to perform FEC processing. The Gearbox is a common Gearbox. Referring to FIG. 10, FIG. 10 is a schematic diagram of conversion performed by a gearbox module from 640 bits to 680 bits according to an embodiment of the present disclosure. Before conversion performed by the gearbox module, there are 16 AMs in one clock cycle, which are respectively an AM 0_0, . . . , and an AM 0_15. After conversion, there are 18 AMs in one clock cycle, which are respectively an AM 0_0, . . . , an AM 0_15, an AM 1_0, and an AM 1_1. In addition, before conversion, codewords in one clock cycle are the same, and after conversion, a case in which an AM and all data are concatenated occurs.

FEC processing is performed on the data on which bit width conversion is performed. Data of one codeword has an integral quantity of periods: 544/68=8 periods. A bit width of output encoded data is 680 bits, and the data is converted by the Gearbox to data of 640 bits to be output (the conversion performed by the Gearbox is inverse to the conversion performed by the gearbox module in FIG. 10). Then, slicing processing needs to be performed by a Slice. The slicing module shown in FIG. 6 slices the data according to 160 bits, data blocks that are of three slices and are delivered to lanes are overlaid, and then Serdes data whose bit width is 480 bits is output. Integrity and continuity of output AM patterns on 16 lanes are not damaged.

Embodiment 2 of the present disclosure includes the following.

That RS FEC (544, 514, 30, 10) is selected as an FEC algorithm is used as an example. If the following parameters, P=640, F=640, and S=640, are selected as processing bit widths of an entire PCS, whole bit width processing in the present disclosure is shown in FIG. 7.

First, an Adaptor needs to deliver data, particularly an AM pattern, to 16 lanes using two delivery granularities. As shown in FIG. 2A and FIG. 2B, a granularity of 256/257 bits is used for delivery in a method for processing an all data frame in the present disclosure, and the data needs to be delivered according to a data encoding granularity or a data transcoding granularity (which is 256/257 bits in this embodiment) in a Round Robin polling delivery manner. For an AM part in a hybrid frame, the Adaptor directly delivers the AM part according to a granularity of an AM, and the delivery is also performed in the Round Robin polling delivery manner. The AM needs to be delivered to each lane according to a size, which is a granularity 320 bits, of the AM on each lane.

After the delivery by the Adaptor, in the present disclosure, whether to use a Gearbox to perform matching is chosen according to a bit width matching condition. When P and F are not matched in the present disclosure, the Gearbox needs to be added to convert a data bit width from P to F, so as to ensure that FEC internal processing is easy.

In an FEC algorithm of RS FEC (544, 514, 15, 10), a bit width of output to 16 lanes is 640 bits. Because 544*10/640=8.5, which is a nonintegral quantity of periods, a problem, described in FIG. 4A and FIG. 4b, that data of two codewords are in a same period exists. A solution in the present disclosure is as follows.

For a decoding bit width of 640 bits, a frequency increasing method is used to forcibly allocate two periods to the two parts of data. In this way, data that is processed in parallel in each period does not include data of two codewords, and there is no need to copy extra logic. Alternatively, as shown in FIG. 4B, a second frequency increasing concatenation method is used. According to the foregoing solution in the present disclosure, an entire data rate is enlarged, and bubble extrusion logic needs to be added subsequently, where the bubble extrusion logic is a process inverse to the foregoing frequency increasing logic. For the decoding bit width of 640 bits, two periods are forcibly allocated to the two parts of data in the concatenated period using a frequency increasing method. In this way, a problem of a nonintegral period can be handled without adding a resource (in the first manner of this embodiment, an approximately 6% frequency increase from 625 MHz to 661 MHz is required). However, in this case, the entire data rate is enlarged, and corresponding bubble extrusion logic needs to be added subsequently. The filled IDLE is extruded, and a data format that matches a rate of an output bit width is formed. After FEC processing is completed, a parallel bit width of output to the Serdes is 640 bits. In this embodiment, because the output bit width of FEC is equal to the output bit width of the Serdes, an operation performed by the Slice is not required.

Embodiment 3 of the present disclosure includes the following.

That RS FEC (544, 514, 30, 10) is selected as an FEC algorithm is used as an example. If the following parameters, P=640, F=680, and S=640, are selected as processing bit widths of an entire PCS, whole bit width processing in the present disclosure is shown in FIG. 7.

First, an Adaptor needs to deliver data, particularly an AM pattern, to 16 lanes using two delivery granularities. As shown in FIG. 2A and FIG. 2B, a granularity of 64 bits is used for delivery in a method for processing an all data frame in the present disclosure, and the data needs to be delivered according to a data encoding granularity or a data transcoding granularity (which is 64 bits in this embodiment) in a Round Robin polling delivery manner. For an AM part in a hybrid frame, the Adaptor directly delivers the AM part according to a granularity of an AM, and the delivery is also performed in the Round Robin polling delivery manner. The AM needs to be delivered to each lane according to a size, which is a granularity 120 bits, of the AM on each lane.

After the delivery by the Adaptor, in the present disclosure, whether to use a Gearbox to perform matching is chosen according to a bit width matching condition. When P and F are not matched in the present disclosure, the Gearbox needs to be added to convert a data bit width from P to F, so as to ensure that FEC internal processing is easy.

Then, the Gearbox needs to convert the data from 640 bits to 680 bits to perform FEC processing. In subsequent FEC processing, there is an integral quantity of periods 544/68=8 periods. A bit width of output encoded data is 680 bits, and the data is converted by the Gearbox to data of 640 bits to be output. Because the data output by FEC is converted by the Gearbox to an output bit width of 640 bits, which is equal to the output bit width of the Serdes, and integrity and continuity of output AM patterns on 16 lanes are not damaged, a Slice module is not required in this embodiment.

Embodiment 4 of the present disclosure includes the following.

P=640, F=510, and S=480. That RS FEC (544, 514, 30, 10) is selected as an FEC algorithm is used as an example. If the following parameters, P=640, F=510, and S=480, are selected as processing bit widths of an entire PCS, whole bit width processing in the present disclosure is shown in FIG. 7.

First, an Adaptor needs to deliver data, particularly an AM pattern, to 16 lanes using two delivery granularities. As shown in FIG. 2A and FIG. 2B, a granularity of 256/257 bits is used for delivery in a method for processing an all data frame in the present disclosure, and the data needs to be delivered according to a data encoding granularity or a data transcoding granularity (which is 256/257 bits in this embodiment) in a Round Robin polling delivery manner. For an AM part in a hybrid frame, the Adaptor directly delivers the AM part according to a granularity of an AM, and the delivery is also performed in the Round Robin polling delivery manner. The AM needs to be delivered to each lane according to a size, which is a granularity 320 bits, of the AM on each lane.

After the delivery by the Adaptor, in the present disclosure, whether to use a Gearbox (640 to 510) to perform matching is chosen according to a bit width matching condition. When P and F are not matched in the present disclosure, the Gearbox needs to be added to convert a data bit width from P to F, so as to ensure that FEC internal processing is easy.

In an FEC algorithm of RS FEC (544, 514, 15, 10), an internal parallel bit width of FEC is 510 bits. Because 544*10/510=10.67, which is a nonintegral quantity of periods, the problem described in FIG. 4A and FIG. 4B exists. A solution in this embodiment is as follows. For a decoding bit width of 510 bits, a frequency increasing method is used to forcibly allocate two periods to two parts of data. In this way, data that is processed in parallel in each period does not include data of two codewords, and there is no need to copy extra logic. An implementation manner in the present disclosure is shown in FIG. 4A, or a data concatenation manner after frequency increasing is shown in FIG. 4B. According to the foregoing solution in the present disclosure, an entire data rate is enlarged, and bubble extrusion logic needs to be added subsequently. For the decoding bit width of 510 bits, two periods are forcibly allocated to the two parts of data in the concatenated period using a frequency increasing method. There are two specific frequency increasing manners, as shown in FIG. 4A and FIG. 4B. In this way, a problem of a nonintegral period can be handled without adding a resource. However, in this case, the entire data rate is enlarged, and relatively simple bubble extrusion logic needs to be added subsequently. The filled IDLE is extruded, and a data format that matches a rate of an output bit width is formed. A parallel bit width of output to the Serdes is 510 bits.

Because a bit width of encoded data output by FEC is 510 bits, the data needs to be converted by the Gearbox to an output data format of 640 bits. Then, slicing processing needs to be performed by a Slice. The data is sliced according to 160 bits, data blocks that are of three slices and are delivered to lanes are overlaid, and then Serdes data whose bit width is 480 bits is output. Integrity and continuity of output AM patterns on 16 lanes are not damaged. FIG. 6 shows the slicing technology in the present disclosure.

Embodiment 5 of the present disclosure includes the following.

If processing bit widths of modules at a PCS layer are as follows: P=640, F=480, and S=480, that RS FEC (544, 514, 30, 10) is selected as an FEC algorithm is used as an example. If the following parameters, P=640, F=480, and S=480, are selected as processing bit widths of an entire PCS, whole bit width processing in the present disclosure is shown in FIG. 7.

First, an Adaptor needs to deliver data, particularly an AM pattern, to 16 lanes using two delivery granularities. As shown in FIG. 2A and FIG. 2B, a granularity of 256/257 bits is used for delivery in a method for processing an all data frame in the present disclosure, and the data needs to be delivered according to a data encoding granularity or a data transcoding granularity (which is 256/257 bits in this embodiment) in a Round Robin polling delivery manner. For an AM part in a hybrid frame, the Adaptor directly delivers the AM part according to a granularity of an AM, and the delivery is also performed in the Round Robin polling delivery manner. The AM needs to be delivered to each lane according to a size, which is a granularity 320 bits, of the AM on each lane.

After the delivery by the Adaptor, in the present disclosure, a Slice (640 to 480) is chosen according to a bit width matching condition to perform bit width matching. Because the FEC processing bit width is equal to the processing bit width of the Serdes, in this embodiment, before FEC encoding, a data slice may be directly converted to a data bit width corresponding to 480 bits. In this way, integrity and continuity of AM patterns on 16 lanes of the Serdes are indirectly ensured, and there is no need to perform a bit width conversion operation subsequently.

A data bit width of 480 bits output by the Slice is processed using an FEC algorithm of RS FEC (544, 514, 15, 10). An internal parallel bit width of FEC is 480 bits. Because 544*10/480=11.34, which is a nonintegral quantity of periods, the problem in FIG. 2 exists. A solution in this embodiment is as follows. For a decoding bit width of 480 bits, a frequency increasing method is used to forcibly allocate two periods to two parts of data. In this way, data that is processed in parallel in each period does not include data of two codewords, and there is no need to copy extra logic. An implementation manner in the present disclosure is shown in the following figure.

The foregoing solution of the present disclosure makes an entire data rate enlarged; therefore, bubble extrusion logic needs to be added subsequently. For the decoding bit width of 480 bits, two periods are forcibly allocated to the two parts of data in the concatenated period using a frequency increasing method. There are two specific frequency increasing manners, as shown in FIG. 2A and FIG. 2B. In this way, a problem of a nonintegral period can be handled without adding a resource. However, in this case, the entire data rate is enlarged, and relatively simple bubble extrusion logic needs to be added subsequently. The filled IDLE is extruded, and a data format that matches a rate of an output bit width is formed. IDLE is deleted after FEC encoding, and data of a bit width of 480 bits is output. Because the data is previously processed by the Slice, the data may be directly output to the Serdes of which a parallel bit width is 480 bits, and the AMs are not affected.

It can be learned from the descriptions in the foregoing embodiments of the present disclosure that the present disclosure supports matching of different bit widths, which makes implementation more flexible and saves resources. The present disclosure supports an Adaptor that uses a delivery manner of different granularities. In the present disclosure, a Slice may be used to perform slicing processing, which facilitates bit width matching, ensures integrity and continuity of an AM pattern, and resolves a problem of conversion of a bit width of a nonintegral multiple. In the present disclosure, FEC supports two frequency increasing manners, in which resources can be effectively saved in a case of FEC processing of a nonintegral multiple. An entire solution architecture may be simplified by flexibly using the Slice and a Gearbox. The present disclosure provides an Ethernet architecture that can support matching of different bit widths. The present disclosure provides an architecture that can support FEC processing of an integral multiple or a nonintegral multiple. The present disclosure supports frequency increasing to resolve a resource increase problem that exists in a case of a bit width of a nonintegral multiple. The Slice method in the present disclosure ensures flexible variation of a bit width as well as integrity of an AM. The present disclosure provides a solution that supports a flexible combination of the Slice and the Gearbox. The present disclosure supports delivery manners of different granularities to ensure distribution of an AM pattern.

It should be noted that, for brief description, the foregoing method embodiments are represented as a series of actions. However, persons skilled in the art should appreciate that the present disclosure is not limited to the described order of the actions, because according to the present disclosure, some steps may be performed in other order or simultaneously. In addition, persons skilled in the art should also understand that the embodiments described in this specification all belong to exemplary embodiments, and the involved actions and modules are not necessarily mandatory to the present disclosure.

To better implement the foregoing solutions in the embodiments of the present disclosure, a related apparatus used for implement the foregoing solutions is further provided in the following.

Figure 11:
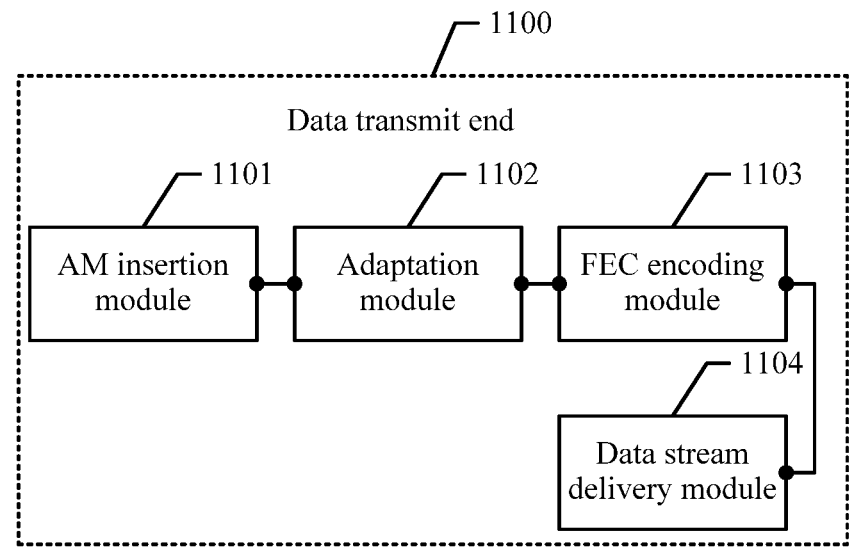
FIG. 11 is a schematic structural diagram of composition of a data transmit end according to an embodiment of the present disclosure.

Referring to FIG. 11, an embodiment of the present disclosure provides a data transmit end 1100, which may include an AM insertion module 1101, an adaptation module 1102, an FEC encoding module 1103, and a data stream delivery module 1104.

The AM insertion module 1101 is configured to insert multiple alignment markers AMs into a first data stream, where the first data stream is a data stream that is transcoded and scrambled after being encoded at a physical layer, and a transmission rate of the first data stream is greater than or equal to 100 G.

The adaptation module 1102 is configured to adaptively allocate the first data stream that includes the AMs to multiple physical coding sublayer PCS lanes to obtain second data streams.

The FEC encoding module 1103 is configured to perform FEC encoding on the second data streams on the multiple PCS lanes to obtain third data streams.

The data stream delivery module 1104 is configured to deliver the third data streams to multiple physical medium attachment sublayer PMA lanes according to an input bit width of a serializer/deserializer Serdes to obtain multiple fourth data streams, where the multiple fourth data streams are in a one-to-one correspondence with the multiple PMA lanes, each fourth data stream includes at least one complete and continuous AM, and the at least one AM is an AM in the multiple AMs.

In some embodiments of the present disclosure, the AM insertion module is an AM insertion circuit, and the FEC encoding module may be an FEC encoding circuit.

In some embodiments of the present disclosure, the adaptation module 1102 is configured to the first data stream includes an all data parallel processing block and an AM parallel processing block; adaptively allocate the all data parallel processing block to the multiple PCS lanes according to an all data parallel processing granularity, and adaptively allocate the AM parallel processing block to the multiple PCS lanes according to an AM parallel processing granularity.

In some embodiments of the present disclosure, adaptively allocating the first data stream that includes the AMs to multiple physical coding sublayer PCS lanes is used as an example and includes the first data stream includes an all data parallel processing block and an AM parallel processing block; adaptively allocating the all data parallel processing block to the multiple PCS lanes according to an all data parallel processing granularity, and adaptively allocating the AM parallel processing block to the multiple PCS lanes according to an AM parallel processing granularity.

Before the AMs are inserted into the first data stream, a data block included in the first data stream may be all data. After the AMs are inserted, the first data stream is a data stream that is formed by commingling the all data and the AMs. When the first data stream that includes the AMs is adaptively allocated to the multiple PCS lanes, for a situation in which the data block of the all data and an AM block in the first data stream have different sizes, to evenly distribute the AMs to the PCS lanes in this embodiment of the present disclosure, the first data stream that includes the AMs may be adaptively allocated using two different granularities. For the all data in the first data stream, the all data parallel processing block may be adaptively allocated to the multiple PCS lanes according to the all data parallel processing granularity; for the AMs in the first data stream, the AM parallel processing block is adaptively allocated to the multiple PCS lanes according to the AM parallel processing granularity. Because the AMs are separately delivered, it can be ensured that the AMs are evenly distributed on the multiple PCS lanes. It can be understood that if the all data parallel processing granularity is equal to the AM parallel processing granularity, the first data stream that includes the AMs may be adaptively allocated to the multiple PCS lanes according to a same granularity.

As shown in FIG. 2A, FIG. 2A is a schematic diagram of an implementation manner of adaptively allocating a first data stream to multiple PCS lanes according to an embodiment of the present disclosure. As shown in FIG. 2B, FIG. 2B is a schematic diagram of another implementation manner of adaptively allocating a first data stream to multiple PCS lanes according to an embodiment of the present disclosure. Adaptively allocating the first data stream to the multiple PCS lanes may be implemented using an adaptation module at the data transmit end. A function of the adaptation module is to evenly deliver the AMs to respective PCS lanes. The adaptation module performs processing according to a processing mode of a parallel processing block, where the parallel processing block may be classified into two types of parallel processing blocks according to content of the first data stream: an all data parallel processing block and an AM parallel processing block. In the present disclosure, two granularities are used to respectively perform delivery processing on the AMs and the all data, which is different from a delivery structure in which delivery can be performed only according to a unified granularity in the prior art. However, when the parallel processing blocks of the AMs and the all data are the same, the two granularities in the present disclosure may also refer to a same granularity. As shown in FIG. 2A, a method for processing the all data parallel processing block in the present disclosure needs to be performed in a polling delivery manner in which round robin scheduling is performed according to a symbol on the PCS lanes or an integral multiple of the symbol, and the all data parallel processing block is separately delivered to the PCS lane 0, the PCS lane 1, the PCS lane 2, . . . , and the PCS lane i–1. As shown in FIG. 2B, in a method for processing the AM parallel processing block in the first data stream, the AMs are directly delivered to the PCS lanes according to the AM parallel processing granularity. The delivery is also performed in the Round Robin polling delivery manner, and the AM parallel processing block is separately delivered to the PCS lane 0, the PCS lane 1, the PCS lane 2, . . . , and the PCS lane i–1. Sizes of the AMs on the lanes are used as delivery granularities to deliver the AMs to the lanes.

In some embodiments of the present disclosure, the data transmit end further includes a bit width transformation module configured to, after the adaptation module adaptively allocates the first data stream that includes the AMs to the multiple physical coding sublayer PCS lanes, and before the FEC encoding module performs FEC encoding on the second data streams on the multiple PCS lanes, if a processing bit width of an AM insertion circuit is different from a processing bit width of an FEC encoding circuit, perform bit width conversion on the first data stream that includes the AMs, where a bit width of the converted first data stream is equal to the processing bit width of the FEC encoding circuit.

In some embodiments of the present disclosure, the data transmit end further includes a frequency increasing module configured to, after the adaptation module adaptively allocates the first data stream that includes the AMs to the multiple physical coding sublayer PCS lanes, and before the FEC encoding module performs FEC encoding on the second data streams on the multiple PCS lanes, allocate two different clock cycles to two codeword segments that are processed in parallel in a same clock cycle to perform processing, and insert idle data in the two different clock cycles, where the two different clock cycles each include one codeword segment of the two codeword segments that are originally concatenated in one clock cycle.

In some embodiments of the present disclosure, the FEC encoding module is configured to perform FEC encoding on data, except the inserted idle data, in the second data streams; and after performing FEC encoding on the second data streams, delete the inserted idle data from the encoded second data streams to obtain the third data streams.

In some embodiments of the present disclosure, the frequency increasing module is configured to insert, between the two codeword segments that are processed in parallel in a same clock cycle, idle data that occupies one clock cycle, allocate the clock cycle in which the two codeword segments are originally concatenated to one codeword segment of the two codeword segments that are originally concatenated in one clock cycle and one part of the idle data in one clock cycle, and allocate a clock cycle next to the clock cycle in which the two codeword segments are originally concatenated to the other codeword segment of the two codeword segments that are originally concatenated in one clock cycle and the other part of the idle data in one clock cycle.

In some embodiments of the present disclosure, the frequency increasing module is configured to insert idle data after the former codeword segment in the two codeword segments that are processed in parallel in a same clock cycle, so that the clock cycle in which the two codeword segments are originally concatenated is filled, perform backward data shifting on the latter codeword segment in the two codeword segments that are processed in parallel in a same clock cycle, and insert idle data after the last codeword segment in a codeword in which the latter codeword segment is located, so that a clock cycle to which the last codeword segment in the codeword in which the latter codeword segment is located belongs is filled.

In some embodiments of the present disclosure, the FEC encoding module is configured to acquire two codeword segments that are in the second data streams and are processed in parallel in a same clock cycle, where the two codeword segments include a first codeword segment and a second codeword segment, and a data volume of the first codeword segment is greater than or equal to that of the second codeword segment; and perform FEC encoding on the first codeword segment using a first FEC encoding circuit, and perform FEC encoding on the second codeword segment using a second FEC encoding circuit, where the third data streams are generated after the first codeword segment and the second codeword segment are respectively processed by the first FEC encoding circuit and the second FEC encoding circuit, and the second FEC encoding circuit and the first FEC encoding circuit use completely different configurable logic encoding circuits, or the second FEC encoding circuit is an FEC encoding circuit obtained after a resource configuration operation is performed on a configurable logic encoding circuit, except a configurable logic encoding circuit that processes the first codeword segment, in the first FEC encoding circuit.

In some embodiments of the present disclosure, the data transmit end further includes a bit width conversion module configured to, after the FEC encoding module performs FEC encoding on the second data streams on the multiple PCS lanes to obtain the third data streams, and before the PMA delivery module delivers the third data streams to the multiple physical medium attachment sublayer PMA lanes according to the input bit width of the Serdes, if a processing bit width of an AM insertion circuit is different from a processing bit width of an FEC encoding circuit, perform bit width conversion on the third data streams, where bit widths of the converted third data streams are equal to the processing bit width of the AM insertion circuit.

In some embodiments of the present disclosure, the data stream delivery module is configured to determine a slice size according to a quantity of the PCS lanes and a data size of a single character borne on each PCS lane, and slice the third data streams according to the slice size to obtain sliced third data streams, where each slice includes multiple third data blocks; and determine, according to bit widths of the third data streams, the input bit width of the Serdes, and the slice size, a quantity of slices that need to be delivered, extract, from the sliced third data streams, third data blocks in slices corresponding to the quantity of slices, and then deliver the third data blocks to a same PMA lane in the multiple PMA lanes after overlaying third data blocks that are at a same location in the slices corresponding to the quantity of slices.

In some embodiments of the present disclosure, the data stream delivery module is configured to the quantity of the PCS lanes is i, the data size of a single character borne on each PCS lane is m, a size of a third data block in each slice obtained after the third data streams are sliced is i×m, and the bit widths of the third data streams are i×m×Integer 1, where the Integer 1 is a preset positive integer; the input bit width of the Serdes is i×m×Integer 2, the slice size is i×m×Integer S, and therefore both the Integer 1 and the Integer 2 are integral multiples of the Integer S, and the quantity of slices is Integer 2/Integer S, where the Integer 2 is a preset positive integer; and extract the $n^{th}$ third data block from each slice, and deliver Integer 2/Integer S extracted $n^{th}$ third data blocks in total to the $n^{th}$ PMA lane after overlaying the Integer 2/Integer S extracted $n^{th}$ third data blocks, where a value of n is any value from 0 to i−1.

It can be learned from the descriptions of the foregoing embodiment of the present disclosure that alignment markers AMs are inserted into a first data stream, where the first data stream is a data stream that is transcoded and scrambled after 64b/66b encoding is performed, and a transmission rate of the first data stream is greater than or equal to 100 G; the first data stream that includes the AMs is adaptively allocated to multiple physical coding sublayer PCS lanes to obtain second data streams; FEC encoding is performed on the second data streams on the multiple PCS lanes to obtain third data streams; and the third data streams are delivered to multiple physical medium attachment sublayer PMA lanes according to an input bit width of a Serdes, where a third data stream delivered to each PMA lane includes a complete and continuous AM. Because in the present disclosure, the third data streams are delivered to the multiple PMA lanes, and the AM on each PMA lane can remain continuous and complete, a data receive end can acquire complete and continuous AMs from the multiple PMA lanes, which may be applicable to a scenario in which a transmission rate of a data stream is quite high, and avoid a damage to the AMs.

Figure 12:
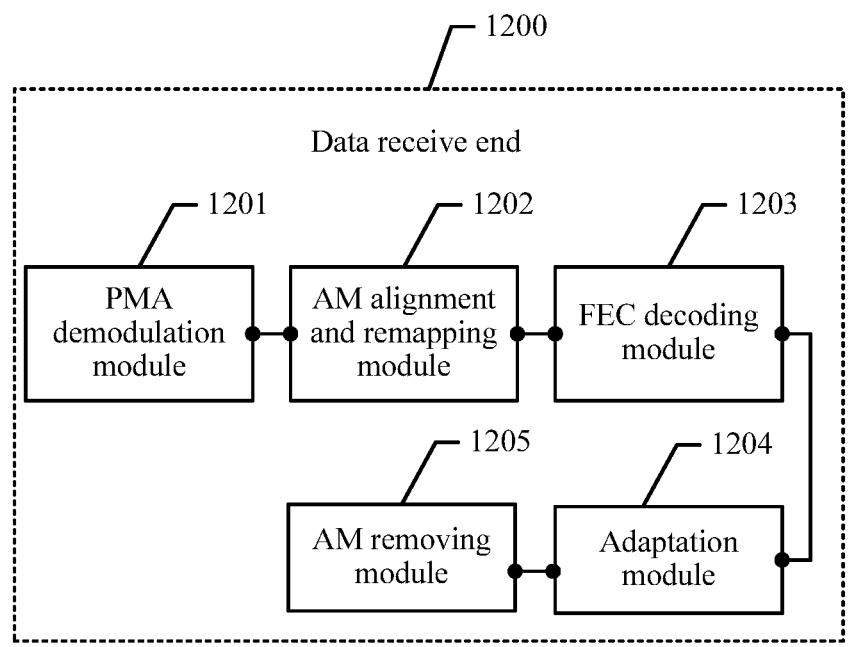
FIG. 12 is a schematic structural diagram of composition of a data receive end according to an embodiment of the present disclosure.

Referring to FIG. 12, an embodiment of the present disclosure provides a data receive end 1200, which may include a PMA demodulation module 1201, an AM alignment and remapping module 1202, an FEC decoding module 1203, an adaptation module 1204, and an AM removing module 1205.

The PMA demodulation module 1201 is configured to receive fourth data streams from multiple physical medium attachment sublayer PMA lanes, and perform PMA demodulation on the fourth data streams to obtain third data streams that are obtained after PMA demodulation is performed.

The AM alignment and remapping module 1202 is configured to identify complete and continuous alignment markers AMs from the third data streams, and perform alignment and remapping on the third data streams on physical coding sublayer PCS lanes according to the AMs to obtain aligned and remapped third data streams.

The FEC decoding module 1203 is configured to perform FEC decoding on the aligned and remapped third data streams to obtain second data streams, where the second data streams include the AMs.

The adaptation module 1204 is configured to combine the second data streams that are on the PCS lanes and are obtained by means of FEC decoding to obtain a first data stream that includes the AMs.

The AM removing module 1205 is configured to remove the AMs from the first data stream that includes the AMs to obtain an original first data stream used for encoding on a data encoder side.

In some embodiments of the present disclosure, the PMA demodulation module is configured to determine, according to bit widths of the fourth data streams, an input bit width of a Serdes, and a slice size, a quantity of slices that need to be combined, acquire, from each PMA lane, third data blocks that are at a same location in slices corresponding to the quantity of slices, respectively deliver the third data blocks to the PCS lanes, and combine third data blocks on each PCS lane to obtain combined third data streams.

In some embodiments of the present disclosure, the PMA demodulation module is configured to a quantity of the PCS lanes is i, a data size of a single character borne on each PCS lane is m, and bit widths of the third data streams are i×m×Integer 1, where the Integer 1 is a preset positive integer; the input bit width of the Serdes is i×m×Integer 2, the slice size is i×m×Integer S, and therefore both the Integer 1 and the Integer 2 are integral multiples of the Integer S, and the quantity of slices is Integer 1/Integer S, where the Integer 2 is a preset positive integer; a size of a third data block that is in each slice and is acquired from each PMA lane is i×m; and acquire Integer 1/Integer S $n^{th}$ third data blocks in total from the $n^{th}$ PMA lane, respectively deliver the Integer 1/Integer S $n^{th}$ third data blocks to the PCS lanes, and combine the third data blocks on each PCS lane to obtain the third data streams whose bit widths are i×m×Integer 1.

In some embodiments of the present disclosure, the data receive end further includes a bit width conversion module configured to, before the FEC decoding module performs FEC decoding on the aligned and remapped third data streams, if a processing bit width of an AM removing circuit is different from a processing bit width of an FEC decoding circuit, perform bit width conversion on the aligned and remapped third data streams, where bit widths of the third data streams whose bit widths are converted are equal to the processing bit width of the FEC decoding circuit.

In some embodiments of the present disclosure, the data receive end further includes a frequency increasing module configured to, before the FEC decoding module is configured to perform FEC decoding on the aligned and remapped third data streams, allocate two different clock cycles to two codeword segments that are processed in parallel in a same clock cycle to perform processing, and insert idle data in the two different clock cycles, where the two different clock cycles each include one codeword segment of the two codeword segments that are originally concatenated in one clock cycle.

In some embodiments of the present disclosure, the FEC decoding module is configured to perform FEC decoding on data, except the inserted idle data, in the aligned and remapped third data streams; and after performing FEC decoding on the third data streams, delete the inserted idle data from the decoded third data streams to obtain the second data streams.

In some embodiments of the present disclosure, the frequency increasing module is configured to insert, between the two codeword segments that are processed in parallel in a same clock cycle, idle data that occupies one clock cycle, allocate the clock cycle in which the two codeword segments are originally concatenated to one codeword segment of the two codeword segments that are originally concatenated in one clock cycle and one part of the idle data in one clock cycle, and allocate a clock cycle next to the clock cycle in which the two codeword segments are originally concatenated to the other codeword segment of the two codeword segments that are originally concatenated in one clock cycle and the other part of the idle data in one clock cycle.

In some embodiments of the present disclosure, the frequency increasing module is configured to insert idle data after the former codeword segment in the two codeword segments that are processed in parallel in a same clock cycle, so that the clock cycle in which the two codeword segments are originally concatenated is filled, perform backward data shifting on the latter codeword segment in the two codeword segments that are processed in parallel in a same clock cycle, and insert idle data after the last codeword segment in a codeword in which the latter codeword segment is located, so that a clock cycle to which the last codeword segment in the codeword in which the latter codeword segment is located belongs is filled.

In some embodiments of the present disclosure, the FEC decoding module is configured to acquire two codeword segments that are in the third data streams and are processed in parallel in a same clock cycle, where the two codeword segments include a first codeword segment and a second codeword segment, and a data volume of the first codeword segment is greater than or equal to that of the second codeword segment; and perform FEC decoding on the first codeword segment using a first FEC decoding circuit, and perform FEC decoding on the second codeword segment using a second FEC decoding circuit, where the second data streams are generated after the first codeword segment and the second codeword segment are respectively processed by the first FEC decoding circuit and the second FEC decoding circuit, and the second FEC decoding circuit and the first FEC decoding circuit use completely different configurable logic decoding circuits, or the second FEC decoding circuit is an FEC decoding circuit obtained after a resource configuration operation is performed on a configurable logic decoding circuit, except a configurable logic decoding circuit that processes the first codeword segment, in the first FEC decoding circuit.

In some embodiments of the present disclosure, the data receive end further includes a bit width conversion module configured to, before the AM removing module removes the AMs from the first data stream that includes the AMs, if a processing bit width of an AM removing circuit is different from a processing bit width of an FEC decoding circuit, perform bit width conversion on the first data stream that includes the AMs, where a bit width of the converted first data stream is equal to the bit width of the AM removing circuit.

In some embodiments of the present disclosure, the adaptation module is configured to extract an all data parallel processing block according to an all data parallel processing granularity, extract an AM parallel processing block according to an AM parallel processing granularity, and combine the all data parallel processing block and the AM parallel processing block to obtain the first data stream that includes the AMs.

In some embodiments of the present disclosure, delivering a first data stream that includes AMs to multiple physical coding sublayer PCS lanes is used as an example and includes the first data stream includes an all data parallel processing block and an AM parallel processing block; adaptively allocating the all data parallel processing block to the multiple PCS lanes according to an all data parallel processing granularity, and adaptively allocating the AM parallel processing block to the multiple PCS lanes according to an AM parallel processing granularity.

Before the AMs are inserted into the first data stream, a data block included in the first data stream may be all data. After the AMs are inserted, the first data stream is a data stream that is formed by commingling the all data and the AMs. When the first data stream that includes the AMs is adaptively allocated to the multiple PCS lanes, for a situation in which the data block of the all data and an AM block in the first data stream have different sizes, to evenly distribute the AMs to the PCS lanes in this embodiment of the present disclosure, the first data stream that includes the AMs may be adaptively allocated using two different granularities. For the all data in the first data stream, the all data parallel processing block may be adaptively allocated to the multiple PCS lanes according to the all data parallel processing granularity; for the AMs in the first data stream, the AM parallel processing block is adaptively allocated to the multiple PCS lanes according to the AM parallel processing granularity. Because the AMs are separately delivered, it can be ensured that the AMs are evenly distributed on the multiple PCS lanes. It can be understood that if the all data parallel processing granularity is equal to the AM parallel processing granularity, the first data stream that includes the AMs may be adaptively allocated to the multiple PCS lanes according to a same granularity.

As shown in FIG. 2A, FIG. 2A is a schematic diagram of an implementation manner of adaptively allocating a first data stream to multiple PCS lanes according to an embodiment of the present disclosure. As shown in FIG. 2B, FIG. 2B is a schematic diagram of another implementation manner of adaptively allocating a first data stream to multiple PCS lanes according to an embodiment of the present disclosure. Adaptively allocating the first data stream to the multiple PCS lanes may be implemented using an adaptation module at the data transmit end. A function of the adaptation module is to evenly deliver the AMs to respective PCS lanes. The adaptation module performs processing according to a processing mode of a parallel processing block, where the parallel processing block may be classified into two types of parallel processing blocks according to content of the first data stream: an all data parallel processing block and an AM parallel processing block. In the present disclosure, two granularities are used to respectively perform delivery processing on the AMs and the all data, which is different from a delivery structure in which delivery can be performed only according to a unified granularity in the prior art. However, when the parallel processing blocks of the AMs and the all data are the same, the two granularities in the present disclosure may also refer to a same granularity. As shown in FIG. 2A, a method for processing the all data parallel processing block in the present disclosure needs to be performed in a polling delivery manner in which round robin scheduling is performed according to a symbol on the PCS lanes or an integral multiple of the symbol, and the all data parallel processing block is separately delivered to the PCS lane 0, the PCS lane 1, the PCS lane 2, . . . , and the PCS lane i–1. As shown in FIG. 2B, in a method for processing the AM parallel processing block in the first data stream, the AMs are directly delivered to the PCS lanes according to the AM parallel processing granularity. The delivery is also performed in the Round Robin polling delivery manner, and the AM parallel processing block is separately delivered to the PCS lane 0, the PCS lane 1, the PCS lane 2, . . . , and the PCS lane i–1. Sizes of the AMs on the lanes are used as delivery granularities to deliver the AMs to the lanes.

It can be learned from the descriptions of the foregoing embodiment of the present disclosure that fourth data streams are received from multiple physical medium attachment sublayer PMA lanes, and PMA demodulation is performed on the fourth data streams to obtain third data streams that are obtained after PMA demodulation is performed; complete and continuous AMs are identified from the third data streams, and alignment and remapping are performed on the third data streams on PCS lanes according to the AMs to obtain aligned and remapped third data streams; FEC decoding is performed on the aligned and remapped third data streams to obtain second data streams, where the second data streams include the AMs; the second data streams that are on the PCS lanes and are obtained by means of FEC decoding are combined to obtain a first data stream that includes the AMs; and the AMs are removed from the first data stream that includes the AMs to obtain an original first data stream used for encoding on a data encoder side. Because in the present disclosure, the third data streams are delivered to the multiple PMA lanes, and an AM on each PMA lane can remain continuous and complete, a data receive end can acquire complete and continuous AMs from the multiple PMA lanes, which may be applicable to a scenario in which a transmission rate of a data stream is quite high, and avoid a damage to the AMs.

It should be noted that content such as information exchange between the modules/units of the apparatus and the execution processes thereof is based on the same idea as the method embodiments of the present disclosure, and produces the same technical effects as the method embodiments of the present disclosure. For the specific content, reference may be made to the foregoing description in the method embodiments of the present disclosure, and details are not described herein again.

In addition, it should be noted that the described apparatus embodiment is merely exemplary. The units described as separate parts may or may not be physically separate, and parts displayed as units may or may not be physical units, may be located in one position, or may be distributed on a plurality of network units. Some or all of the modules may be selected according to actual needs to achieve the objectives of the solutions of the embodiments. In addition, in the accompanying drawings of the apparatus embodiments provided by the present disclosure, connection relationships between modules indicate that the modules have communication connections with each other, which may be implemented as one or more communications buses or signal cables. Persons of ordinary skill in the art may understand and implement the embodiments of the present disclosure without creative efforts.

Based on the description of the foregoing implementation manners, persons skilled in the art may clearly understand that the present disclosure may be implemented by software in addition to necessary universal hardware, or by dedicated hardware, including a dedicated integrated circuit, a dedicated CPU, a dedicated memory, a dedicated component, and the like. Generally, any functions that can be performed by a computer program can be easily implemented using corresponding hardware. Moreover, a specific hardware structure used to achieve a same function may be of various forms, for example, in a form of an analog circuit, a digital circuit, a dedicated circuit, or the like. However, as for the present disclosure, software program implementation is a better implementation manner in most cases. Based on such an understanding, the technical solutions of the present disclosure essentially or the part contributing to the prior art may be implemented in a form of a software product. The software product is stored in a readable storage medium, such as a floppy disk, a universal serial bus (USB) flash drive, a removable hard disk, a read-only memory (ROM), a random access memory (RAM), a magnetic disk, or an optical disc of a computer, and includes several instructions for instructing a computer device (which may be a personal computer, a server, a network device, or the like) to perform the methods described in the embodiments of the present disclosure.

The foregoing embodiments are merely intended for describing the technical solutions of the present disclosure, but not for limiting the present disclosure. Although the present disclosure is described in detail with reference to the foregoing embodiments, persons of ordinary skill in the art should understand that they may still make modifications to the technical solutions described in the foregoing embodiments or make equivalent replacements to some technical features thereof, without departing from the spirit and scope of the technical solutions of the embodiments of the present disclosure.

What is claimed is:

1. A method, comprising:
   inserting multiple alignment markers (AMs) into a first data stream, wherein the first data stream is a data stream that is transcoded and scrambled after being encoded at a physical layer, and wherein a transmission rate of the first data stream is greater than or equal to 100 gigabits per second (GPS);
   adaptively allocating the first data stream that comprises the AMs to multiple physical coding sublayer (PCS) lanes to obtain second data streams;
   allocating two different clock cycles to two codeword segments that were originally concatenated in one clock cycle to perform processing by:
      allocating a first clock cycle to one codeword segment of the two codeword segments that were originally concatenated in one clock cycle and one part of idle data; and
      allocating a second clock cycle to another codeword segment of the two codeword segments that were originally concatenated in one clock cycle and another part of the idle data; and
   inserting the idle data in the two different clock cycles, wherein the two different clock cycles each comprise one codeword segment of the two codeword segments that were originally concatenated in one clock cycle, and wherein inserting the idle data in the two different clock cycles comprises inserting the idle data between the two codeword segments that were originally concatenated in one clock cycle;
   performing forward error correction (FEC) encoding on the second data streams on the PCS lanes to obtain third data streams; and
   delivering the third data streams to multiple physical medium attachment sublayer (PMA) lanes according to an input bit width of a serializer/deserializer (Serdes) to obtain multiple fourth data streams, wherein the multiple fourth data streams are in a one-to-one correspondence with the multiple PMA lanes, and wherein each fourth data stream comprises at least one complete and continuous AM that is in the multiple AMs.

2. The method of claim 1, wherein the first data stream comprises an all data parallel processing block and an AM parallel processing block, and wherein adaptively allocating the first data stream that comprises the AMs to the PCS lanes comprises:
   adaptively allocating the all data parallel processing block to the PCS lanes according to an all data parallel processing granularity; and
   adaptively allocating the AM parallel processing block to the PCS lanes according to an AM parallel processing granularity.

3. The method of claim 1, wherein after adaptively allocating the first data stream that comprises the AMs to the PCS lanes, and before performing FEC encoding on the second data streams on the PCS lanes, the method further comprises performing bit width conversion on the first data stream that comprises the AMs when a processing bit width of an AM insertion circuit is different from a second processing bit width of a FEC encoding circuit, thereby producing a converted first data stream, and wherein a bit width of the converted first data stream is equal to the second processing bit width of the FEC encoding circuit.

4. The method of claim 1, wherein performing FEC encoding on the second data streams on the PCS lanes to obtain the third data streams comprises:
   performing FEC encoding on data, except the idle data, in the second data streams; and
   deleting, after performing FEC encoding on the second data streams, the idle data from the FEC encoded second data streams to obtain the third data streams.

5. The method of claim 1, wherein performing FEC encoding on the second data streams on the PCS lanes to obtain the third data streams comprises:
   acquiring two codeword segments that are in the second data streams and are processed in parallel in a same clock cycle, wherein the two codeword segments comprise a first codeword segment and a second codeword segment, and wherein a data volume of the first codeword segment is greater than or equal to that of the second codeword segment;
   performing FEC encoding on the first codeword segment using a first FEC encoding circuit; and
   performing FEC encoding on the second codeword segment using a second FEC encoding circuit, wherein the third data streams are generated after the first codeword segment and the second codeword segment are respectively processed by the first FEC encoding circuit and the second FEC encoding circuit, and wherein the second FEC encoding circuit and the first FEC encoding circuit use completely different configurable logic encoding circuits, or the second FEC encoding circuit is obtained after a resource configuration operation is performed on a configurable logic encoding circuit, except another configurable logic encoding circuit that processes the first codeword segment, in the first FEC encoding circuit.

6. The method of claim 1, wherein delivering the third data streams to multiple PMA lanes according to the input bit width of the Serdes comprises:
   determining a slice size according to a quantity of the PCS lanes and a data size of a single character borne on each PCS lane;
   slicing the third data streams according to the slice size to obtain sliced third data streams, wherein each slice comprises multiple third data blocks;
   determining, according to bit widths of the third data streams, the input bit width of the Serdes, and the slice size, a quantity of slices that need to be delivered;
   extracting, from the sliced third data streams, the third data blocks in slices corresponding to the quantity of slices; and
   delivering the third data blocks to a same PMA lane in the multiple PMA lanes after overlaying the third data blocks that are at a same location in the slices corresponding to the quantity of slices.

7. The method of claim 6, wherein bit widths of the third data streams are i×m×Integer 1, wherein the quantity of the PCS lanes is i, wherein the data size of the single character borne on each PCS lane is m, wherein a size of the third data block in each slice obtained after the third data streams are sliced is i×m, and wherein the Integer 1 is a preset positive integer, wherein the input bit width of the Serdes is i×m× Integer 2, wherein the slice size is i×m×integer S, wherein both the Integer 1 and the Integer 2 are integral multiples of the Integer S, wherein the quantity of slices is integer 2/Integer S, and wherein the Integer 2 is another preset positive integer, and wherein extracting, from the sliced third data streams, the third data blocks in slices corresponding to the quantity of slices, and delivering the third data blocks to the same PMA lane in the multiple PMA lanes after overlaying the third data blocks that are at the same location in the slices corresponding to the quantity of slices comprises:
  extracting a $n^{th}$ third data block from each slice to produce an extracted $n^{th}$ third data block; and
  delivering Integer 2/Integer S extracted $n^{th}$ third data blocks in total to a $n^{th}$ PMA lane after overlaying the Integer 2/Integer S extracted $n^{th}$ third data blocks, wherein a value of n is any value from 0 to i−1.

8. A data transmit apparatus, comprising:
  an alignment marker (AM) insertion circuit configured to insert multiple alignment markers (AMs) into a first data stream, wherein the first data stream is a data stream that is transcoded and scrambled after being encoded at a physical layer, and wherein a transmission rate of the first data stream is greater than or equal to 100 gigabits per second (GPS);
  an adaptation circuit coupled to the AM insertion circuit and configured to adaptively allocate the first data stream that comprises the AMs to multiple physical coding sublayer (PCS) lanes to obtain second data streams;
  a frequency increasing circuit coupled to the adaptation circuit and configured to:
    allocate two different clock cycles to two codeword segments that were originally concatenated in one clock cycle to perform processing by:
      allocating a first clock cycle to one codeword segment of the two codeword segments that were originally concatenated in one clock cycle and one part of idle data; and
      allocating a second clock cycle to another codeword segment of the two codeword segments that were concatenated in one clock cycle and another part of the idle data; and
    insert the idle data in the two different clock cycles, wherein the two different clock cycles each comprise one codeword segment of the two codeword segments that were originally concatenated in one clock cycle, and wherein inserting the idle data in the two different clock cycles comprises inserting the idle data between the two codeword segments that were originally concatenated in one clock cycle;
  a forward error correction (FEC) encoding circuit coupled to the frequency increasing circuit and configured to perform FEC encoding on the second data streams on the PCS lanes to obtain third data streams; and
  a data stream delivery circuit coupled to the FEC encoding circuit and configured to deliver the third data streams to multiple physical medium attachment sublayer (PMA) lanes according to an input bit width of a serializer/deserializer (Serdes) to obtain multiple fourth data streams, wherein the multiple fourth data streams are in a one-to-one correspondence with the multiple PMA lanes, and wherein each fourth data stream comprises at least one complete and continuous AM that is in the multiple AMs.

9. The data transmit apparatus of claim 8, wherein the first data stream comprises an all data parallel processing block and an AM parallel processing block, and wherein the adaptation circuit is further configured to:
  adaptively allocate the all data parallel processing block to the PCS lanes according to an all data parallel processing granularity; and
  adaptively allocate the AM parallel processing block to the PCS lanes according to an AM parallel processing granularity.

10. The data transmit apparatus of claim 8, wherein the data transmit apparatus further comprises a bit width transformation circuit configured to perform bit width conversion on the first data stream that comprises the AMs when a processing bit width of an AM insertion circuit is different from a second processing bit width of an FEC encoding circuit, after the adaptation circuit adaptively allocates the first data stream that comprises the AMs to the PCS lanes, and before the FEC encoding circuit performs FEC encoding on the second data streams on the PCS lanes, thereby producing a converted first data stream and wherein a bit width of the converted first data stream is equal to the second processing bit width of the FEC encoding circuit.

11. The data transmit apparatus of claim 8, wherein the FEC encoding circuit is further configured to:
  perform FEC encoding on data, except the idle data, in the second data streams; and
  delete the idle data from the FEC encoded second data streams to obtain the third data streams after performing FEC encoding on the second data streams.

12. The data transmit apparatus of claim 8, wherein the data stream delivery circuit is further configured to:
  determine a slice size according to a quantity of the PCS lanes and a data size of a single character borne on each PCS lane;
  slice the third data streams according to the slice size to obtain sliced third data streams, wherein each slice comprises multiple third data blocks;
  determine, according to bit widths of the third data streams, the input bit width of the Serdes, and the slice size, a quantity of slices that need to be delivered;
  extract, from the sliced third data streams, the third data blocks in slices corresponding to the quantity of slices; and
  deliver the third data blocks to a same PMA lane in the multiple PMA lanes after overlaying the third data blocks that are at a same location in the slices corresponding to the quantity of slices.

13. The data transmit apparatus of claim 12, wherein the quantity of the PCS lanes is i, wherein the data size of the single character borne on each PCS lane is m, wherein a size of the third data block in each slice obtained after the third data streams are sliced is i×m, wherein the bit widths of the third data streams are i×m×Integer 1, wherein the Integer 1 is a preset positive integer, wherein the input bit width of the Serdes is i×m×Integer 2, wherein the slice size is i×m× Integer S, and therefore both the Integer 1 and the Integer 2 are integral multiples of the Integer S, wherein the quantity of slices is Integer 2/Integer S, wherein the Integer 2 is another preset positive integer, and wherein the data stream delivery circuit is further configured to:
  extract a $n^{th}$ third data block from each slice to produce an extracted $n^{th}$ third data block; and
  deliver Integer 2/integer S extracted $n^{th}$ third data blocks in total to a $n^{th}$ PMA lane after overlaying the Integer 2/Integer S extracted $n^{th}$ third data blocks, wherein a value of n is any value from 0 to i−1.

14. A data transmit apparatus, comprising:
  an alignment marker (AM) insertion circuit configured to insert multiple alignment markers (AMs) into a first data stream, wherein the first data stream is a data stream that is transcoded and scrambled after being encoded at a physical layer, and wherein a transmission rate of the first data stream is greater than or equal to 100 gigabits per second (GPS);
an adaptation circuit coupled to the AM insertion circuit, and configured to adaptively allocate the first data stream that comprises the AMs to multiple physical coding sublayer (PCS) lanes to obtain second data streams;
a frequency increasing circuit coupled to the adaptation circuit and configured to:
  allocate two different dock cycles to two codeword segments that were originally concatenated in one clock cycle to perform processing; and
  insert idle data after one codeword segment of the two codeword segments that were originally concatenated in one clock cycle so that the clock cycle in which the two codeword segments were originally concatenated is filled;
  perform backward data shifting on another codeword segment of the two codeword segments that are originally concatenated in one clock cycle; and
  insert idle data after a last codeword segment in a codeword in which the other codeword segment of the two codeword segments is located so that a clock cycle to which the last codeword segment in the codeword in which the other codeword segment is located belongs is filled;
a forward error correction (FEC) encoding circuit coupled to the frequency increasing circuit and configured to perform FEC encoding on the second data streams on the PCS lanes to obtain third data streams; and
a data stream delivery circuit coupled to the FEC encoding circuit and configured to deliver the third data streams to multiple physical medium attachment sublayer (PMA) lanes according to an input bit width of a serializer/deserializer (Serdes) to obtain multiple fourth data streams, wherein the multiple fourth data streams are in a one-to-one correspondence with the multiple PMA lanes, and wherein each fourth data stream comprises at least one complete and continuous AM that is in the multiple AMs.

15. A data transmit apparatus, comprising:
an alignment marker (AM) insertion circuit configured to insert multiple alignment markers (AMs) into a first data stream, wherein the first data stream is a data stream that is transcoded and scrambled after being encoded at a physical layer, and wherein a transmission rate of the first data stream is greater than or equal to 100 gigabits per second (GPS):
an adaptation circuit coupled to the AM insertion circuit and configured to adaptively allocate the first data stream that comprises the AMs to multiple physical coding sublayer (PCS) lanes to obtain second data streams;
a forward error correction (FEC) encoding circuit coupled to the adaptation circuit and configured to:
  perform FEC encoding on the second data streams on the PCS lanes to obtain third data streams;
  acquire two codeword segments that are in the second data streams and are processed in parallel in a same clock cycle, wherein the two codeword segments comprise a first codeword segment and a second codeword segment, and wherein a data volume of the first codeword segment is greater than or equal to that of the second codeword segment;
  perform FEC encoding on the first codeword segment using a first FEC encoding circuit; and
  perform FEC encoding on the second codeword segment using a second FEC encoding circuit, wherein the third data streams are generated after the first codeword segment and the second codeword segment are respectively processed by the first FEC encoding circuit and the second FEC encoding circuit, and wherein the second FEC encoding circuit and the first FEC encoding circuit use completely different configurable logic encoding circuits, or the second FEC encoding circuit is obtained after a resource configuration operation is performed on a configurable logic encoding circuit, except another configurable logic encoding circuit that processes the first codeword segment, in the first FEC encoding circuit; and
a data stream delivery circuit coupled to the FEC encoding circuit and configured to deliver the third data streams to multiple physical medium attachment sublayer (PMA) lanes according to an input bit width of a serializer/deserializer (Serdes) to obtain multiple fourth data streams, wherein the multiple fourth data streams are in a one-to-one correspondence with the multiple PMA lanes, and wherein each fourth data stream comprises at least one complete and continuous AM that is in the multiple AMs.

\* \* \* \* \*

UNITED STATES PATENT AND TRADEMARK OFFICE
CERTIFICATE OF CORRECTION

PATENT NO. : 10,491,370 B2
APPLICATION NO. : 15/789284
DATED : November 26, 2019
INVENTOR(S) : Wenbin Yang, Tongtong Wang and Xinyuan Wang It is certified that error appears in the above-identified patent and that said Letters Patent is hereby corrected as shown below:

In the Claims

Claim 7, Column 60, Line 65: "is integer" should read "is Integer"

Claim 8, Column 61, Line 37: "concatenated in" should read "originally concatenated in"

Claim 13, Column 62, Line 58: "2/integer S" should read "2/Integer S"

Claim 14, Column 63, Line 10: "dock cycles" should read "clock cycles"

Signed and Sealed this
Fourteenth Day of January, 2020

Andrei Iancu
*Director of the United States Patent and Trademark Office*